US012321672B2

(12) United States Patent
Zeighami et al.

(10) Patent No.: US 12,321,672 B2
(45) Date of Patent: Jun. 3, 2025

(54) ENVIRONMENT-AWARE PREPOSITIONING OF DIGITAL MODELS IN AN ENVIRONMENT

(71) Applicant: Dassault Systèmes Americas Corp., Waltham, MA (US)

(72) Inventors: Ali Zeighami, Montreal (CA); Pierre-Olivier Lemieux, Montreal (CA); Nicola Hagemeister, Montreal (CA); Julie Charland, Montreal (CA); Rachid Aissaoui, Montreal (CA)

(73) Assignee: DASSAULT SYSTÈMES AMERICAS CORP., Waltham, MA (US)

(*) Notice: Subject to any disclaimer, the term of this patent is extended or adjusted under 35 U.S.C. 154(b) by 967 days.

(21) Appl. No.: 17/305,771

(22) Filed: Jul. 14, 2021

(65) Prior Publication Data
US 2023/0021942 A1   Jan. 26, 2023

(51) Int. Cl.
G06F 30/20 (2020.01)
(52) U.S. Cl.
CPC .................. G06F 30/20 (2020.01)
(58) Field of Classification Search
CPC ........................................................ G06F 30/20
USPC ............................................................. 703/6
See application file for complete search history.

(56) References Cited

U.S. PATENT DOCUMENTS

| | | | | |
|---|---|---|---|---|
| 8,260,593 B2* | 9/2012 | Raschke | ................. | G06T 13/40 345/951 |
| 9,129,077 B2* | 9/2015 | Raschke | ................. | G06F 30/20 |
| 9,576,503 B2* | 2/2017 | Stephanian | ............... | H04N 5/77 |
| 10,576,625 B1* | 3/2020 | Stubbs | .................... | B25J 9/1612 |
| 10,607,413 B1* | 3/2020 | Marcolina | ................. | G06T 7/74 |
| 11,548,145 B2* | 1/2023 | Levine | ................... | B25J 9/1669 |
| 11,620,416 B2* | 4/2023 | Lemieux | .............. | G06V 20/653 703/1 |
| 11,654,564 B2* | 5/2023 | Fan | ......................... | G06T 7/593 700/246 |
| 11,685,058 B2* | 6/2023 | Yerazunis | ................ | B25J 15/10 700/246 |

(Continued)

FOREIGN PATENT DOCUMENTS

EP    3136346 A1    3/2017

OTHER PUBLICATIONS

Goussous et al. (A New Methodology for Human Grasp Prediction, IEEE, 2009, pp. 369-380) (Year: 2009).*

(Continued)

*Primary Examiner* — Iftekhar A Khan
(74) *Attorney, Agent, or Firm* — Hamilton, Brook, Smith & Reynolds, P.C.

(57) ABSTRACT

A computer-implemented method and system determine an initial or starting position of a manikin for use in simulation. The method automatically analyzes environment data to determine a highest ranking type of data from among the environment data. In response, a guiding vector and a sweep mode are determined based upon the determined highest ranking type of data. The determined guiding vector and sweep mode are used to automatically analyze free space between a manikin and a target object in a simulated real-world environment to determine an initial position for and pre-position of the manikin in a simulation of the real-world environment.

20 Claims, 34 Drawing Sheets

(56) References Cited

U.S. PATENT DOCUMENTS

| | | | | |
|---|---|---|---|---|
| 11,775,699 | B2* | 10/2023 | Macloud | G06V 10/44 |
| | | | | 703/1 |
| 11,931,898 | B2* | 3/2024 | Berard | B25J 9/1661 |
| 12,017,356 | B2* | 6/2024 | Fan | B25J 9/1666 |
| 2005/0062738 | A1* | 3/2005 | Handley | B33Y 50/00 |
| | | | | 345/419 |
| 2008/0109271 | A1 | 5/2008 | Smith et al. | |
| 2009/0173560 | A1* | 7/2009 | Nakamoto | B25J 9/1612 |
| | | | | 700/259 |
| 2010/0256790 | A1* | 10/2010 | Teran-Matus | G06F 30/00 |
| | | | | 700/118 |
| 2012/0004774 | A1* | 1/2012 | Umetsu | B25J 9/1697 |
| | | | | 700/254 |
| 2013/0069936 | A1* | 3/2013 | Tsai | G09B 19/00 |
| | | | | 345/419 |
| 2014/0163731 | A1* | 6/2014 | Shi | B25J 9/0096 |
| | | | | 700/250 |
| 2014/0371871 | A1* | 12/2014 | Farina | A61F 2/54 |
| | | | | 623/24 |
| 2016/0148132 | A1* | 5/2016 | Aqlan | G06Q 10/0635 |
| | | | | 705/7.16 |
| 2017/0061043 | A1* | 3/2017 | Lemieux | G06T 13/40 |
| 2017/0169138 | A1* | 6/2017 | Lemieux | G16H 20/30 |
| 2017/0235853 | A1* | 8/2017 | Griswold | G06F 30/20 |
| | | | | 703/1 |
| 2019/0248003 | A1* | 8/2019 | Nagarajan | B25J 9/163 |
| 2019/0321974 | A1* | 10/2019 | Leon | B25J 9/1687 |
| 2019/0366539 | A1* | 12/2019 | Arisoy | B25J 9/1612 |
| 2020/0159716 | A1 | 5/2020 | Bates | |
| 2020/0316782 | A1* | 10/2020 | Chavez | G06T 7/12 |
| 2020/0349299 | A1* | 11/2020 | Macloud | G06F 30/12 |
| 2020/0349300 | A1* | 11/2020 | Lemieux | G06F 30/12 |
| 2020/0391385 | A1* | 12/2020 | Oka | B25J 9/1666 |
| 2021/0031375 | A1* | 2/2021 | Drumwright | B25J 9/1612 |
| 2021/0178591 | A1* | 6/2021 | Floyd-Jones | B25J 9/1666 |
| 2021/0186792 | A1* | 6/2021 | Ewaldsson | A61B 5/6825 |
| 2021/0232810 | A1* | 7/2021 | Parsa | G06N 3/08 |
| 2022/0092230 | A1* | 3/2022 | Callan | G06F 30/20 |
| 2022/0338928 | A1* | 10/2022 | Hammer | G16H 30/40 |
| 2022/0348409 | A1* | 11/2022 | Sun | B65G 1/1371 |
| 2023/0021942 | A1* | 1/2023 | Zeighami | G06F 30/20 |
| 2023/0169225 | A1* | 6/2023 | Brouillette | G06F 30/12 |
| | | | | 703/22 |
| 2023/0177228 | A1* | 6/2023 | Bourret | G06F 30/17 |
| | | | | 703/7 |
| 2023/0177437 | A1* | 6/2023 | Bourret | G06Q 10/06398 |
| | | | | 705/7.28 |
| 2023/0264349 | A1* | 8/2023 | Bourret | G06F 3/04845 |
| | | | | 700/245 |
| 2024/0202463 | A1* | 6/2024 | Mazareinezhad | G06F 11/3612 |

OTHER PUBLICATIONS

Peinado et al. (Full-body Avatar Control with Environment Awareness, 2008, IEEE, pp. 1-41) (Year: 2008).*

Magistris et al. (Dynamic digital human models for ergonomic analysis based on humanoid robotics techniques, 2015, Int. J. Digital Human, pp. 1-29) (Year: 2015).*

Bohlin et al. ("Automatic Creation of Virtual Manikin Motions Maximizing Comfort in Manual Assembly Processes", Elsevier pub., 2012, pp. 1-5) (Year: 2021).*

Badler, Norman I., et al., "Animation control for real-time virtual humans." Communications of the ACM 42.8 (1999): 64-73.

Bekey, George A., et al. "Knowledge-based control of grasping in robot hands using heuristics from human motor skills." IEEE Transactions on Robotics and Automation 9.6 (1993): 709-722.

Blanchonette, P., "Jack Human Modelling Tool: A Review", Australian Government Deparment of Defense, Defense Science and Technology Organisation Technical Report, DSTO-TR-2364, AR-014-672, Jan. 2010, Victoria, Australia.

Bourret, Q., et al. "Flexible hand posture for tools grasping." DHM (2019).

Bourret, Q., et al., "Grasp Planning Of Unknown Object For Digital Human Model", 13th International Conference on Applied Human Factors and Ergonomics.

Duffy, V.G., "Handbook of Digital Human Modeling: Research for Applied Ergonomics and Human Factors Engineering (1st ed.)". Chapter 2.4 (2008).

Ergonomics Specialist—Dassault Systèmes, "Human-Centered Prodcut and Workplace Design with Virtual Ergonomics", https://www.3ds.com/products-services/delmia/disciplines/industrial-engineering/tag/88-1007/. Downloaded from Internet Jan. 11, 2023.

European Committee for Standardization, EN 1005-2. Safety of machinery—Human physical performance. Part 2: Manual handling of machinery and component parts of machinery. Brussels, European Committee for Standardization (2003).

European Committee for Standardization, EN 1005-3:2002+A1:2008, "Safety of machinery—Human physical performance—Part 3: Recommended force limits for machinery operation", Oct. 2008.

European Committee for Standardization, EN 1005-4:2002+A1:2008, "Safety of machinery—Human physical performance—Part 4: Evaluation of working postures and movements in relation to machinery", Oct. 2008.

Feix, T., et al., "Analysis of human grasping behavior: Object characteristics and grasp type." IEEE transactions on haptics 7.3 (2014): 311-323.

Gallagher, S. and M.C. Schall Jr, "Musculoskeletal disorders as a fatigue failure process: evidence, implications and research needs," Ergonomics, 60(2): 255-269 (2016).

Hignett et al., Practical Ergonomics, REBA Employee Assessment Worksheet, 1 page, based on Technical note: Rapid Entire Body Assessment (REBA), Hignett, McAtamne, Applied Egonomics, 31(2): 201-205 (2000).

Hignett, S., & McAtamney, L., "Rapid entire body assessment (REBA)", Applied Ergonomics, 31(2), 201-205 (2000).

Human Factors Engineering, "The next generation of human modeling and simulation begins when you're ready," Virtual Soldier Research, 8 pages (2004).

International Labour Office in collaboration with the International Ergonomics Association, Ergonomic Checkpoints: Practical and Easy-To-Implement Solutions for Improving Safety, Health, and Working Conditions, Second Edition, 2010, Geneva, Switzerland.

International Organization for Standardization, ISO 11226:2000, "Ergonomics—Evaluation of static working postures" Technical Corrigendum 1, 2000, Geneva, Switzerland.

International Organization for Standardization, ISO 11228-3:2007, "Ergonomics—Manual handling—part 3: Handling of low loads at high frequency", 2007, Geneva, Switzerland.

International Organization for Standardization, ISO 14738:2002, "Safety of machinery—Anthropometric requirements for the design of workstations at machinery", p. 12, Sep. 2002, Geneva, Switzerland.

Macloud, A., et al. "Extracting grasping cues from pistol-shaped tools for digital human models." Computer-Aided Design and Applications 18.6 (2021): 1167-1185.

McAtamney, L., et al., "RULA: a survey method for the investigation of work-related upper limb disorders", Applied Ergonomics, pp. 91-99, vol. 24, No. 2, Apr. 1993.

Mital, A.: Guide to Manual Materials Handling. CRC Press, Boca Raton (1997).

Salvendy, G., Handbook of Human Factors and Ergonomics, Fourth Edition, 2012, John Wiley & Sons, Inc., Hoboken, New Jersey.

SantosHuman, Inc., "PredictiveHuman Model", https://www.santoshumaninc.com; (8 pages) downloaded from Internet Jan. 11, 2023.

Stephens, A., and M. L. H. Jones. "Workplace methods and use of digital human models." Handbook of Digital Human Modeling, USA: Taylor and Francis 6 (2009): 1-6.

Waters, Thomas R., et al., "Revised NIOSH equation for the design and evaluation of manual lifting tasks", Ergonomics, pp. 749-776, vol. 26, No. 7, 1993.

Zhou, Wei, et al. "Simulating complex automotive assembly tasks using the Humosim framework", No. 2009-01-2279. SAE Technical Paper, 2009.

(56) References Cited

OTHER PUBLICATIONS

Zhang, Z., et al., "FeatureNet: Machining feature recognition based on 3D Convolution Neural Network," Computer-Aided Design, 101: 12-22 (2018).
Goussous, et al. "A New Methodology for Human Grasp Predication" IEEE Transactions on Systems, Man, and Cybernetics—Part A: Systems and Humans, vol. 39, No. 2, Mar. 2009 (Year: 2009).
Al-Masri, et al. "Human-Like Motion Based On a Geometrical Inverse Kiematics and Energetic Optimization" 2008 IEEE/RSJ International Conference on Intelligent Robots and Systems (Year: 2008).
Leon, et al. "From Robot to Human Grasping Simulation" 2014, Springer, Cognitive Systems Monographs vol. 19 (Year: 2014).
Johns, et al. "Deep Learning a Grasp Function for Grasping under Gripper Pose Uncertainty" 2016 IEEE/RSJ International Conference on Intelligent Robots and Systems (IROS) (Year: 2016).
Bernard, B. P., et al., "Musculoskeletal Disorders and Workplace Factors", A Critical Review of Epidemiologic Evidence for Work-Related Musculoskeletal Disorders of the Neck, Upper Extremity, and Low Back, Jul. 1997, 590 pages.
Bevan, S., et al., "Economic impact of musculoskeletal disorders (MSDs) on work in Europe", Best Practice & Research Clinical Rheumatology, vol. 29 No. 3, Jun. 2015, pp. 356-373.
Colombini, D.. et al., "Risk Assessment and Management of Repetitive Movements and Exertions of Upper Limbs—Job Analysis, Ocra Risk Indices, Prevention Strategies and Design Principles," in Elsevier Ergonomics Book Series, vol. 2, eds., pp. 192 (2002).
de Magistris, G., et al., "Dynamic digital human models for ergonomic analysis based on humanoid robotics techniques", International Journal of the Digital Human, vol. 1, No. 1, Jan. 28, 2015, 30 pages.
Falck, A. C., et al., "The impact of poor assembly ergonomics on product quality: A cost-benefit analysis in car manufacturing", Human Factors and Ergonomics in Manufacturing & Service Industries, vol. 20, No. 1, 2010, pp. 24-41.
Hales, T. R., et al., "Epidemiology of Work-Related Musculoskeletal Disorders", Orthopedic Clinics of North America, vol. 27, No. 4, Oct. 1996, pp. 679-709.
Kazmierczak, K., et al., "A case study of serial-flow car disassembly: Ergonomics, productivity and potential system performance", Human Factors and Ergonomics in Manufacturing, vol. 17, No. 4, 2007, pp. 331-351.
Laring, J., et al., "ErgoSAM: A Preproduction Risk Identification Tool", Human Factors and Ergonomics in Manufacturing, vol. 15, No. 3, 2005, pp. 309-325.
Leigh, J. P., et al., "Economic Burden of Occupational Injury and Illness in the United States", The Milbank Quarterly, vol. 89. No. 4, 2011, pp. 728-772.
Ma, L., et al., "A Framework for Interactive Work Design based on Motion Tracking, Simulation, and Analysis", Human Factors and Ergonomics in Manufacturing, vol. 44, No. 4, Apr. 2010, pp. 339-352.
Neumann, W. P., et al., "Human Factors: Spanning the Gap between OM & HRM", Forthcoming in International Journal of Operations & Production Management, Jun. 4, 2010, 57 pages.
Schaub, K. G., et al., "Ergonomic assessment of automotive assembly tasks with digital human modelling and the 'ergonomics assessment worksheet' (EAWS)", International Journal of Human Factors Modelling and Simulation, vol. 3, No. 3-4, 2012, 29 pages.
Silverstein, B., et al., "Use of a prevention index to identify industries at high risk for work-related musculoskeletal disorders of the neck, back, and upper extremity in Washington state, 1990-1998", American Journal of Industrial Medicine, vol. 41, No. 149, 2002, pp. 149-169.
Wells, R., et al., "Time—A key issue for musculoskeletal health and manufacturing", Applied Ergonomics, vol. 38, No. 6, Nov. 2007, pp. 733-744.
Zandin, K. B., "MOST (Registered) Work Measurement Systems", Third Edition, Revised and Expanded, 2003, 548 pages.
Au, O.K.-C., et al., "Skeleton extraction by mesh contraction," in: ACM transactions on graphics, vol. 27, No. 3, article 44, (2008).
Berscheid, L., et al., "Improving Data Efficiency of Self-supervised Learning for Robotic Grasping," arXiv preprint arXiv:1903.00228, (2019).
Bohg, J. and D. Kragic, "Learning grasping points with shape context," Robotics and Autonomous Systems, vol. 58, No. 4, pp. 362-377 (2009).
Bohg, J., et al., "Data-driven grasp synthesis—a survey," IEEE Transactions on Robotics, 30(2), 289-309 (2014).
Buss, S.R. and Kim, J.-S., "Selectively damped least squares for inverse kinematics," Journal of Graphics tools, 10(3). 37-49 (2004).
Cheze, L., et al., "Determination of the number of degrees of freedom of the trapeziometacarpal joint—an in vitro study," IRBM, 33(4):271-277 (2012).
Cornea, N.D., et al., "Curve-skeleton properties, applications, and algorithms," IEEE Transactions on Visualization & Computer Graphics, 20 pages (2007).
Cutkosky, M.R. and R.D. Howe, "Human Grasp Choice and Robotic Grasp Analysis," In Dextrous Robot Hands, Springer-Verlag, pp. 5-31 (1990).
Cutkosky, M.R., "On grasp choice, grasp models, and the design of hands for manufacturing tasks," IEEE Transactions on robotics and automation, 5(3): 269-279 (1989).
Diaz, C., et al., "Grasping points for handle objects in a cooperative disassembly system," IFAC Proceedings Volumes, 40: 126-131 (2007).
Ekvall, S. and Kragic, D., "Interactive grasp learning based on human demonstration," in Robotics and Automation, Proceedings. ICRA'04. 2004 IEEE International Conference on, IEEE, 3519-3524 (2004).
El-Khoury, S. and A. Sahbani, "A new strategy combining empirical and analytical approaches for grasping unknown 3D objects," Robotics and Autonomous Systems, 34 pages (2009).
El-Khoury, S., "Approche Mixte, Analytique et par Apprentissage, pour la Synthèse d'une Prise Naturelle" (Thesis, Pierre et Marie Curie University, Paris, France, 2008).
Endo, Y., et al., "An application of a digital hand to ergonomic assessment of handheld information appliances," SAE Technical Paper (2006).
Endo, Y., et al., "A computer-aided ergonomic assessment and product design system using digital hands," in International Conference on Digital Human Modeling, Springer, 833-842 (2007).
Endo, Y., et al., "Virtual grasping assessment using 3D digital hand model," in Annual Applied Ergonomics Conference: Celebrating the Past-Shaping the Future (2007).
Endo, Y., et al., "Optimization-based grasp posture generation method of digital hand for virtual ergonomics assessment," SAE international journal of passenger cars—electronic and electrical systems, 1 (2008-1-1902). 590-598 (2009).
Feix, T., et al., "The grasp taxonomy of human grasp types," IEEE Transactions on Human-Machine Systems, 46(1): 66-77 (2016).
Fischer, M., et al., "Learning techniques in a dataglove based telemanipulation system for the DLR hand," in Robotics and Automation, Proceedings. 1998 IEEE International Conference on, (1998), IEEE, 1603-1608 (1998).
Gibson, James, J., "The Theory of Affordances," The Ecological Approach to Visual Perception (1979).
Goussous, F. A., "Grasp Planning for digital humans," Thesis, University of Iowa, 87 pages (2007).
Holleman, C. and L.E. Kavraki, "A framework for using the workspace medial axis in PRM planners," in: Proceedings 2000 ICRA. Millennium Conference. IEEE International Conference on Robotics and Automation. Symposia Proceedings (Cat. No. 00CH37065), IEEE, pp. 1408-1413 (2000).
Huang, J. and C.-H. Menq, "Automatic data segmentation for geometric feature extraction from unorganized 3-D coordinate points," IEEE Transactions on Robotics and Automation, vol. 17, No. 3, pp. 268-279 (2001).
Hueser, M., et al., "Learning of demonstrated grasping skills by stereoscopic tracking of human head configuration," in Robotics and Automation, ICRA 2006. Proceedings 2006 IEEE International Conference on, IEEE, 2795-2800 (2006).

(56) References Cited

OTHER PUBLICATIONS

Kyota, F., et al., "Detection and evaluation of grasping positions for autonomous agents," In International Conference on Cyberworlds, 9 pages (2005).
Lemieux, P.-O., et al., "Degrees of freedom coupling adapted to the upper limb of a digital human model," International Journal of Human Factors Modelling and Simulation, 5(4): 314-337 (2017).
Li, X., et al., "Point cloud surface segmentation based on volumetric eigenfunctions of the Laplace-Beltrami operator," Computer Aided Geometric Design, 71: 157-175 (2019).
Li, Y. and N. Pollard, "A Shape Matching Algorithm for Synthesizing Humanlike Enveloping Grasps," in IEEE/RAS Int. Conf. on Humanoid Robots (Humanoids), pp. 442-449 (2005).
Ma, C.-M., et al., "Three-dimensional topology preserving reduction on the 4-subfields," IEEE Transactions on Pattern Analysis and Machine Intelligence, 24: 1594-1605 (2002).
Miller, A.T., et al., "Automatic grasp planning using shape primitives," in Robotics and Automation, Proceedings. ICRA'03. IEEE International Conference on, IEEE, 1824-1829 (2003).
Minetto, R., et al., "An optimal algorithm for 3D triangle mesh slicing," Computer-Aided Design, 92: 1-10 (2017).
Myers, A., et al., "Affordance Detection of Tool Parts from Geometric Features," In International Conference on Robotics and Automation, pp. 1374-1381 (2015).
Myers, A., et al., "Affordance of Object Parts from Geometric Features," In International Conference on Robotics and Automation, pp. 1374-1381 (2015).
Nguyen, V.-D., "Constructing force-closure grasps," Int. Jour. Robotic Res, 7(3): 3-16 (1988).
Nguyen, V.-D., "Constructing stable grasps in 3D," in Robotics and Automation Proceedings. 1987 IEEE International Conference on, IEEE, 234-239 (1987).
Parkinson, M.B. and Reed, M.P., "Creating virtual user populations by analysis of anthropometric data," International Journal of Industrial Ergonomics, 40(1): 106-111 (2010).
Pitarch, E.P., et al., "SANTOS™ hand: a 25 degree-of-freedom model," SAE Technical Paper (2005).
Prabhakar, S. and M.R. Henderson, "Automatic form-feature recognition using neural-network-based techniques on boundary representations of solid models," Computer-Aided Design, 24: 381-393 (1992).
Reed, M.P., et al., "Methods for measuring and representing automobile occupant posture," SAE Technical Paper (1999).
Reed, M.P., et al., "Developing and implementing parametric human body shape models in ergonomics software," in Proceedings of the 3rd International Digital Human Modeling Conference. Tokyo, Japan (2014).
Roa, et al., "Grasp quality measures: review and performance," Autonomous robots, 38(1): 65-88 (2014).
Rouhi, R., et al., "A review on feature extraction techniques in face recognition," Signal & Image Processing, vol. 3, No. 6 (2012).
Sahbani, A., et al., "An overview of 3D object grasp synthesis algorithms," Robotics and Autonomous Systems, 36 pages (2012).
Schmidt, P., et al., "Grasping of unknown objects using deep convolutional neural networks based on depth images," in: 2018 IEEE International Conference on Robotics and Automation (ICRA), IEEE, pp. 6831-6838 (2018).
Svensson, S., et al., "Curve skeletonization of surface-like objects in 3D images guided by voxel classification," Pattern Recognition Letters, 23: 1419-1426 (2002).
Tay, S.C., et al., "In-vivo kinematic analysis of forearm rotation using helical axis analysis," Clinical Biomechanics, 25(7): 655-659 (2010).
Vahrenkamp, N., et al., "Planning high-quality grasps using mean curvature object skeletons," IEEE Robotics and Automation Letters, 3: 911-918 (2017).
Wu, G., et al., "ISB recommendation on definitions of joint coordinate system of various joints for the reporting of human joint motion—Part I: ankle, hip, and spine," Journal of biomechanics, 35(4): 543-548 (2002).
Wu, G., et al., "ISB recommendation on definitions of joint coordinate systems of various joints for the reporting of human joint motion—Part II: shoulder, elbow, wrist and hand," Journal of biomechanics, 38(5): 981-992 (2005).
Yamane, K., et al., "Synthesizing animations of human manipulation tasks," ACM Transactions on Graphics, 23(3) (2004).
Bourret, Q., et al., "Ergo4All: An Ergonomic Guidance Tool for Non-ergonomist", In: Black N.L., Neumann W.P., Noy I. (eds) Proceedings of the 21st Congress of the International Ergonomics Association (IEA 2021). IEA 2021.
Cort, J.A. and Devries, D., "Accuracy of Postures Predicted Using a Digital Human Model During Four Manual Exertion Tasks, and Implications for Ergonomic Assessments", IISE Transactions on Occupational Ergonomics and Human Factors, 7:43-58 (2019).
Hogberg, D., et al., "IMMA—Intelligently Moving Manikins in Automotive Applications", Third International Summit on Human Simulation (ISHS2014) 2014.
Lemieux, Pierre-Olivier, et al., "A visual acuity constraint for digital human modeling", Conference proceedings 4th. 2016.
Perez, J., et al., "Ergonomists' and Engineers' Views on the Utility of Virtual Human Factors Tools", Human Factors and Ergonomics in Manufacturing & Services Industries, 25 (3) 279-293 (2015).
Zeighami, A., et al., "Stepping behavior for stability control of a digital human model", AISB/ASB 2019.
Frazzoli, E., et al. "Algorithmic Foundations for Robotics X", Proceedings of the Tenth Workshop on the Algorithmic Foundations of Robotics, 2013.
Abdel-Malek, K., et al., "Santos: An integrated human modeling and simulation platform, in DHM and Posturography". 2019, Elsevier. p. 63-77.
Abdel-Malek, K., et al., "Towards a new generation of virtual humans. International Journal of Human Factors Modelling and Simulation", 2006. 1(1): p. 2-39.
Afyouni, I, et al. "Spatial models for context-aware indoor navigation systems: A survey", Journal of Spatial Information Science, 2012, 1 (4), pp. 85-123.
Baerlocher, P. and R. Boulic, An inverse kinematic architecture enforcing an arbitrary number of strict priority levels. The visual computer, 2004. 20(6): p. 402-417.
Bataineh, M., et al. "Neural network for dynamic human motion prediction", Science Direct, Expert Systems with Applications, 48 (2015) 26-34.
Bhatia, N., et al., "Modeling visually guided hand reach for Digital Human Models", Science Direct, 6th Internatioanl Conference on Applied Human Factors and Ergonomics (WHFE 2015) and the Affiliated Conferences, AHFE 2015, Procedia Manufacturing 3 (2015) 3820-3827.
Björkenstam, S., et al., "Enhancing digital human motion planning of assembly tasks through dynamics and optimal control", Science Direct, Procedia CIRP, 2016. 44: p. 20-25.
Chaffin, D.B., "Digital Human Modeling for Workspace Design", Reviews of Human Factors and Ergonomics, Dec. 2008.
Chaffin, D.B., "Human motion simulation for vehicle and workplace design", Human Factors and Ergonomics in Manufacturing & Service Industries, 2007. 17(5): p. 475-484.
Chaffin et al., "Simulating Reach Motions", Society of Automotive Engineers, Inc. 1999.
Li, Y., et al. "On motion planning for narrow-clearance assemblies using virtual manikins" Science Direct, 51st CIRP Conference on Manufacturing Systems, Procedia CIRP 72 (2018) 790-795.
LaValle, S.M., et al. "Randomized Kinodynamic Planning", The International Journal of Robotics Research, vol. 20, No. 5, May 5, 2001, pp. 378-400.
Liu, Y. and N.I. Badler, "Real-time reach planning for animated characters using hardware acceleration.", in Proceedings 11th IEEE international workshop on program comprehension. 2003. IEEE.
Namgung, I., "Path space approach for planning 2d shortest path based on elliptic workspace geometry mapping", KSME international Journal, 2004. 18(1): p. 92-105.
Park, W., et al., "Toward memory-based human motion simulation: development and validation of a motion modification algorithm", IEEE transactions on systems, man, and cybernetics—Part A: Systems and Humans, 2004. 34 (3): p. 376-386.

(56) References Cited

OTHER PUBLICATIONS

Peinado, M., et al., "Full-body avatar control with environment awareness". IEEE Computer Graphics and Applications, 2009. 29(3): p. 62-75.
Perez, M.A., "Prediction of whole-body lifting kinematics using artificial neural networks", 2005, Virginia Tech.
Pettré, J., et al., "Planning human walk in virtual environments", in IEEE/RSJ International Conference on Intelligent Robots and Systems. 2002. IEEE.
Pettré, J., et al., "A 2-Stages Locomotion Planner for Digital Actors", Eurographics, SIGGRAPH Symposium on Computer Animation (2003).
Reed, M.P, et al., "The HUMOSIM Ergonomics Framework: A New Approach to Digital Human Simulation for Ergonomic Analysis", SAE Technical Papers, Jul. 2006.
Reed, M.P. and D.W. Wagner, "An integrated model of gait and transition stepping for simulation of industrial workcell tasks", SAE Transactions, 2007: p. 2062-2072.
Siciliano, B., et al., "Robotics—Modeling, Planning and Control", Advanced Textbooks in Control and Signal Processing (2009).
Yang, L., et al. "Survey of Robot 3D Path Planning Algorithms", Journal of Control Science and Engineering, vol. 2016, Sril ID 7426913, 22 pages.
Zhang, X., et al., "Optimization-based differential kinematic modeling exhibits a velocity-control strategy for dynamic posture determination in seated reaching movements", Journal of Biomechanics 31 (1998) 1035-1042.
Zhao, L., et al., "Applying Empirical Data on Upper Torso Movement to Real-time Collision-free Reach Tasks", SAE Technical Papers—Jun. 2005.
Zheng, Y., et al., "Ray-Shooting Algorithims for Robotics", Disney Research Pittsburgh, 2012.
Zhou, W. and M.P. Reed, "Validation of the human motion simulation framework: posture prediction for standing object transfer tasks", 2009, SAE Technical Paper.
Burns, E., et al., "The hand is more easily fooled than the eye: Users are more sensitive to visual interpenetration than to visual-proprioceptive discrepancy". Presence: teleoperators & virtual environments, 2006. 15(1): p. 1-15.
Faraway, J.J., "Regression analysis for a functional response. Technometrics," 1997. 39(3): p. 254-261.
Jung, E.S. and J. Choe, "Human reach posture prediction based on psychophysical discomfort," International Journal of Industrial Ergonomics, 1996. 18(2-3): p. 173-179.
Feyen, R., et al., "Computer-aided ergonomics: a case study of incorporating ergonomics analyses into workplace design". Applied ergonomics, 2000. 31(3): p. 291-300.
Macloud, A., et al., "Extracting Grasping Cues From One-Handed Tools Geometry For Digital Human Models," (2019).
Wagner, D.W., et al., "Predicting foot positions for manual materials handling tasks", SAE transactions, 2005: p. 2872-2876.
Ryan, P.W., Cockpit Geometry Evaluation. vol. V. Validation. 1969, Boeing Co Seattle WA Military Aircraft Systems Div.
Jung, E.S., et al., "Upper body reach posture prediction for ergonomic evaluation models". International Journal of Industrial Ergonomics, 1995. 16(2): p. 95-107. (Science Direct).
Diffrient et al., "Humanscale 7/8/9," 1982, The MIT Press.
Russell, S., et al., "Artificial Intelligence A Modern Approach" 3rd Edition Pearson Education, Inc. 2010.
Baerlocher, P., "Inverse kinematics techniques of the interactive posture control of articulated figures," EPFL, 2001.
Lehericey, F., "Iterative and Predictive Ray-Traced Collision Detection for Multi-GPU Architectures," Graphics [cs.GR]. 2013.
Mital. A. et al., "Manual Materials Handling," CRC Press, Second edition, 2017, 153 pages.
Nau R., "Notes on linear regression analysis," Duke university, 2014, 18 pages.
Neumann. P., et al., "A case study evaluating the ergonomic and productivity impacts of partial automation strategies in the electronics industry," International Journal of Production Research., vol. 40, No. 16, 2002, pp. 4059-4075.
Occhipinti, E., "OCRA: a concise index for the assessment of exposure to repetitive movements of the upper limbs.", Ergonomics, vol. 41, Issue. 9, 1998, pp. 1290-1311.
Ozili. P.K., "The Acceptable R-square in Empirical Modelling for Social Science Research," A guide to non-native english speakers. IGI global, 2023, pp. 134-143.
Paudel, P., et al., "Industrial ergonomics risk analysis based on 3d-human pose estimation.", Electronics, vol. 11, Issue. 20, 2022, 20 pages.
Poirson, E., et al., "Comparative analysis of human modeling tools.", International Digital Human Modeling Symposium, Apr. 25, 2013, 8 pages.
Prisco, G., et al., "Capability of Machine Learning Algorithms to Classify Safe and Unsafe Postures during Weight Lifting Tasks Using Inertial Sensors.", Diagnostics, vol. 14, Issue. 6, 2024, pp. 1-15.
Sardar, S. K., et al., "Ergonomic risk assessment of manufacturing works in virtual reality context.", International Journal of Human-Computer Interaction, vol. 40, Issue. 14, 2024, pp. 3856-3872.
Tong, Y., et al., "Review of research and development of supernumerary robotic limbs.", IEEE/CAA Journal of Automatica Sinica, vol. 8, Issue. 5, 2021, pp. 929-952.
Turk. M. et al., "Ergonomic Evaluation of Basis Manual Assembly Operations With Integration of Simulation Tools," International Scientific Journal Industry 4.0, vol. 3, Issue 1, 2018, pp. 34-38.
Walker, G., et al., "Big data and ergonomics methods: A new paradigm for tackling strategic transport safety risks.", Heriot-Watt University, vol. 53, Issue. Part B, 2016, pp. 298-311.
Wang, J., et al., "3D fuzzy ergonomic analysis for rapid workplace design and modification in construction.", Automation in Construction, vol. 123, 2021, 14 pages.
Xie. Y et al., "Fitts' law on the flight deck: evaluating touchscreens for aircraft tasks in actual flight scenarios," Ergonomics, vol. 66, No. 4, 2023, pp. 506-523.
Yin, M.Y., et al., "A systematic review on digital human models in assembly process planning.", The International Journal of Advanced Manufacturing Technology, vol. 125, Issue. 3, 2023, pp. 1037-1059.
"Ergonomic Workplace Design", Dassault systems, 2002, 6 pages.
Agote-Garrido, A., et al., "Manufacturing System Design in Industry 5.0: Incorporating Sociotechnical Systems and Social Metabolism for Human-Centered, Sustainable, and Resilient Production.", Systems, vol. 11, Issue. 537, 2023, pp. 1-19.
Ahmed, S., et al., "Integrating human factors early in the design process using digital human modelling and surrogate modelling.", Journal of Engineering Design, vol. 32, Issue. 4, 2021, pp. 165-186.
Bahçivancilar U., "Validation of methods time measurement data," MS thesis. Middle East Technical University, 2012, 64 pages.
Baraldi. A.N., et al., "An introduction to modern missing data analyses," Journal of School Psychology, vol. 48, 2010, pp. 5-37.
Barnes. R.M., "Motion and time study: design and measurement of work," John Wiley & Sons, Seventh edition, 1991, 20 pages.
Beuss, F., et al., "Automated simulation-based design of ergonomic workstations using RPA and Human-in-the-Loop decision making.", Procedia CIRP, vol. 119, 2023, pp. 216-221.
Bland. J.M., et al., "Measuring agreement in method comparison studies," Statistical Methods in Medical Research, vol. 8, 1999, pp. 135-160.
Bland. J.M., et al., "Multiple significance tests: the Bonferroni method," BMJ, vol. 310, 1995, p. 170.
Bland. J.M., et al., "Statistical Methods for Assessing Agreement Between Two Methods of Clinical Measurement," Thelancet, vol. 8, 1985, 9 pages.
Borg, G., "Psychophysical scaling with applications in physical work and the perception of exertion.", Scandinavian journal of work, environment & health, vol. 16, Issue. 1, 1990, pp. 55-58.
Bures, M., et al., "Comparison of Time Standardization Methods on the Basis of Real Experiment", Procedia Engineering, vol. 100, 2015, pp. 466-474.
Bures. M., et al., "Comparison of the Predetermined Time Systems MTM-1 and BasicMOST in Assembly Production," IEEE, 2013, pp. 546-550.

(56) References Cited

OTHER PUBLICATIONS

Chaffin, D. B., "Improving digital human modelling for proactive ergonomics in design.", Ergonomics, vol. 48, Issue. 5, 2005, pp. 478-491.

Chaffin. D.B., "Occupational biomechanics—a basis for workplace design to prevent musculoskeletal injuries," Ergonomics, vol. 30, Issue 2, 1987, pp. 321-329.

Clark. L.D., et al., "Extending Fitts' law in three-dimensional virtual environments with current low-cost virtual reality technology," International Journal of Human-Computer Studies, vol. 139, 2020, 17 Pages.

Colombini, D., et al., "The revised OCRA Checklist method.", Editorial Factors Humans: Barcelona-Spain, 2013, pp. 1-60.

Crossman. E.R.F.W., et al., "Feedback control of hand-movement and Fitts' Law," Quarterly Journal of Experimental Psychology, vol. 35A, 1983, pp. 251-278.

Da Silva, A. G., et al., "Virtual reality and digital human modeling for ergonomic assessment in industrial product development: a patent and literature review.", Applied Sciences, vol. 12, Issue. 3, 2022, pp. 1-24.

Dahibhate, G., et al., "The use of digital human modeling in ergonomic design and product development.", Journal of The Institution of Engineers, vol. 104, Issue. 5, 2023, pp. 1133-1138.

De Magistris, G., et al., "Dynamic control of DHM for ergonomic assessments.", International Journal of Industrial Ergonomics, vol. 43, Issue. 2, 2013, pp. 170-180.

Emir, T., et al., "Computer-Assisted Ergonomic Analysis of Working Postures Causing Strain.", European Journal of Forest Engineering, vol. 8, Issue. 2, 2022, pp. 66-76.

Faber. G.S. et al., "Working height, block mass and one- vs. twohanded block handling: the contribution to low back and shoulder loading during masonry work," Ergonomics, vol. 52, No. 9, Sep. 2009, pp. 1104-1118.

Fitts. P.M. et al., "The Information Capacity of the Human Motor System in Controlling the Amplitude of Movement," Journal of Experimental Psychology, vol. 47, No. 6, Jun. 1954, pp. 381-391.

Frost. J., "How To Interpret R-squared in Regression Analysis," 2021, 8 pages.

Genaidy. A.M., et al., "The Validity of Predetermined Motion Time Systems in Setting Production Standards for Industrial Tasks," International Journal of Industrial Ergonomics, vol. 3, 1989, pp. 249-263.

Ghorbani, E., et al., "Ergonomic Assembly Line Balancing Problems Evolution and Future Trends with Insights into Industry 5.0 Paradigm.", Université de Montreal, Jul. 16, 2023, 34 pages.

Ghorbani, E., et al., "Fuzzy Ergonomic Expert System for Assembly Line Design Problem.", Accessibility, Assistive Technology and Digital Environments, vol. 121, 2024, pp. 250-260.

Ghorbani, E., et al., "Fuzzy expert system for ergonomic assembly line worker assignment and balancing problem under uncertainty", Journal of Industrial and Production Engineering, Aug. 16, 2024, 24 pages.

Ghorbani, E., et al., "Fuzzy fatigue model for ergonomic design of assembly lines under uncertainty.", Intelligent Systems Conference, 2024, pp. 392-407.

Ghorbani, E., et al., "Optimization Framework for Assembly Line Design Problem with Ergonomics Consideration in Fuzzy Environment", IFIP Advances in Information and Communication Technology, vol. 702, Jun. 28, 2024, 11 pages.

Hamilton, B. CS, et al., "Artificial intelligence based real-time video ergonomic assessment and training improves resident ergonomics.", The American Journal of Surgery, vol. 226, Issue. 5, 2023, pp. 741-746.

Harari, Y. et al., "Factors determining workers' pace while conducting continuous sequential lifting, carrying, and lowering tasks," Applied ergonomics, vol. 67, 2018, pp. 61-70.

International Organization for Standardization. Safety of Machinery: Anthropometric Requirements for the Design of Workstations at Machinery, ISO, First edition, 2002, 37 pages.

JMP, "Statistical Software for Insight-Driven Improvement Seeing is understanding.", JMP software combines interactive visualization with powerful statistics., 2024, 4 pages.

Karger, D W. et al, "Engineered work measurement: the principles, techniques, and data of methods—time measurement background and foundations of work measurement and methods—time measurement, plus other related material," Industrial Press Inc., Chapter 3, 1987, pp. 37-51.

Karhu, O., et al., "Correcting working postures in industry: A practical method for analysis.", Applied ergonomics, vol. 8, Issue. 4, 1977, pp. 199-201.

Khamaisi, R. K., et al., "An innovative integrated solution to support digital postural assessment using the TACOs methodology.", Computers & Industrial Engineering, vol. 194, 2024, pp. 1-14.

Kodak's ergonomic design for people at work, The Eastman Kodak Company, Second edition, 2003, 723 pages.

Kulac, S., et al., "An integrated ergonomic risk assessment framework based on fuzzy logic and IVSF-AHP for optimising ergonomic risks in a mixed-model assembly line.", Ergonomics, 2024, pp. 1-22.

Kurkin. O., et al., "Evaluation of operational times by MTM methods in the digital factory environment," Annals of DAAAM for 2011 & Proceedings of the 22nd International DAAAM Symposium, vol. 22, No. 1, 2011, pp. 0671-0672.

Lavatelli, I., et al., "Correlations in between EAWS and OCRA Index concerning the repetitive loads of the upper limbs in automobile manufacturing industries.", Work, vol. 41, 2012, pp. 4436-4444.

Li, X., et al., "An improved physical demand analysis framework based on ergonomic risk assessment tools for the manufacturing industry.", International journal of industrial ergonomics, vol. 70, 2019, pp. 58-69.

MacKenzie, I.S., "Movement Time Prediction in Human-Computer Interfaces," Readings in human-computer interaction, 1995, pp. 483-493.

MacKenzie. I.S., "Fitts' law as a research and design tool in human-computer interaction," Human-computer interaction, vol. 7, 1992, pp. 91-139.

MacKenzie. I.S., "Fitts' Law," The wiley handbook of human computer interaction, vol. 1, 2018, pp. 347-370.

MacKenzie. I.S., et al, "Extending Fitts' Law To Two-Dimensional Tasks," Proceedings of the SIGCHI conference on Human factors in computing systems, 1992, pp. 219-226.

Manghisi, V. M., et al., "A virtual reality approach for assisting sustainable human-centered ergonomic design: the ErgoVR tool.", Procedia Computer Science, vol. 200, 2022, pp. 1338-1346.

Massiris Fernandez, M., et al., "Ergonomic risk assessment based on computer vision and machine learning.", Computers & Industrial Engineering, vol. 149, 2020, 11 pages.

Mazareinezhad, F., et al., "Evaluating the Accuracy of the MOST Predetermined Motion Time System Through Lab Experiments," Human Aspects of Advanced Manufacturing, Production Management and Process Control, vol. 146, 2024, pp. 116-122.

Kellenberger, Kathi, and Scott Shaw. Beginning T-SQL. 3rd ed. 2014. Berkeley, CA: Apress, 2014. Web. (Year: 2014).

Reed, Matthew P. et al. "The HUMOSIM Ergonomics Framework: A New Approach to Digital Human Simulation for Ergonomic Analysis." SAE Technical Papers (2006) (Year: 2006).

Tecnomatix, "Classic Jack: A premier human simulation tool for populating your design with virtual people and performing human factors and ergonomic analyses." Siemens, 2016 (Year: 2016).

\* cited by examiner

ENVIRONMENT-AWARE PREPOSITIONING OF DIGITAL MODELS IN AN ENVIRONMENT

BACKGROUND

A number of existing product and simulation systems are offered on the market for the design and simulation of objects, e.g., humans, parts, and assemblies of parts, amongst other examples. Such systems typically employ computer aided design (CAD) and/or computer aided engineering (CAE) programs. These systems allow a user to construct, manipulate, and simulate complex three-dimensional (3D) models of objects or assemblies of objects. These CAD and CAE systems, thus, provide a representation of modeled objects using edges, lines, faces, polygons, or closed volumes. Lines, edges, faces, polygons, and closed volumes may be represented in various manners, e.g., non-uniform rational basis-splines (NURBS).

CAD systems manage parts or assemblies of parts of modeled objects, which are mainly specifications of geometry. In particular, CAD files contain specifications, from which geometry is generated. From geometry, a representation is generated. Specifications, geometries, and representations may be stored in a single CAD file or multiple CAD files. CAD systems include graphic tools for representing the modeled objects to designers; these tools are dedicated to the display of complex objects. For example, an assembly may contain thousands of parts. A CAD system can be used to manage models of objects, which are stored in electronic files.

CAD and CAE systems use of a variety of CAD and CAE models to represent objects. These models may be programmed in such a way that the model has the properties (e.g., physical, material, or other physics based) of the underlying real-world object or objects that the model represents. Moreover, CAD/CAE models may be used to perform simulations of the real-word objects/environments that the models represent.

SUMMARY

Simulating an agent in an environment is a common simulation task implemented and performed by CAD and CAE systems. Here, an agent refers to an entity which can observe and act upon an environment e.g., a human, an animal, or a robot, amongst other examples. Such simulations can be used to automatically predict behavior, e.g., posture, of the agent in the environment when performing a task with one or more target objects. For instance, these simulations can determine position and orientation of a human when assembling a car in a factory.

Performing these simulations requires an initial positioning of the root segment of the manikin (e.g., model representing a human) in the proximity of the target object(s). This initial positioning of the manikin is referred-to as "pre-positioning". Embodiments provide a computer-implemented method for systematically sampling the environment around a target object to "pre-position" the manikin in a collision-free space with adequate accessibility to a target object(s). Amongst other examples, embodiments efficiently determine the position, i.e., pre-position, of a manikin in a virtual workspace where a task being simulated requires a specific manikin position (e.g., tool grasp). Such functionality can be utilized to efficiently find initial manikin position in a virtual assembly line simulation. Embodiments are useful for automatically estimating a first approximation of the manikin position for digital modeling tools aimed at predicting static standing postures, amongst other examples.

An example embodiment is directed to a computer implemented method of automatically determining an initial (or starting) position for a manikin in a simulation of a real-world environment. Such an embodiment begins by automatically analyzing environment data to determine a highest ranking type of data from among the environment data. In turn, the method responsively determines (i) a guiding vector and (ii) a sweep mode based upon the determined highest ranking type of data. The determined guiding vector and sweep mode are used to automatically analyze free space between a manikin and a target object in a simulated real-world environment. The free space analysis is used to determine an initial/starting position for the manikin in a simulation of the real-world environment. According to an embodiment, the simulated real-world environment includes the manikin and the target object, and is represented by a computer-aided design (CAD) model. In embodiments, in addition to the manikin and the target object, the environment may also include other surrounding objects and agents. An example embodiment determines pose, i.e., position and orientation, of the manikin in the simulation of the real-world environment. Such an embodiment may determine the orientation for the manikin using the determined initial/starting position. In an embodiment that determines pose, position and/or orientation may be set to a default value, e.g., null. In other words, an embodiment may determine one of orientation or position while setting the other (position or orientation) or pose to a default value.

According to an embodiment, in analyzing the free space (i.e., the space between manikin and target object which may include object(s)) between the manikin and the target object, to begin, a first candidate or trial position for the manikin is determined using the guiding vector and sweep mode. Second, free space in the simulated real-world environment between (i) the manikin at the determined first candidate position and (ii) the target object is analyzed. In such an embodiment, analyzing the free space in the simulated real-world environment comprises: (1) checking for collisions between the manikin at the first candidate position and one or more objects in the simulated real-world environment and (2) calculating an accessibility score indicating ease of access for the manikin at the first candidate position to the target object. If no collisions between the manikin at the first candidate position and the one or more objects in the simulated real-world environment are identified, and the calculated accessibility score is above an accessibility threshold, the first candidate position is set as the initial/starting position for the manikin in the simulation of the real-world environment. However, if the free space analysis identifies a collision between the manikin at the first candidate position and the one or more objects in the simulated real-world environment or the calculated accessibility score is below the accessibility threshold such an embodiment continues to ensure a pre-position (initial or starting position for simulation purposes) for the manikin is identified.

Such an embodiment continues by iteratively: (i) determining a next candidate/trial position for the manikin using the determined guiding vector and sweep mode and (ii) analyzing free space in the simulated real-world environment between the manikin at the determined next candidate position and the target object. The iterative analysis continues until a next candidate position that meets criteria is identified or, if based on the determined guiding vector and sweep mode, a next candidate position does not exist. In other words, the iterative analysis determines a candidate/ trial position, and then, checks if the candidate position meets criteria (which may be selected by a user). If a candidate position meets the criteria, the analysis stops. If a candidate position does not meet the criteria, the method continues and determines a next candidate position to analyze. In such an embodiment, the criteria for a candidate position are: (i) no collisions between the manikin at the next candidate position and the one or more objects in the simulated real-world environment, and (ii) a calculated accessibility score indicating ease of access for the manikin at the next candidate position to the target object being above the accessibility threshold. According to an embodiment, if the iterative analysis identifies or otherwise determines a next candidate position with both: (a) no collisions between the manikin at the next that candidate position and the one or more objects in the simulated real-world environment, and (b) a calculated accessibility score indicating ease of access for the manikin at the next candidate position to the target object is above the accessibility threshold, then the identified next candidate position is set as the initial/starting position for the manikin in the simulation of the real-world environment. However, if no next candidate position is identified that meets the criteria, a "best" candidate position is set as the initial/starting position for the manikin in the simulation. Embodiments determine a "best" position based on the free space analysis. For non-limiting example, according to an embodiment, if based on the determined guiding vector and sweep mode a next candidate position does not exist, a given next candidate position is deemed a 'best' position and set as the initial/starting position for the manikin in the simulation of the real-world environment based on results of analyzing the free space in the simulated real-world environment between the manikin at the given next candidate position and the target object.

In addition to determining the next candidate/trial position based upon the guiding vector and sweep mode, an embodiment also determines the next candidate/trial position based upon ranked proximity zones proximal to the target object. Such an embodiment may also determine the ranked proximity zones based upon dimensions of the manikin.

In an embodiment, the environment data may comprise at least one of: a number of hands involved, an indication of tool use, and a manikin position from a previous task. In an example embodiment, the indication of tool use indicates a tool family and a tool orientation. In such an embodiment, the guiding vector may be determined as a function of the indicated tool family and the indicated tool orientation.

Another embodiment analyzes the free space by identifying any collision between a bounding volume, e.g., an oriented bounding box, of the manikin at a given candidate position and one or more objects in the simulated real-world environment. In an embodiment, if there are no identified collisions between the bounding volume of the manikin at the given candidate position and the one or more objects, the embodiment continues to determine an accessibility score for the manikin at the given candidate position. An embodiment determines the accessibility score by discretizing the space between the manikin at the given candidate position and the target object and, for each discretization of the space, determining an individual accessibility score. The individual accessibility scores indicate ease of access for the manikin to the target object within each discretization of the free space. In turn, an overall accessibility score for the manikin at the given candidate position is determined based upon each determined individual accessibility score. According to an example embodiment, if the overall accessibility score is above an accessibility threshold, the given candidate position is set as the initial/starting position for the manikin in the simulation of the real-world environment. According to an embodiment, each discretization of the space is a three-dimensional polygon.

The manikin may represent any agent for which determining an initial/starting position in a simulation is desired. For instance, the manikin may represent at least one of: a human, an animal, and a robot, amongst other examples.

Yet another embodiment simulates interaction between the manikin at the determined pre-position (initial/starting position) and the target object in the simulated real-world environment. Results of the simulation may be used to improve design of the real-world environment and objects within the environment. For instance, if the simulation results identify collisions or poor accessibility for the manikin, a design change or other physical change to the real-world environment may be determined.

Another embodiment of the present invention is directed to a system that includes a processor and a memory with computer code instructions stored thereon. In such an embodiment, the processor and the memory, with the computer code instructions, are configured to cause the system to implement any embodiments or combination of embodiments described herein.

An embodiment is directed to a cloud computing implementation for determining initial/start-of-simulation positioning (i.e., pre-position) of a manikin. Such an embodiment is directed to a computer program product executed by a server in communication across a network with one or more clients. The computer program product comprises program instructions which, when executed by a processor, causes the processor to implement any embodiments or combination of embodiments described herein.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1:
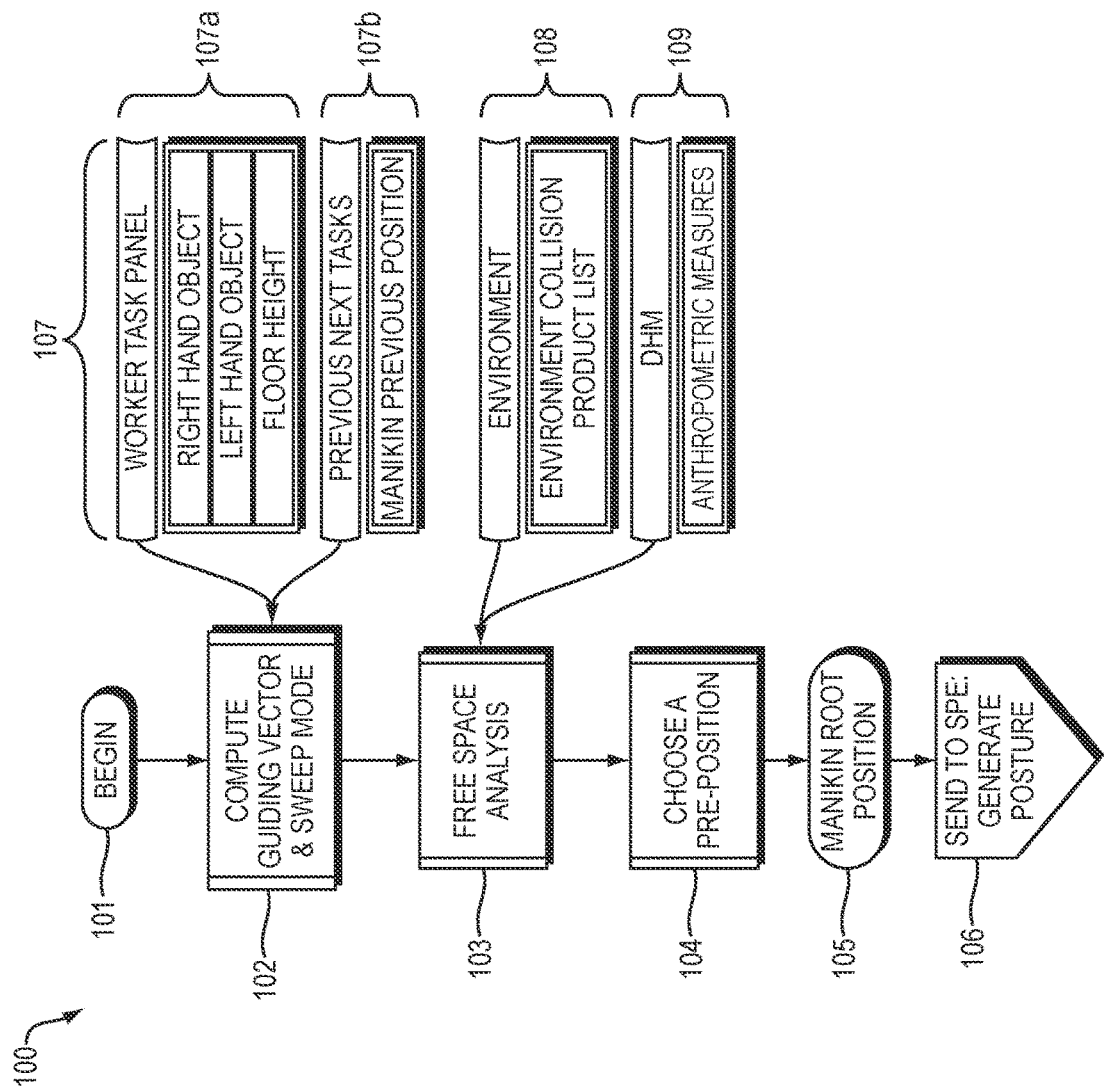
FIG. 1 is a flowchart of a method for determining initial/simulation starting positioning of a manikin according to an embodiment.

A description of example embodiments follows.

Computer implemented simulations of environments, e.g., manufacturing lines, utilize one or more CAD models that represent the environments including the objects therein. For example, when simulating a human in an environment, a digital human model (DHM) is typically utilized to represent the human performing a task in the simulated real-world environment. The DHM is a digital representation of the human body in a simulated environment, e.g., a workplace. DHMs are used to assist engineering designers in the design of safe and efficient environments by enabling the incorporation of human factors and ergonomic principles early in the environment design process (Chaffin 2007). Typical simulation tasks determine the behaviour, e.g., movement and/or posture, of the DHM in the simulated real-world environment. To implement these simulations, an initial position of the DHM in the environment is highly advantageous.

Current software solutions for DHM simulation provide some interactive tools to perform these simulations in the virtual environment. These existing tools allow direct manipulation of the degrees of freedom (DoF) of the manikin (i.e., forward kinematics) or a more intuitive manipulation of the end-effectors (e.g., hands, feet) with an inverse kinematics (IK) solver. Existing DHM software implementations such as Jack, DELMIA Human (by Assignee-applicant), and 3DSSPP provide such IK algorithms to assist the user in choosing an appropriate posture, i.e., the pose of the body segments of the human representation (DHM or manikin). Generally, in DHM tools, the user manipulation includes, but is not limited to, specifying the initial position of the end-effectors, and the DHM root segment. Once the position of the end-effectors and the root segment is known, the DHM posture for the simulation is predicted using an IK solver (Jung, Kee et al. 1995, Jung and Choe 1996, Baerlocher 2001, Baerlocher and Boulic 2004, Park, Chaffin et al. 2004), optimization-based methods (Abdel-Malek, Yang et al. 2006), or empirical models derived from experimental data such as regression (Faraway 1997, Chaffin 2007) or artificial neural network (ANN) methods (Perez 2005). The manual manipulations of the manikin postures are complex and time-consuming for engineers and suffer from large inter-user and intra-user variability. Therefore, there is a need for the development of automatic posture prediction, with only minimal user intervention.

A proper initial position of the root segment in the environment is crucial in an automatic posture prediction. Typically, posturing a manikin requires moving the whole manikin and its end-effectors to specific locations (e.g., target objects). Before positioning the hands, it is important to "pre-position" the whole DHM by moving its root segment (e.g., pelvis or one foot) close to the simulated task. An initial position at the proximity of the manikin terminal position (i.e., where a worker performs a task), considerably reduces the complexity of the posture prediction problem by narrowing down the solution space to the free space surrounding the target object. This pre-position is possible to perform by the user from a visual inspection of a target object's accessibility and an understanding of the task to simulate. In the early DHMs, the manikin root segment was fixed by the user to a reference point in the virtual environment (e.g., cockpit seat) and the manikin's posture was predicted within its reach zone (Ryan 1969). Most of the current approaches that automatically posture a DHM also require the poses of the end-effectors (i.e., a hand or foot) as inputs (Zhou and Reed 2009, Björkenstam, Delfs et al. 2016). 3DSSPP software relies on the user to provide the relative position of the manual handled object to the DHM (Feyen, Liu et al. 2000). In SANTOS DHM software the initial and final positions of the manikin in a scenario are provided as inputs (Abdel-Malek, Yang et al. 2006, Abdel-Malek, Arora et al. 2019). An automatic initial positioning of the manikin in the simulation of the real-world environment is not provided in the DHM tools above. Moreover, providing the root position is not always intuitive and may still pose a challenge for users with little or no experience in virtual ergonomics.

Björkenstam, Delfs et al. (2016) proposed an approach in which the external root mobility (at the pelvis) is included as 6 additional DoF. These DoFs were then used in the IK engine to allow the whole DHM position to change at each iteration. However, using these DoFs during the solve of a collision-free path becomes long and difficult in a cluttered environment. Others, (Wagner, Reed et al. 2005, Reed and Wagner 2007) presented a regression-based method derived from experimental data to predict the feet end-effector positions for manual handling tasks using the task and operator information. However, the Reed and Wagner method did not include obstacle avoidance in pre-positioning of the manikin, nor did it take into account constraints of a cluttered environment, target accessibility, or previous task information.

As such, functionality is needed to automatically determine a collision-free manikin initial/starting position in proximity to the target object that affords adequate accessibility for the manikin to the target object with no user intervention. As used herein, the terms "initial position," "starting position" for simulation purposes, and "simulation starting position" are synonyms and used interchangeably. As will be made clear below, the term "pre-position" with respect to the present invention and embodiments thereof is also used synonymously and interchangeably with the foregoing terms.

To provide such functionality, embodiments search for a collision-free DHM pre-position in a restricted area around the target object(s). Searching a restricted area increases the chance of finding a solution without having to deal with the entire complexity of the environment. This is especially true when simulating a large and cluttered workplace. This pre-positioning approach is suitable for simulating an environment where an initial manikin position is needed. For instance, embodiments can be used with static posture prediction DHM tools where the interest centers on the final posture, and not the path navigated by the manikin to reach the terminal position.

Embodiments provide a new method for automatic collision-free pre-positioning (i.e., initial/starting position for simulation purposes). Embodiments may sample the space around the target object(s) in a specific sequence to find a DHM initial root position which meets selected criteria. In an embodiment, the criteria are: (1) the manikin is collision-free with the environment, (2) access to the target object is not obstructed, and (3) the target object is at the reach zones of the manikin, i.e., within reach of the manikin. Embodiments may meet the aforementioned criteria while prioritizing: (i) positions closest to the target object, (ii) positions along task-specific orientations, (iii) positions with maximum target accessibility and minimal obstructions, and (iv) positions closest to the previous task performed.

An embodiment partitions the space around the target object and multiple pre-positions are tested for accessibility to the object, starting along a reference vector. In an embodiment, the level of accessibility of each pre-position is quantified by discretizing the space between the manikin and the target object.

FIG. 1 is a flowchart of a computer-implemented method 100 for automatically determining initial position (i.e., starting position for purposes of a simulation) of an agent, e.g., manikin, according to an embodiment. The inputs to the method 100 include the target object data and floor height data 107a, the manikin position at the previous task (if existing) 107b, data regarding collision objects in the environment 108, and the manikin anthropometric data 109. According to an embodiment, the collision objects here refer to the environment objects at the vicinity of the target object, which could potentially collide with the manikin while it is reaching the target. Target object and floor height data 107a may be accessible from object data structures stored in computer memory. Likewise, data 108 regarding the collision objects are accessible from respective object data structures stored in computer memory. Manikin data, such as 107b and 109, are accessible from DHM model data structures stored in computer memory.

The method 100 begins 101 and computes 102 a guiding vector and a sweep mode. Computing 102 the guiding vector and sweep mode includes automatically analyzing the environment data 107 (target object data and floor height data 107a and previous position data 107b which is collectively referred to as environment data 107) to determine a highest ranking type of data from among the environment data 107. The environment data 107 that is considered "highest ranking" may be based upon user indicated or default settings. Such settings indicate which data to prioritize when searching for a position. In turn, the method 100 responsively determines (i) the guiding vector and (ii) the sweep mode at step 102 based upon the determined highest ranking type of data 107. Embodiments of the method 100 may determine the highest ranking type of environment data 107 along with the guiding vector and sweep mode using the method 440 described hereinbelow in relation to FIG. 4. Moreover, embodiments of the method 100 may compute 102 the guiding vector using the method 550 described hereinbelow in relation to FIG. 5.

As noted, at step 102, the method 100 analyzes the environment data 107 to determine highest ranking environment data. In the method 100, the environment data 107 includes the worker task data 107a that indicates whether an object being used by the manikin is a right hand object, left hand object, or right and left hand (two hand) object. The worker task data 107a also includes the floor height in the environment being simulated. According to an embodiment, floor height indicates the height at which the manikin and the environment objects are supported. The environment data 107 also comprises the previous task data 107b which indicates the manikin's position, if any, at the end of a previous task. It is noted that the method 100 is not limited to the depicted environment data 107 and may use any desired data regarding the environment being simulated. Moreover, embodiments may be used to determine position for the manikin in relation to any number of target objects. According to an embodiment of the method 100, the environment data 107 may comprise at least one of: a number of hands involved, an indication of tool use, and a manikin position from a previous task or a default position for the manikin. In an example embodiment, the indication of tool use indicates a tool family and a tool orientation. In such an embodiment, the guiding vector may be determined at step 102 as a function of the indicated tool family and the tool orientation.

Returning to FIG. 1, the determined 102 guiding vector and sweep mode are used at step 103 to automatically analyze free space between the manikin and the target object in a simulated real-world environment to determine an initial/starting position for the manikin in a simulation of the real-world environment. According to an embodiment, the simulated real-world environment includes at least the manikin and the target object, and is represented by a computer-aided design (CAD) model. According to an embodiment, analyzing 103 the free space between the manikin and the target object comprises determining a first candidate (or trial) position for the manikin using the determined 102 guiding vector and sweep mode. In an embodiment, the first candidate position is determined using the guiding vector and sweep mode as described hereinbelow in relation to FIG. 3. After the first candidate position is determined, free space in the simulated real-world environment between (i) the manikin at the determined first candidate position and (ii) the target object is analyzed at step 103 to determine if the first candidate position meets criteria. In other words, the free space analysis 103 tests a first candidate position for the manikin to determine if the first candidate position is acceptable.

The free space analysis 103 may utilize any relevant data regarding the environment being simulated. For example, the method 100 illustrated in FIG. 1 utilizes environment collision data 108 (which includes a list of potential environment collision objects) and digital human model data 109 (which includes anthropometric measures of the manikin in the simulation being simulated). Moreover, in an embodiment of the method 100, the free space analysis 103 is implemented using the procedures described hereinbelow in relation to FIGS. 6A-B and FIGS. 7A-B.

In an example embodiment of the method 100, the free space analysis 103 first checks for collisions between the manikin at a first candidate position being analyzed and one or more objects in the simulated real-world environment. An embodiment of the method 100 analyzes the free space 103 by identifying any collision between a bounding volume of the manikin at a given position and one or more objects in the simulated real-world environment. Yet another embodiment checks for collisions using an existing collision detection methodology. If no collisions are identified, the free space analysis 103 calculates an accessibility score indicating ease of access for the manikin at the first candidate position to the target object. If the checking identifies no collisions between the manikin at the first candidate position and the one or more objects in the simulated real-world environment, and the calculated accessibility score is above an accessibility threshold, the first candidate position is set at step 104 as the initial/starting position for the manikin in the simulation of the real-world environment. Restated, step 104 selects and configures the first candidate position to serve as the pre-position for the manikin in the subject simulation of interest. However, if the free space analysis 103 identifies a collision between the manikin at the first candidate position and the one or more objects in the simulated real-world environment or the calculated accessibility score is below the accessibility threshold such an embodiment continues by repeating the free space analysis 103 by analyzing another candidate or trial position for the manikin.

As noted above, the free space analysis 103 may be repeated until an acceptable position for the manikin is determined. Such an embodiment iteratively: (i) determines a next candidate/trial position for the manikin using the determined guiding vector and sweep mode of 102 and (ii) analyzes free space in the simulated real-world environment between the manikin at the determined next candidate/trial position and the target object. The iterative analysis continues until a next candidate/trial position that meets criteria (no collisions and accessibility score above threshold) is identified or, until a maximum number of iterations based on the guiding vector and the sweep mode is reached (i.e., a next candidate/trial position that meets the criteria does not exist). If the iterative analysis 103 identifies a candidate/trial position with no collisions between the manikin at that position and the one or more objects in the simulated real-world environment and a calculated accessibility score indicating ease of access for the manikin at that position to the target object is above the accessibility threshold, the identified candidate/trial position is set at step 104 as the initial/starting position (i.e., pre-position) for the manikin in the simulation of the real-world environment. However, if no candidate position is identified that meets the criteria, a "best" candidate/trial position is set at step 104 as the initial/starting position for the manikin in the simulation.

As described above, the analysis 103 may iterate and test any number of candidate/trial positions for the manikin in the environment until an acceptable position is identified. In an embodiment, the next candidate position to check is a function of the guiding vector and sweep mode (computed at 102). Moreover, in addition to determining the next candidate position based upon the guiding vector and sweep mode, an alternative embodiment also determines the next candidate position based upon ranked proximity zones proximal to the target object. Such an embodiment may also determine the ranked proximity zones based upon dimensions of the manikin where dimensions of the manikin are indicated by the anthropometric data 109. Example candidate/trial positions and proximity zones are described hereinbelow in relation to FIG. 3.

As noted above, in an embodiment, a next candidate position to consider in the free space analysis 103 is iteratively determined and analyzed until an acceptable position for the manikin is identified. The next candidate position for analysis 103 in such an iterative analysis, is based on the guiding vector and sweep mode of 102. As such, there are a finite number of candidate positions to be checked. Thus, as described above, a scenario can occur where (1) no candidate position is identified that meets the criteria (e.g., no collisions and acceptable accessibility score) and (2) based on the determined guiding vector and sweep mode, a next candidate position does not exist, i.e., there are no additional candidate/trial positions to check. When this occurs, a given next candidate position (i.e., one of the previously considered candidate positions) is set as the initial/starting position for the manikin in the simulation of the real-world environment. In such an embodiment, the position is selected based on results of analyzing the free space in the simulated real-world environment between the manikin at the selected position and the target object. Such an embodiment may evaluate the accessibility scores for the manikin at each of the candidate positions that were evaluated 103, and at step 104 select the candidate position with the best accessibility score among the positions with no collision. In other words, such an embodiment chooses the best collision-free position (the first collision-free position with the highest accessibility score). In an example where the accessibility scores are zero, an embodiment chooses the first collision-free position. Further, if all candidate positions have collisions, the method 100 chooses the first candidate/trial position along the guiding vector.

An embodiment determines the accessibility score as part of the free space analysis 103 by discretizing the space between the manikin at the position being evaluated and the target object and, for each discretization of the space, determining an individual accessibility score. The individual accessibility scores indicate ease of access for the manikin to the target object within each discretization of the space. In turn, an overall accessibility score for the manikin at the given position is determined based upon each individual accessibility score. This, for example, may be done by summing the individual accessibility scores normalized by the maximum possible score. For example, if an embodiment discretizes the space between (i) each side (six sides in total) of the target object and (ii) the manikin, using six discretizations (e.g., polygons) per side and the six sides are tested, the maximum number of collisions (i.e., the number of discretizations in which a collision can occur) is 36. Each time a discretization is found to have no collision, such an embodiment increases the accessibility score by 1/36. So, for a single side, the score is between 0 (all discretizations in collision) and 6/36 (no discretizations in collision) and the overall score is between 0 and 36/36. If, for example, four sides are tested, the maximum number of collisions is 24 (4×6). If five sides are tested, the maximum number of collisions is 30 (5×6), and so forth. The overall score however, remains between 0 and 1 (0=0/36, 1=36/36).

According to an embodiment, each discretization of the free space is a three-dimensional polygon in a non-limiting example embodiment. In an embodiment of the method 100, the free space analysis 103 may be implemented using the functionality described hereinbelow in relation to FIGS. 6A-B and 7A-B.

To illustrate the free space analysis 103, consider the zones and candidate/trial positions described hereinbelow in relation to FIG. 3. When implementing the free space analysis 103 for the positions in FIG. 3, first, candidate position 1 is checked. Assume, in this example, that there is a collision between the manikin 331 and an object when the manikin 331 is at candidate position 1. Because of the collision, the free space analysis 103 next analyzes candidate position 2. At candidate position 2 there are no collisions and an accessibility score between the manikin 331 (when the manikin is at candidate position 2) and the target object 332 is determined. In this example, the accessibility score is below the threshold and, thus, the free space analysis 103 moves to evaluating candidate position 3. The free space analysis 103 determines that when the manikin 331 is at candidate position 3, there are no collisions between the manikin and objects in the environment 330 and the accessibility score is above the threshold. When this occurs, the method 100 moves to step 104 with position 3 as the results (outcome position) of the free space analysis 103. In an alternate illustration, candidate position 3 is also unacceptable and the free space analysis 103 moves to evaluating candidate position 4. Embodiments can continue evaluating candidate/trial positions shown in FIG. 3 in this fashion until an acceptable position is found or there are no more candidate positions to evaluate.

Returning to FIG. 1, the free space analysis 103 either identifies a position that is acceptable (i.e., meets criteria) or determines that no position exists that meets criteria. If a position is found that meets criteria, free space analysis 103 outputs the acceptable position as a resultant/outcome position. Step 104 selects the analysis resultant/outcome position as the manikin initial position (starting position) for the simulation of interest at step 104. If no position is found that meets the criteria, step 104 evaluates the accessibility scores for the candidate positions considered at step 103 and selects the collision-free position with the best accessibility score at step 104. If no collision-free position is found, the first position along the guiding vector is selected to serve as the manikin initial/starting position for the simulation of interest.

To continue, at step 105 of the method 100, the manikin initial/simulation starting position (i.e., pre-position) chosen at step 104 is used to set the position of the manikin root segment. The root segment can be any segment of the manikin (e.g. pelvis, one foot) defined by the software or by the user. When positioning this segment, all the other segments of the manikin follow.

In turn, at step 106, the manikin positioned with its root segment set at step 105 is sent to a posture prediction module (e.g. smart posturing engine (SPE) in DELMIA) to generate whole body posture for the manikin. The whole body posture comprises the manikin root segment positions and orientations that will be re-modified by the SPE as well as the other body segments positions and orientations that will be modified through a modification of their degrees of freedom (DOF) by the inverse kinematic solver of the SPE. As a result of method 100, the manikin in an initial position or pre-position that is readily useable in a simulation is output or otherwise provided at step 106.

Embodiments of the method 100 may go further and execute the simulation, i.e., simulate interaction between the manikin at the determined initial/starting position and the target object in the simulated real-world environment. Moreover, embodiments of the method 100 may use the manikin in the determined initial position as a starting point for simulating the configuration of an environment (or environment setup), including the manikin's (represented human's) behavior with respect to objects in the environment. Simulation results may be used to improve design of the real-world environment. For instance, if the simulation results identify collisions or poor accessibility for the manikin, a design and/or physical change to the simulated real-world environment may be determined and implemented by the user. For example, if the simulation results reveal that an object is too far and no collision-free position exists at the proximity of the target object, the user can modify the task design and move the object closer to the free space. Further, an embodiment can identify mis-orientation of a tool when the simulation results reveals the lack of free space around the specific orientation of the tool.

In an embodiment of the method 100, the manikin may represent any agent for which determining initial position in a simulation is desired. For instance, the manikin may represent at least one of: a human, an animal, and a robot, amongst other examples.

Figure 2C:
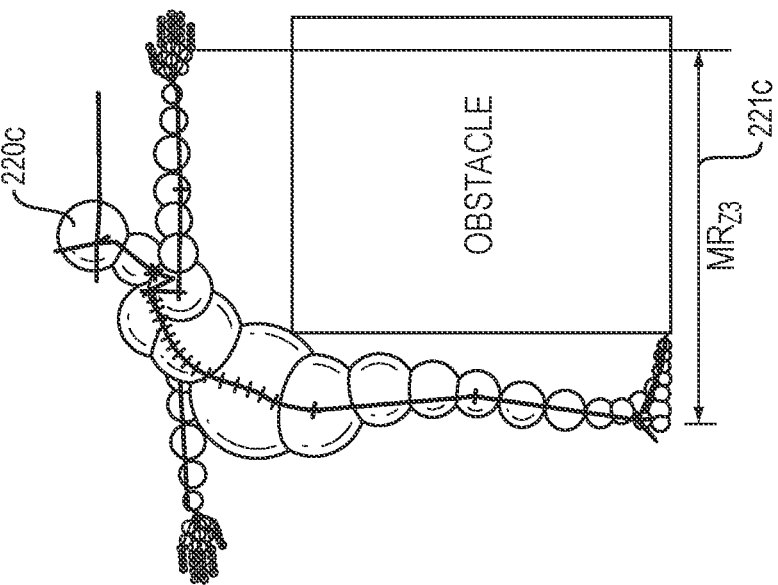
FIGS. 2A-C depict manikin distances from a target object that are used to determine proximity zones for analyzing candidate positions of a manikin in an embodiment.
Figure 2B:
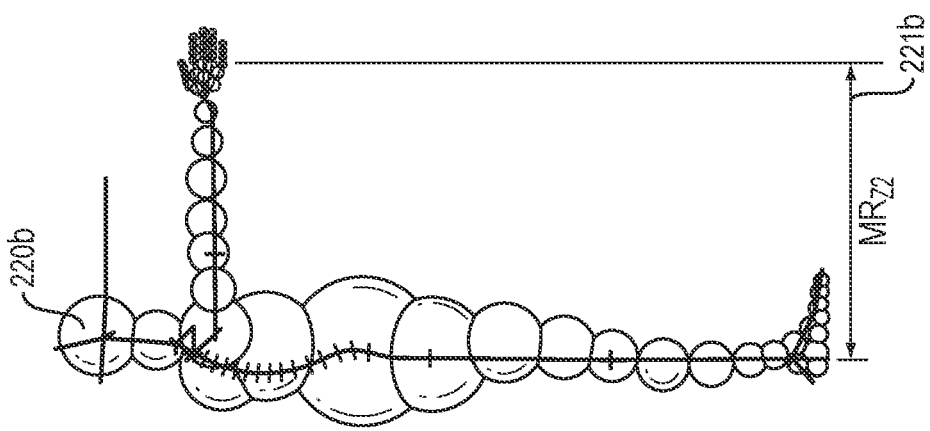
Figure 2A:
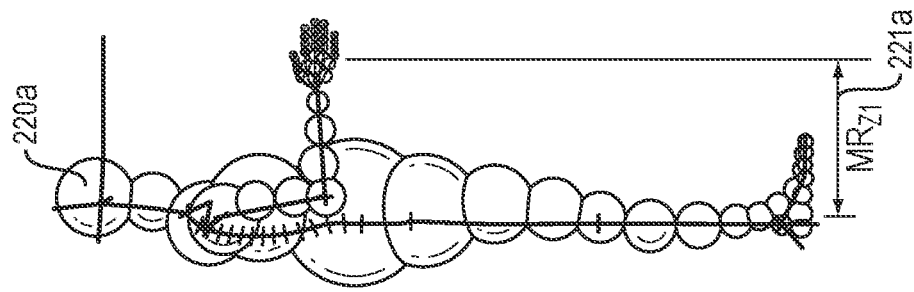

As described herein, embodiments, e.g., the method 100, may identify possible initial/simulation starting positions for the manikin using a guiding vector, sweep mode, and ranked proximity zones proximal to a target object. In an example embodiment, three zones of proximity are defined with respect to the target object center of geometry. If two different target objects exist, the zones are formed around the midpoint between the two target objects. In one such embodiment, the radii of the three zones correspond to the forearm-hand length, shoulder-forearm-hand length, and maximum extended reach without stepping of the manikin, with the center of gravity at the limit of the sustentation polygon. FIGS. 2A-C are illustrative. In particular, FIG. 2A depicts the forearm-hand length 221a for the manikin 220a, i.e., the max reach with forearms only. FIG. 2B shows the shoulder-forearm-hand length 221b for the manikin 220b, i.e., max reach with arms only, and FIG. 2C shows the maximum extended reach 221c for the manikin 221c without stepping, i.e., the max reach with all active degrees of freedom, center of gravity at a limit of safe support, and with the spine involved. In an embodiment, the three distances 221a, 221b, and 221c are used to define three proximity zones starting from the target object. The lengths 221a, 221b, and 221c are influenced by the anthropometry of the chosen manikin(s) 220a, 220b, and 220c. A shorter manikin will give smaller values for these lengths and a taller manikin will give higher values for these lengths.

Figure 3:
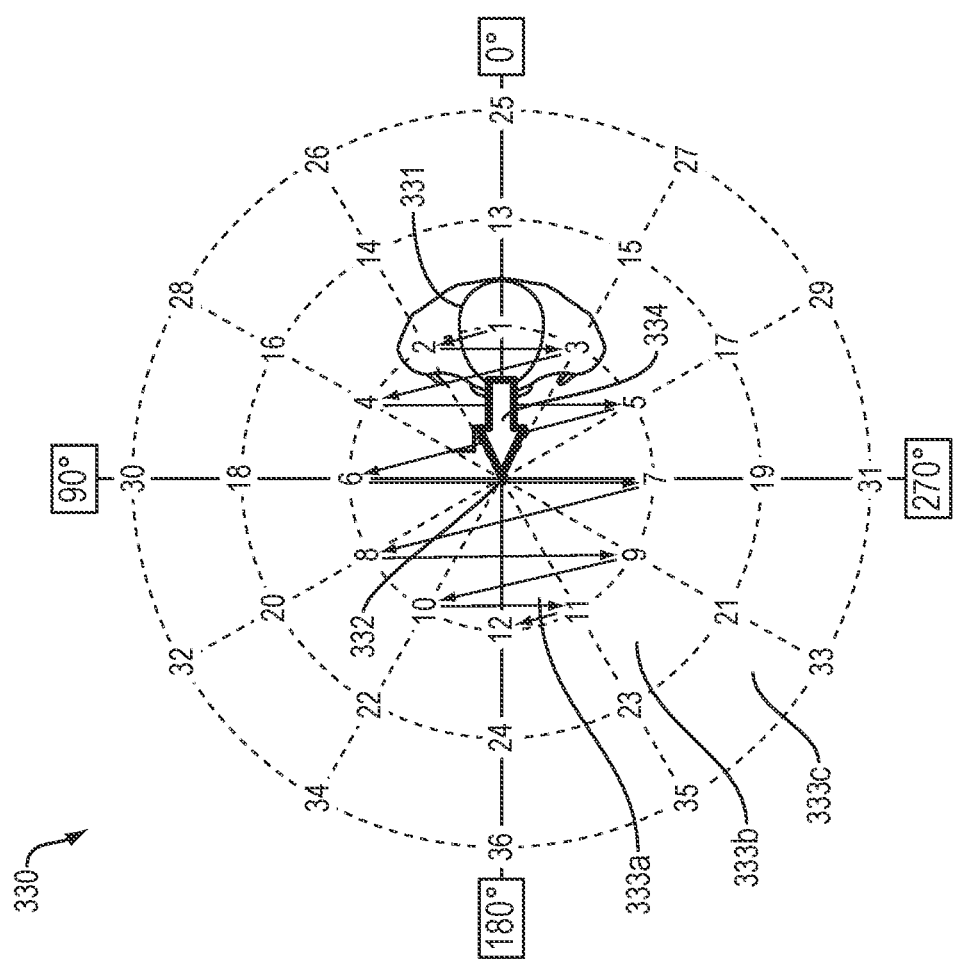
FIG. 3 is a schematic view of sampling zones and candidate positions surrounding a target object.

FIG. 3 depicts example zones and candidate positions that may be evaluated for purposes of determining positioning, i.e., initial/simulation starting position, of a manikin (such as in free space analysis 103 of FIG. 1) according to an embodiment. FIG. 3 illustrates an environment 330 that includes the manikin 331 and a target object 332. Based on the measurements of the manikin 331 (e.g., the distances 221a, 221b, and 221c), the environment 330 includes the zones 333a, 333b, and 333c, which extend radially outward from the target 332. In FIG. 3, the radius of the zones 333a, 333b, and 333c, correspond to the distances 221a, 221b, and 221c, respectively. In the particular example of FIG. 3, each zone 333a-c is discretized into increments of 30°. However, it is noted that embodiments may discretize zones into other finite increments.

In an embodiment, starting from the first zone 333a, each candidate position (indicated by the numbers 1-36 in FIG. 3) is checked for manikin-environment collision and target accessibility. An embodiment checks the candidate positions (1-36) in a particular sequence starting from the first candidate position (number 1) aligned with a reference line so-called the guiding vector (the directed line 334 at 0° in FIG. 3) and then sweeps the rest of the candidate pre-positions (2-36) in a zigzagging pattern (i.e., switching sides from the guiding vector 334). The sweeping is done in accordance with a determined sweep mode. For example, the sweeping can be performed all around the target object or it can be limited to half the plane on each zone 333a-c if the task requires the manikin to be in a specific orientation. To illustrate, in the environment 330, following the numbered candidate positions 1-36 in order shows the zigzagging pattern. Further, it is noted that embodiments do not need to check every candidate position 1-36 and may stop when a suitable position is identified.

Computing Guiding Vector and Sweep Mode

In an embodiment, a guiding vector 334 is defined as a unitary vector from the manikin 331 to the center of the target object 332. In an embodiment, the location of the target object is known along with the center of the target object. Then, according to the highest ranking type of data from among the environment data 107, the orientation of the guiding vector to the location of the target object center is computed.

According to an embodiment, the start point of the zigzagging process for evaluating candidate positions in each proximity zone 333a, 333b, and 333c is along the guiding vector 334 pointing towards the target center. Certain tasks require the manikin 331 to be in a specific orientation towards the task to allow a feasible posture. Examples of such tasks are grasping two-objects or utilizing a tool with a particular grasp orientation. For other tasks, such as a part grasp, even though the task does not require any specific orientation of the manikin 331, the manikin should stay close to the previous task position to follow the sequence of process planning data with minimum worker displacement between tasks. Using the guiding vector 334 to specify the start point of the zigzagging described above in relation to FIG. 3 allows embodiments to account for such information, i.e., required orientations for tasks and minimizing worker displacement using the previous worker position, amongst other examples.

In an embodiment, sweep mode limits indicate the range of environmental sampling around the target object 332 starting from the guiding vector where the task requires a specific manikin 331 orientation (partial sweep=±90°, or otherwise allows the sampling all around the target object 332 (full sweep=±180°). Thus, in an embodiment, sweep mode is determined based on data that indicates whether the task requires a particular manikin orientation. To illustrate, if, for non-limiting example, the manikin is placing a nail on a table, no particular orientation is required for the manikin to access the nail and the sweep mode is ±180°. In contrast, if the manikin is hammering the nail into the top of an object, the hammering task requires that the manikin be on the opposite side of the hammer head (behind the handle) and the sweep mode is limited to ±90°.

Figure 4:
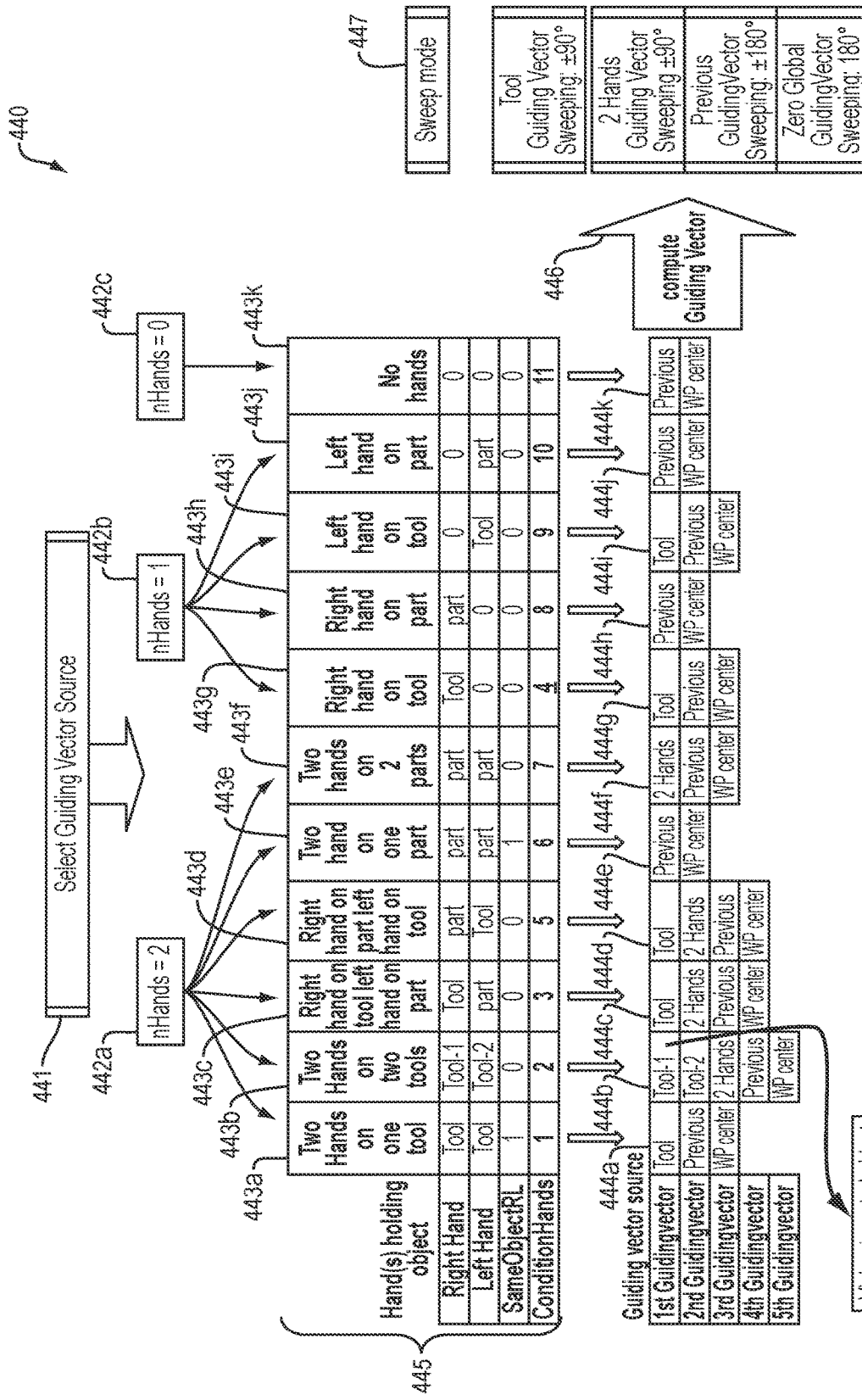
FIG. 4 is a flowchart illustrating a method embodiment for determining a highest ranking data for computing a guiding vector and a sweep mode.

Embodiments can analyze data about the environment being simulated to determine the highest ranking data. The guiding vector 334 is then based upon the determined highest ranking data. In turn, embodiments can determine the sweep mode based on what data was used to determine the guiding vector. FIG. 4 illustrates one such example method 440 for determining the highest ranking environment data which is used to compute a guiding vector 334 and determine a sweep mode. The process 440 starts with selecting 441 the guiding vector source data from among the environment data 445. In other words, at step 441 the method 440 selects which data to use to determine the guiding vector. In the method 440, the number of hands in action 442a (two hands of the manikin), 442b (one hand), or 442c (no hands) is identified and, then, depending on the existence of tools in action or the previous manikin position, a selection sequence defines the data source for computing the guiding vector.

In the method 440, there a multiple scenarios 443a-k which are indicated by the environment data 445. In each scenario 443a-k, there is a respective associated guiding vector source hierarchy 444a-k.

In scenario 443a, there are two hands on one tool, and the right and left hand are on the same object (the tool). Based on the scenario 443a, the guiding vector source hierarchy 444a is tool data, previous position for the manikin, and workplace center. To illustrate, if the scenario being simulated involves two hands on one tool (443a), the hierarchy 444a of data is used to compute the guiding vector. In such a scenario, according to the hierarchy 444a, first, the tool data is used to determine the guiding vector, if tool data does not exist, data regarding the previous position for the manikin is used to determine the guiding vector, and if previous position data does not exist, the workplace (i.e., target object environment) center is used.

In scenario 443b, there are two hands on two tools (one tool per hand), and the right hand and left hand are each on a different object (the two different tools). The guiding vector source hierarchy 444b for the scenario 443b is tool-1 data, tool-2 data, 2 hands grasping 2 different objects, previous position for the manikin, and workplace (target object) center. When 2 hands grasping 2 different objects data is used, vision target data 448 is also used. In particular, the vision targeted object data 448 indicates the object at which the manikin looks. If two hands are grasping two different tools, the tool which is used as the vision target (the one the manikin looks at) is used first to compute the guiding vector. In scenario 443c, the right hand is on the tool and the left hand is on the part (i.e., target object), and the right hand and left hand are considered to be holding a different object (not the same object). For the scenario 443c, the guiding vector source hierarchy 444c is tool data, 2 hands grasping 2 different objects, previous position for the manikin, and workplace center. In scenario 443d, the right hand is on the part and the left hand is on the tool, and the right hand and left hand are holding different objects. In the scenario 443d, the guiding vector source hierarchy 444d is tool data, 2 hands grasping 2 different objects, previous position for the manikin, and workplace center. In scenario 443e, there are two hands on one part, and the right hand and left hand are on the same object. For the scenario 443e, the guiding vector source hierarchy 444e is previous position for the manikin and workplace center. In scenario 443f, each hand is on a different part, and the guiding vector source hierarchy 444f is 2 hands grasping 2 different objects, previous position for the manikin, and workplace center.

For the one handed 442b scenarios 443g-j, one hand is on an object. For the scenario 443g, the right hand is on a tool, and the left hand is not interacting with the any object. This results in the guiding vector source hierarchy 444g of tool data, previous position for the manikin, and workplace center. In scenario 443h, the right hand is on a part, and left hand is not interacting with any object (right hand—part and left hand—nothing). Based on the scenario 443h, the guiding vector source hierarchy 444h is previous position for the manikin and workplace center. For scenario 443i, the left hand is on a tool and the right hand is inactive. The resulting guiding vector source hierarchy 444i is tool data, previous position for the manikin, and workplace center. In scenario 443j, the left hand is on a part and the right hand is inactive. This yields the guiding vector source hierarchy 444j of previous position for the manikin and workplace center.

Scenario 443k covers the scenario where both the right hand and left hand are inactive 442c. The resulting guiding vector source hierarchy 444k for the scenario 443k is previous position for the manikin and workplace center.

In the method 440, the guiding vector source, i.e., the data on which to determine the guiding vector, is selected 441 based on the number of the manikin's hands 442a-c being used and how those hands are being used. In the specific embodiment of FIG. 4, this results in the scenarios 443a-k. Each scenario 443 a-k has an associated hierarchy of data 444a-k on which to compute 446 the guiding vector 334. In embodiments, environment data 445 is analyzed to determine the scenario 443a-k being simulated. Once the scenario 443a-k is identified, the respective available data is examined. Then, based upon the associated data hierarchy 444a-k, the highest ranking available data is used at step 446 to compute the guiding vector. Further details for computing the guiding vector are described hereinbelow in relation to FIG. 5.

To continue, after computing 446 the guiding vector, the sweep mode is computed 447 based on the data in the hierarchy 444a-k used to compute 446 the guiding vector 334. In the method 440, the sweep mode is ±90° if the tool data is used to compute 446 the guiding vector. Likewise, the sweep mode is ±90° if 2 hands grasping 2 objects data (e.g., a data setting indicating the scenario is 2 hands grasping 2 objects) is used to compute 446 the guiding vector. In contrast, the sweep mode is ±180° if the previous manikin position is used to compute 446 the guiding vector, and the sweep mode is ±180° if the workplace center is used to compute 446 the guiding vector.

In summary, in the method 440, the source of the data for the guiding vector computation depends on the number of hands involved, the use of tools, and information regarding the manikin position from a previous task. The guiding vector is computed 446 from the first available information in the pertinent source hierarchy 444a-k. Depending on the guiding vector source data, two sweep modes (partial)(±90°) or full (±180°) are deployed in the zigzag position testing described herein.

Tool-Derived Guiding Vector

As described hereinabove in relation to FIG. 4, embodiments can determine the guiding vector 334 based on tool data, e.g., how one or more tools held by the manikin are positioned or used. In such embodiments, a guiding vector based on tool data, i.e., a tool guiding vector, is a vector with an optimal orientation of the manikin towards a tool. Using such a guiding vector facilitates generating a feasible grasp of the tool by the manikin with a relaxed forearm and wrist postures close to neutral value. The tool guiding vector represents a natural way of positioning the manikin to grasp the tool for its main use and depends on geometry and orientation of the tool.

Figure 5:
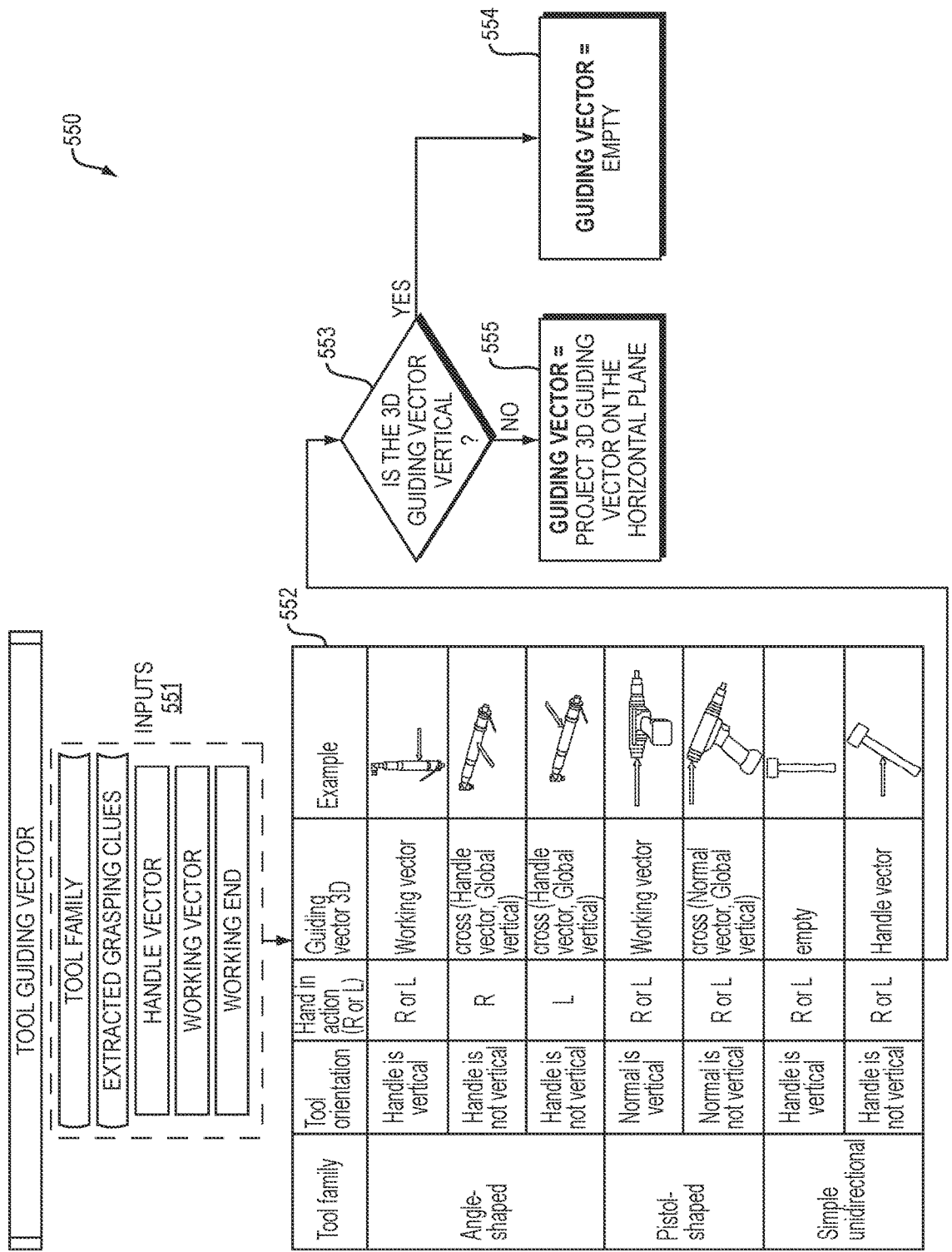
FIG. 5 is a flowchart of a method for determining a guiding vector using tool data according to an embodiment.

FIG. 5 is a flowchart of a method 550 for determining a tool guiding vector 334. As input 551, the method 550 takes the tool family and the tool affordance features (or regions) i.e., extracted grasping cues which indicate the handle vector of the tool, working vector of the tool, and working end of the tool. In embodiments, the tool orientation is derived from the handle vector of the tool and the working vector of the tool. In an embodiment, the affordance features are determined using an existing method that scans the tool geometry to automatically identify the grasping cues (Macloud, Rivest et al. 2019). An embodiment of the method 550 extracts the grasping cues using the methods described in U.S. Patent Publication No. 2020/0349299, entitled "Extracting Grasping Cues From Tool Geometry For Digital Human Models."

To continue, at step 552, the method 550 determines a preliminary 3D guiding vector. Step 552 processes data for three families of tools: angle-shaped tools, pistol-shaped tools, and simple uni-directional tools.

Angle-shaped tools possess two main directions (a handle axis and a working axis) similar to pistol-shaped tools. The difference is that the handle is relatively larger than the working axis and the hand force is mainly applied perpendicular to the straightened wrist and forearm direction to counterbalance the tool torque. For angle-shaped tools where the tool is oriented with a vertical handle, and the tool is in either hand, step 552 determines that the 3D guiding vector is the working vector of the angle-shaped tool. For an angled-shaped tool where the handle is not vertical and the tool is held in the right hand, at step 552 it is determined that the 3D guiding vector is the cross product of the handle vector and global vertical vector (i.e., vertical in the environment). Similarly, for an angled-shaped tool where the handle is not vertical and the tool is held in the left hand, step 552 determines that the 3D guiding vector is the cross product of the global vertical vector and the handle vector.

Pistol-shaped tools possess two main directions (handle axis and working axis) when the tool is scanned to extract the affordance features for the grasp. Examples of these tools are pistol drills or pistol screwdrivers. The main characteristics of pistol-shaped tools are that the hand force is mainly applied in the same direction as the straightened wrist and forearm. For pistol shaped tools, if the tool is oriented so the normal is vertical, at step 552 the 3D guiding vector is determined to be the working vector of the tool. In contrast, for pistol shaped tools where the tool is oriented so the normal is not vertical, step 552 determines the 3D guiding vector is the cross product of the normal vector and the global vertical vector.

Simple unidirectional tools have one main direction (the handle axis). Examples of these tools are mallets, screwdrivers, pliers, and straight power tools. The optimal direction of the guiding vector is along the general direction of the tool handle vector. Thus, for a unidirectional tool with a vertical handle orientation, step 552 determines the 3D guiding vector is empty. If the tool guiding vector is empty the next source of data in the hierarchy (e.g. 444a-k) presented in the method 440 is used to compute the guiding vector. As such, if the first source of data fails to provide the guiding vector (i.e., guiding vector=empty), the next source of data is used. A unidirectional tool with a non-vertical handle is determined at step 552 to have a 3D guiding vector that is the handle vector.

In step 552, the handle vector is the vector from the lower point to the upper point of the handle, the work vector is the vector from the handle body intersection to the working end of the tool, and the normal vector is the cross product of the handle vector and the working vector, which is a vector normal to the symmetrical plane of the tool. Embodiments may also set parameters for what is considered vertical, e.g., a vector is vertical if the deviation of the tool handle vector and global vertical vector is less than a threshold (e.g. 10°).

Returning to FIG. 5, at step 553 the method 550 determines if, the 3D guiding vector (computed at step 552) is vertical. If it is determined at step 553 that the 3D guiding vector is vertical, the method 550 moves to step 554 where the guiding vector is set as empty. When this occurs (the guiding vector is empty) the next source in the data hierarchy is used to determine the guiding vector. In contrast, if step 553 determines that the 3D guiding vector (identified at step 552) is not vertical), the method 550 moves to step 555 where the guiding vector is calculated by projecting the 3D guiding vector (determined at step 552) onto the horizontal plane of the environment.

In an embodiment, if there are two target objects (tools) each grasped with a different hand, the guiding vector is the perpendicular bisector of the line connecting the right to the left target object centers projected on the horizontal plane. This enables similar reach distances to both objects. According to another embodiment, if a tool is in action, the guiding vector is along a line, which allows a more neutral forearm and wrist posture depending on the tool grasp (described herein in relation to FIG. 5). In these two cases, the range of the sweep is limited to ±90° on both sides of the guiding vector, as the other half-plane on the opposite side requires arms crossing or implausible higher wrist deviations.

According to an embodiment, if the information regarding the tool or the 2 hand guiding vector is missing according to the hierarchy in the method 440, the manikin position in the previous task is consulted to form the guiding vector, as one goal of such an embodiment is to minimize the manikin displacements between tasks. However, no limit is imposed on the range of sweep in the zigzagging methodology of FIG. 3, and the zigzagging is performed on ±180° from the guiding vector 334. When no previous task exists, the previous manikin position is assumed to be at the center of the workplace (i.e., simulated environment).

In an embodiment, the guiding vector is computed according to the environment data ranking. The guiding vector consists of a point (i.e. the center of the target objects, and an orientation. The orientation is derived from the highest ranking type of data from among the environment data as following. If the highest ranking data is tool data, the guiding vector orientation is the tool specific grasp orientation referred to as the tool-derived guiding vector. If the highest ranking data is 2 hands (2 hands grasping 2 different objects), the guiding vector orientation is the perpendicular bisector of the line connecting the right to the left target object centers projected on the horizontal plane. If the highest ranking data is the previous position of the manikin, the guiding vector orientation is the unitary vector along the line connecting the previous manikin position to the center of the target objects. If the highest ranking data is the center of the workstation, the guiding vector orientation is the unitary vector along the line connecting the center of the workstation to the center of the target objects.

Free Space Analysis

As described hereinabove, embodiments analyze free space between a manikin at a position and a target object to determine if the position is appropriate. For example, a free space analysis is performed at step 103 of the method 100 in FIG. 1. In one such example, step 103 analyzes free space starting from a first position, in a first zone, along the guiding vector 334 (e.g., position 1 in FIG. 3). If the free space analysis determines the free space between the manikin at position 1 and the target object is acceptable, the method sets position 1 as the initial position (starting position for simulation) for the manikin, otherwise, such an embodiment moves on and evaluates the free space between (i) the manikin at a next candidate position (e.g., position 2 in FIG. 3) and (ii) the target object.

Figure 6B:
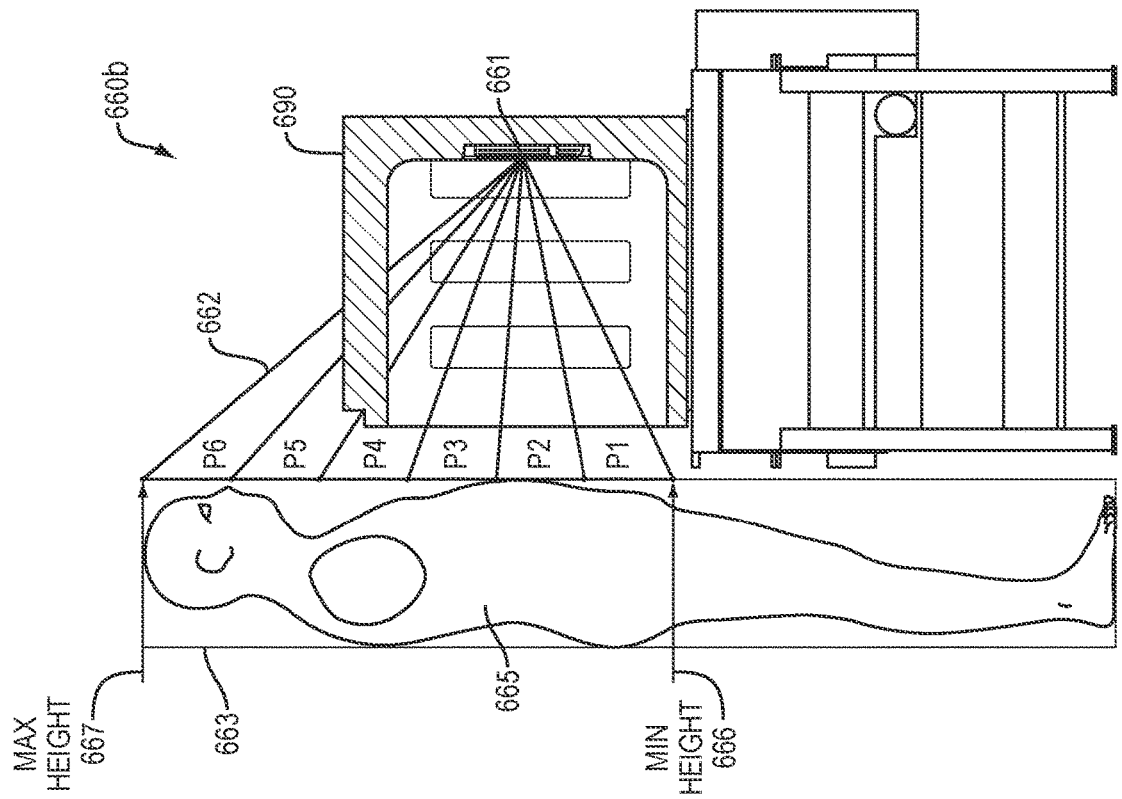
FIGS. 6A and 6B are a top view and a side view, respectively, illustrating discretization of free space that may be implemented in embodiments.
Figure 6A:
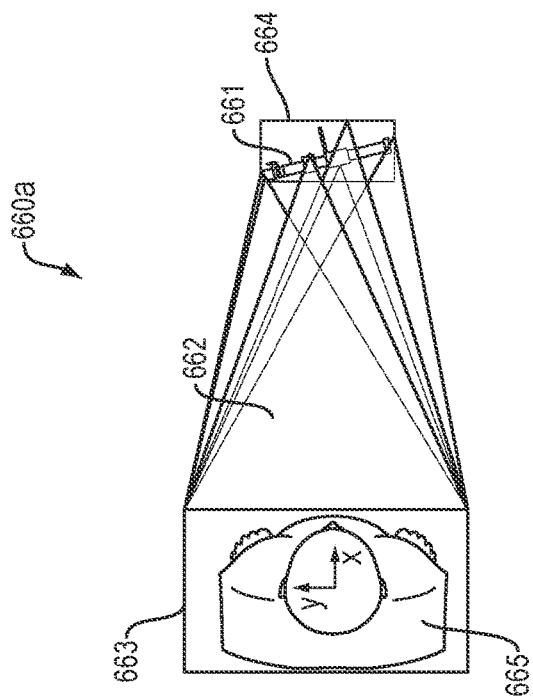

The free space analysis, according to an example embodiment, first checks for a collision between the manikin bounding volume (BV), e.g., an oriented bounding volume, and the environment. An embodiment checks for collision using an existing collision detection method. To continue, if no collision is detected, the level of obstruction between the DHM and the target object is quantified by discretizing the space in the horizontal and vertical dimensions using a series of three-dimensional polygons, e.g., pyramids. A non-limiting example of discretization is shown in FIGS. 6A and 6B where FIG. 6A depicts a top view 660a and FIG. 6B shows a side view 660b of discretizing the free space. For the example of FIGS. 6A and 6B, a total of 36 pyramids (generally referenced 662) were created with the apex points of the pyramids 662 on the target object 661 and the bases of the pyramids 662 attached to the manikin 665 bounding volume, here exemplified with an oriented bounding box 663.

In FIGS. 6A-B the apex of pyramids 662 were placed on the six extremity points of the target object labelled using the sides of the object bounding box 664 with respect to the manikin 665 (top 776, bottom 775, right 774, left 773, front 772, back 771). This labelling for the target object 661 bounding box 664 is shown in detail in FIGS. 7A-B.

Figure 7B:
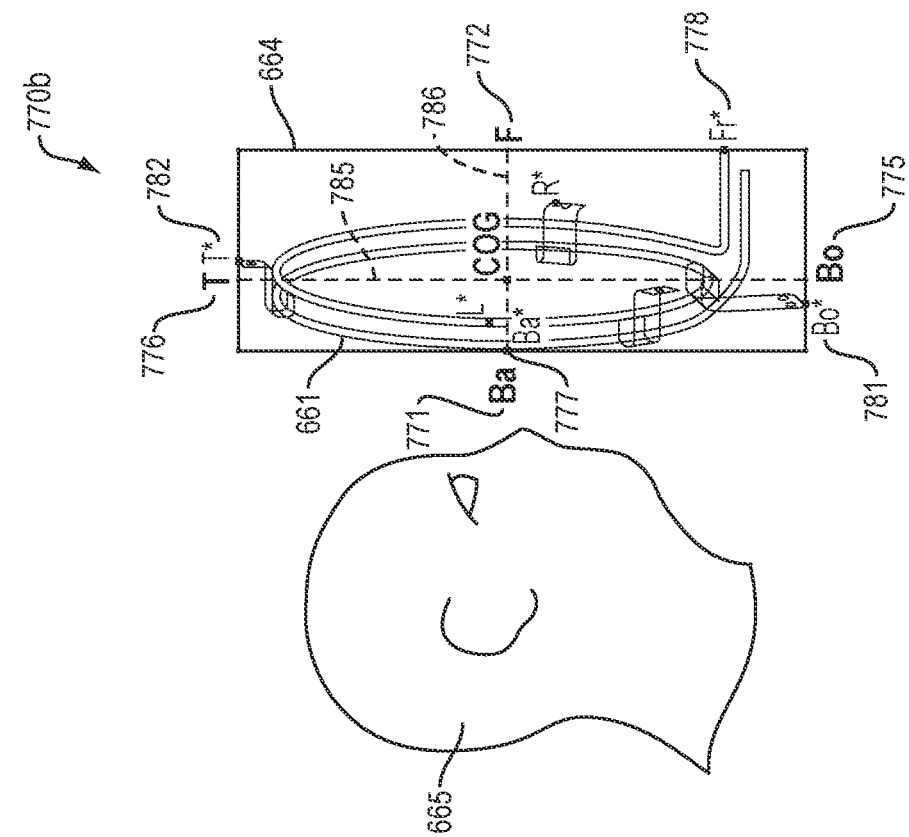
FIGS. 7A and 7B are a top view and a side view, respectively, of a target object bounding box used in an example embodiment.
Figure 7A:
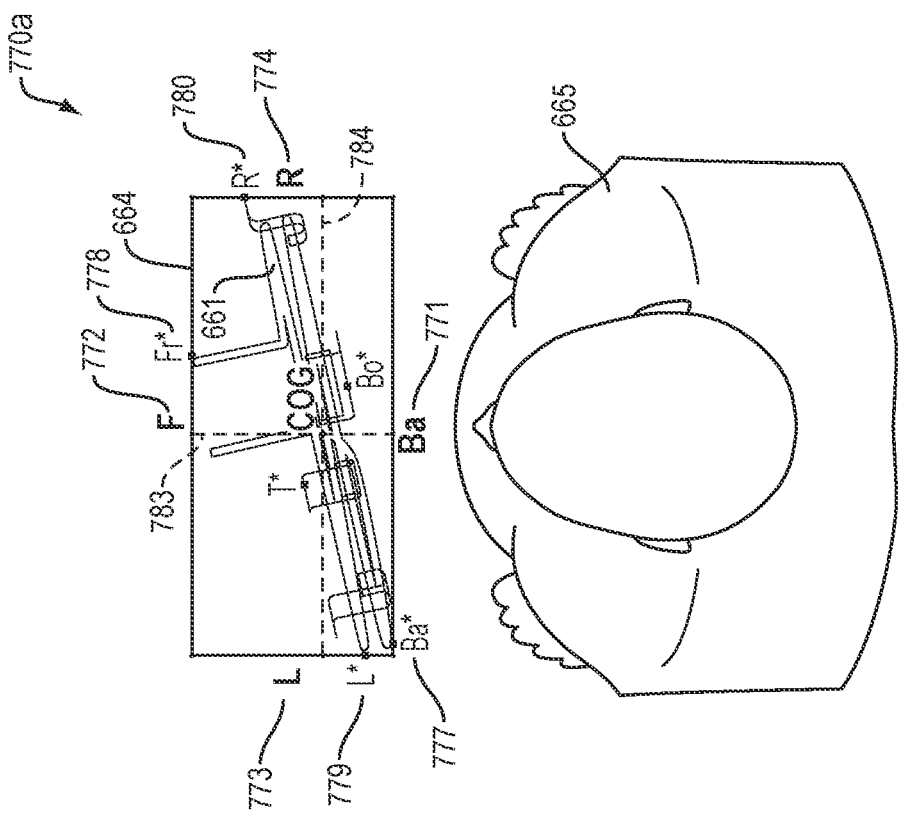

FIG. 7A is a top view 770a showing the manikin 665 in relation to the target object 661 bounding box 664. FIG. 7B is a side view 770b showing the manikin 665 in relation to the target object 661 bounding box 664. FIG. 7A shows the back 771, front 772, left 773, and right 774 of the target object 661 bounding box 664. FIG. 7B shows the back 771, front 772, bottom 775, and top 776 of the target object 661 bounding box 664. Each side 771-776 of the target object 661 bounding volume 664 has a corresponding target object 661 apex 777-782. In FIGS. 7A-B, the target object 661 apex points are back apex 777, front apex 778, left apex 779, right apex 780, bottom apex 781, and top apex 782. For comparison purposes, FIGS. 7A-B also show the projections with the dotted lines 783-786 of the object 661 center of geometry on each side of the bounding box 664.

FIGS. 6A-B illustrate stretching a set, e.g., 6, of pyramids 662 from each apex point (777-782) of the target 661 towards the manikin 665. Each pyramid 662 has a rectangular base located on the front face of the manikin 665 oriented bounding box 663 (pointing towards the target object 661) and aligned with the manikin 665 oriented bounding box 663. The horizontal width of each pyramid 662 base is set to the shoulder width of the manikin, i.e., the width of the orientated bounding box 663. A discretization of the vertical space is performed in-between a minimum height 666 and a maximum height 667. In an embodiment, the minimum height 666 is set to the minimum working height for standing posture for an average man (81 cm), as proposed in Humanscale (Diffrient N. Tilley A. R. 1982). This height is 10 cm lower than the hip joints of the manikin 665. It is noted that in embodiment, different values may be used and such values can be set by the user or predefined. The maximum height 667 is set based on the manikin stature, assuming that the manikin 665 would be easily able to reach an object at (or slightly higher than) shoulder level. The covered height is further discretized in six equal pyramids 662 P1-P6 in FIG. 6B. This number of pyramids was determined to be a good compromise between a too low discretization that tends to underestimate the accessibility score and a too high discretization that increases computation time and compromises performance. As an example, FIG. 6B shows that pyramids 662 P1, P2, and P3 do not collide with any objects in the environment, but pyramids 662 P4, P5, and P6 collide with an object 690 in the environment.

The overall discretization of the space in the horizontal and vertical directions serves as a measure to detect potential obstruction in the way between the DHM 665 and the target object 661.

An embodiment first checks for any collision between the pyramids 662 and objects (excluding the target object) in the environment. An embodiment starts with a null accessibility score and raises the score each time that a new collision-free pyramid is found.

Choosing An Initial Position for Start of Simulation

To choose an initial or starting position for the manikin (for simulation purposes), an embodiment starts at a first proximity zone to the manikin, e.g., the zone 333a in FIG. 3. The accessibility scores of all collision-free candidate or trial positions are sorted from a first such position, e.g., candidate position 1 in FIG. 3, along the guiding vector 334 to the last one (candidate position) limited by the maximum range of the sweep. The first candidate or trial position with an accessibility score over a certain threshold is selected.

In embodiments, the threshold for accessibility scores can be a user selected value. For an example embodiment, the threshold is based on empirical data. In one such embodiment, a threshold was found empirically from a systematic analysis of 468 pre-positions (i.e., 36 pre-positions per task multiplied by 13 tasks) and was set to 0.7. In environments, some sides of the target object (e.g., tool) can be in contact with other parts or resources (e.g., table, assembly parts). Therefore, setting a full accessibility score threshold (1.0) results in false-negative results where the target object is sufficiently accessible, but the position is rejected by the threshold. However, if the accessibility score threshold is too small, it is too permissive and inappropriate positions are identified. For instance, if the threshold is too permissive, environment obstacles (e.g., bins, closed sides) that restrict access in certain positions are ignored and, oftentimes, such implementations fail to put the manikin at the correct position.

In an embodiment, if no candidate or trial positions with the minimum accessibility score are found in a first proximity zone, e.g., zone 333a in FIG. 3, across the allowed range of sweep (i.e. ±90° or ±180°), an embodiment moves on to checking the next proximity zone or zones, e.g., 333b-c, in the order. For a given task, if an accessibility score above a threshold is never reached after all the pre-position candidates or trial positions have been tested, the candidate position with the highest score is selected, starting the check of such position from the guiding vector and from the collision-free positions. Eventually, if no collision-free position with a positive accessibility score is found across all the zones, the manikin initial/starting position for the simulation of interest is set at position 1 in FIG. 3 along the guiding vector.

Example Results—Assembly Line

Figure 8A:
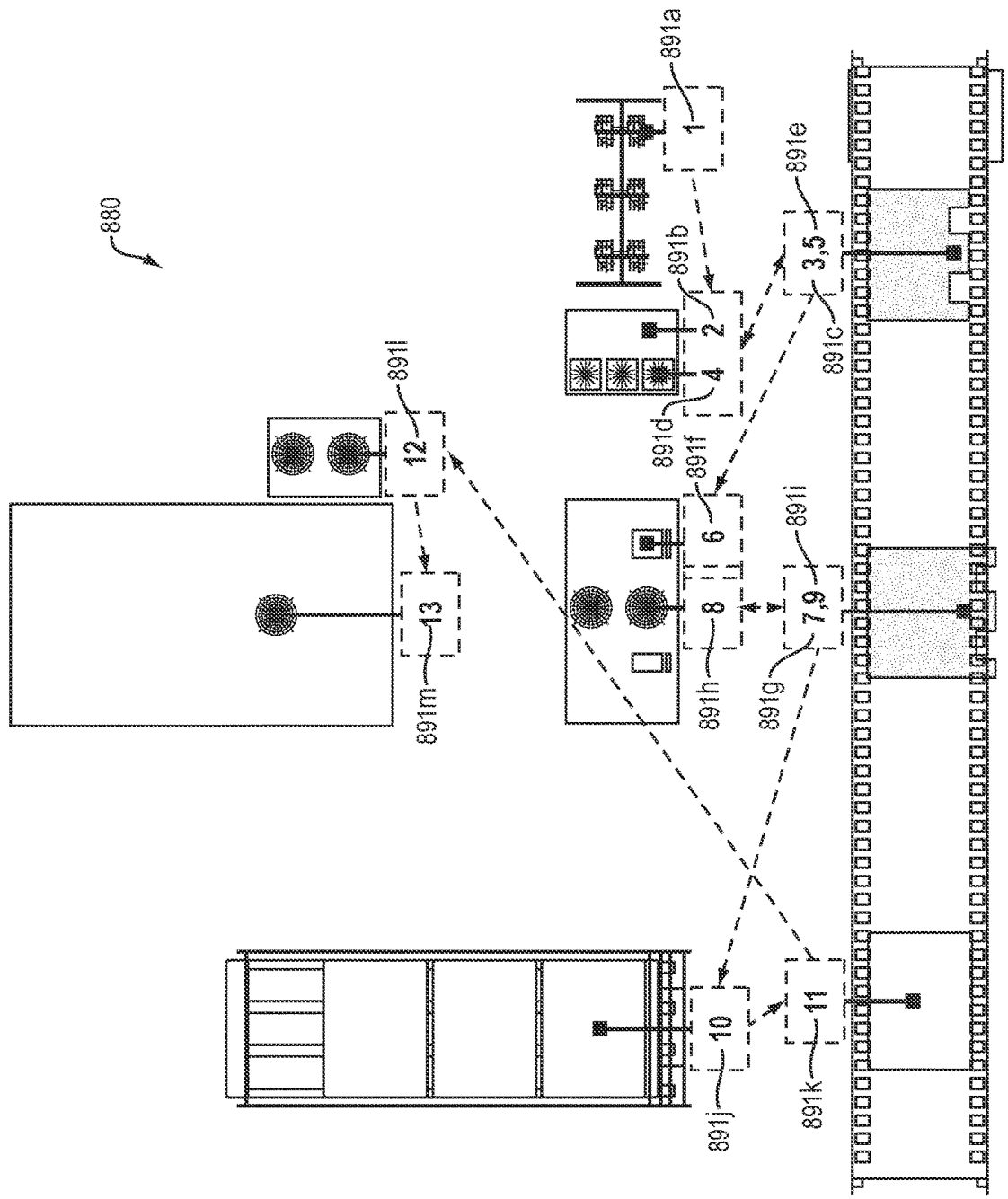
FIG. 8A is a schematic depiction of expected positions (pre-positions) for simulating tasks.

FIG. 8A is a schematic depiction of expected initial/starting positions 891a-m (pre-positions) for simulation tasks (1-13) in the environment 880. In FIG. 8A, it is expected that the prepositions 891a, 891b, 891d, 891f, 891h, and 891l will be found in zone 1 (e.g., zone 333a); the prepositions 891j and 891k will be found in zone 2 (e.g., zone 333b) and the prepositions 891c, 891e, 891g, 891i and 891m will be found in zone 3 (e.g., zone 333c). Each pre-position 891a-m points towards the center of geometry of the target object.

Figure 8B:
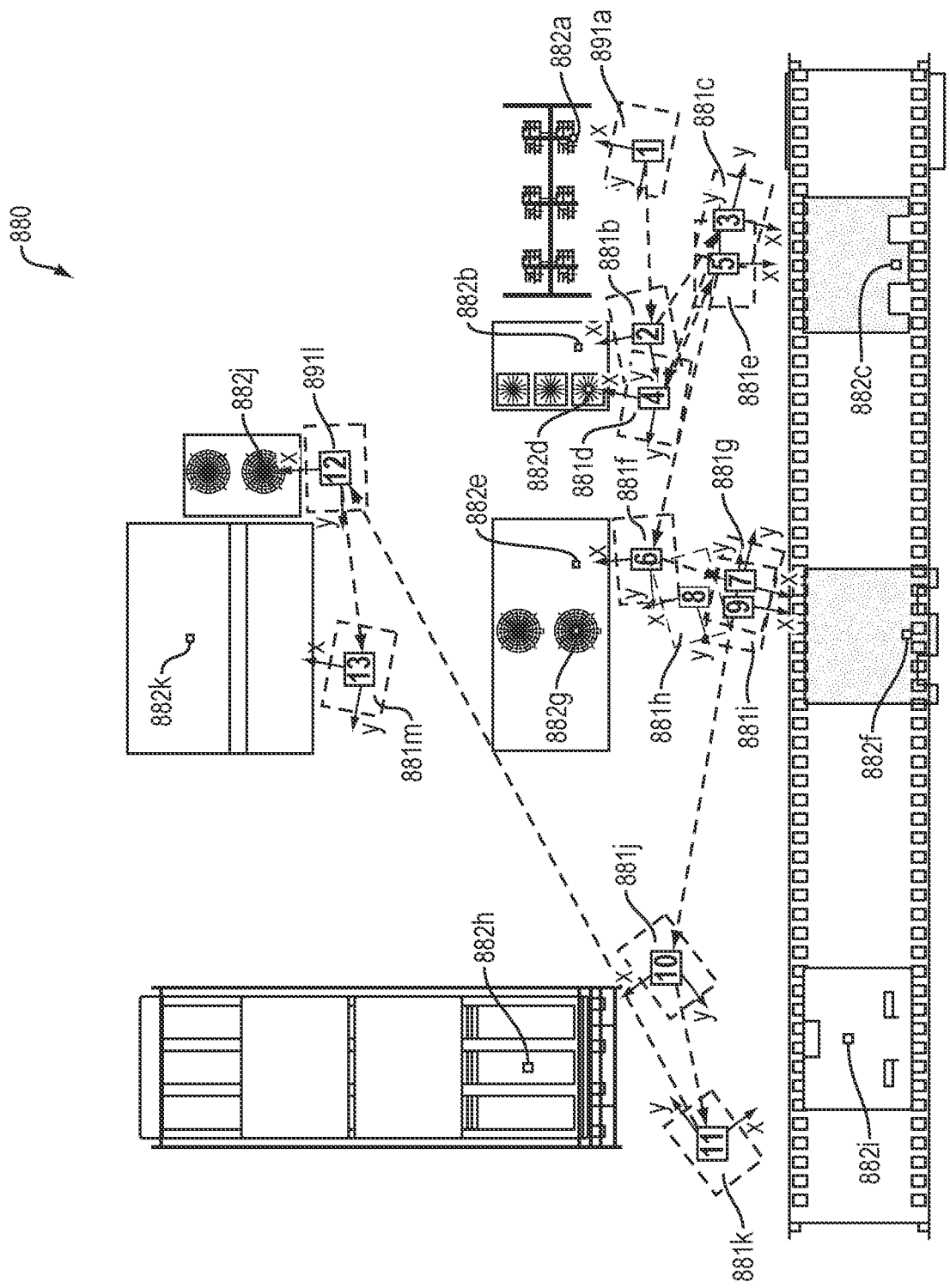
FIG. 8B is a schematic depiction of manikin positions (pre-positions) for the tasks of FIG. 8A determined using embodiments.

While FIG. 8A depicts expected pre-positions 891a-m, FIG. 8B shows initial/starting positions 881a-m, i.e., also referred to herein as pre-positions, determined for corresponding simulation tasks (1-13) in the environment 880 using embodiments, e.g., the method 100. FIGS. 9-17 depict the environments 990, 1000, 1100, 1200, 1300, 1400, 1500, 1600, and 1700, respectively, in which the tasks 1-13 to be simulated occur.

Figure 9:
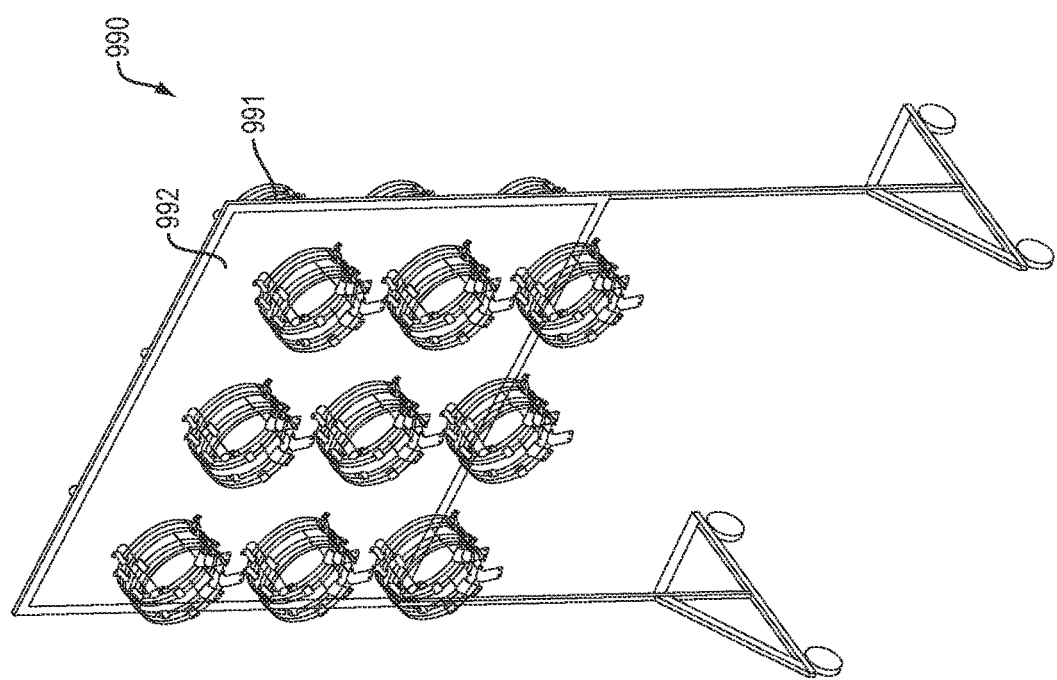
FIGS. 9-17 are perspective views illustrating environments (tasks 1-13) for simulation where embodiments can be used to determine initial positions (pre-positions) for a manikin.
Figure 10:
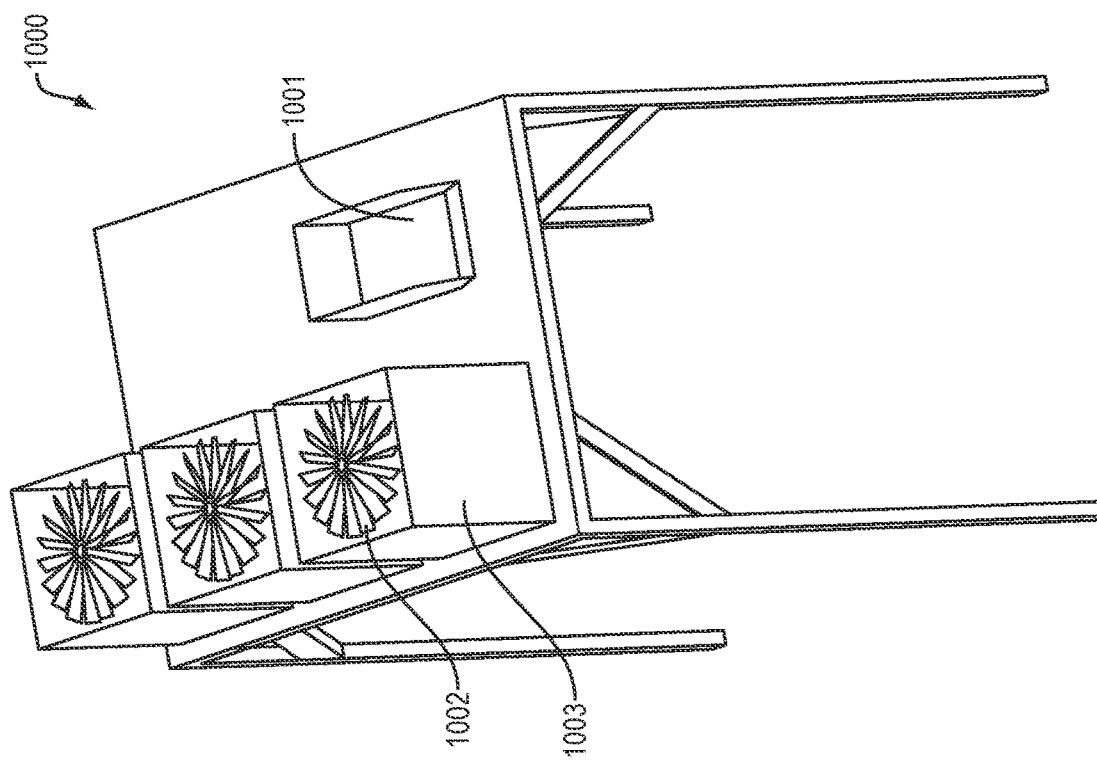
Figure 11:
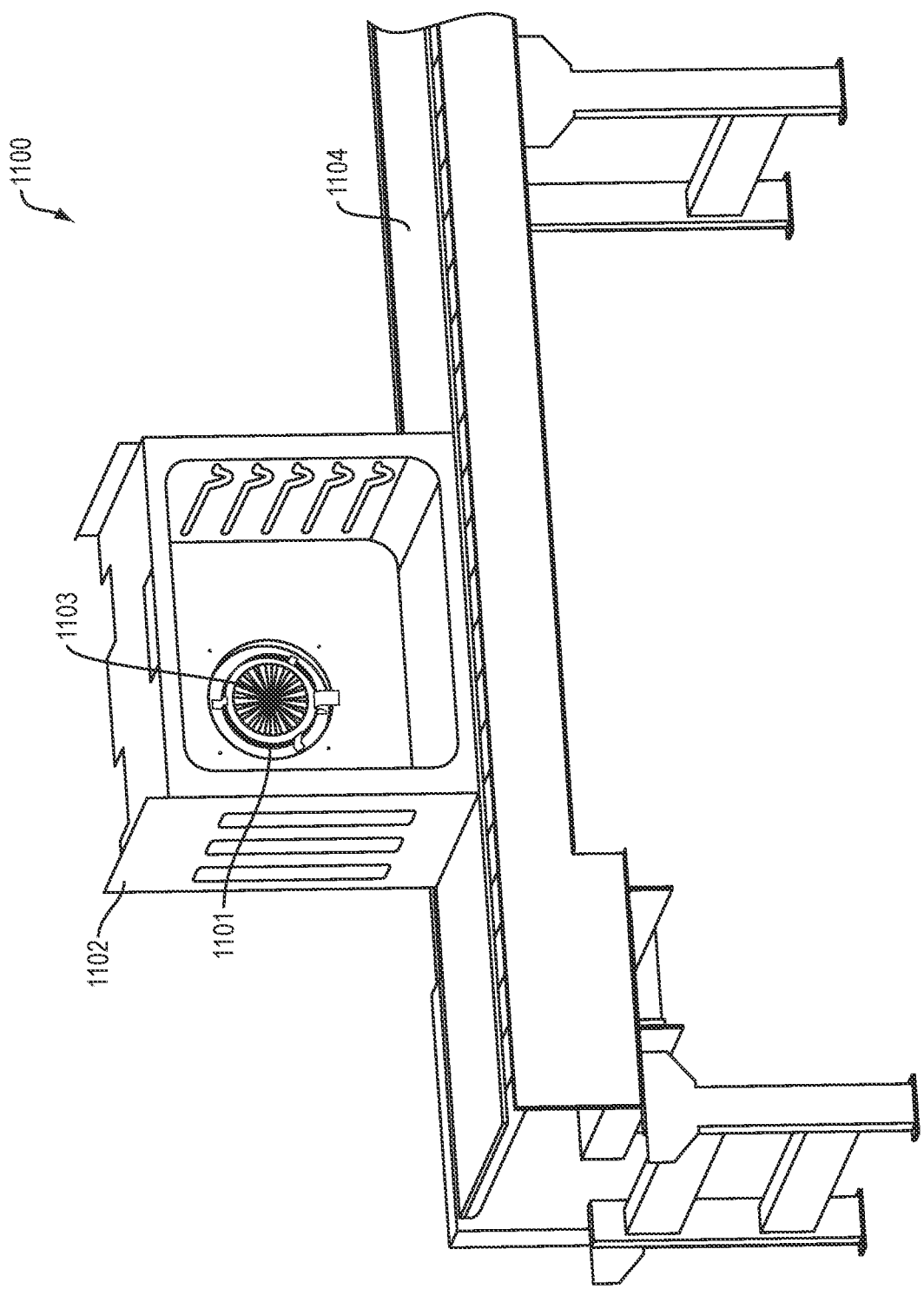
Figure 12:
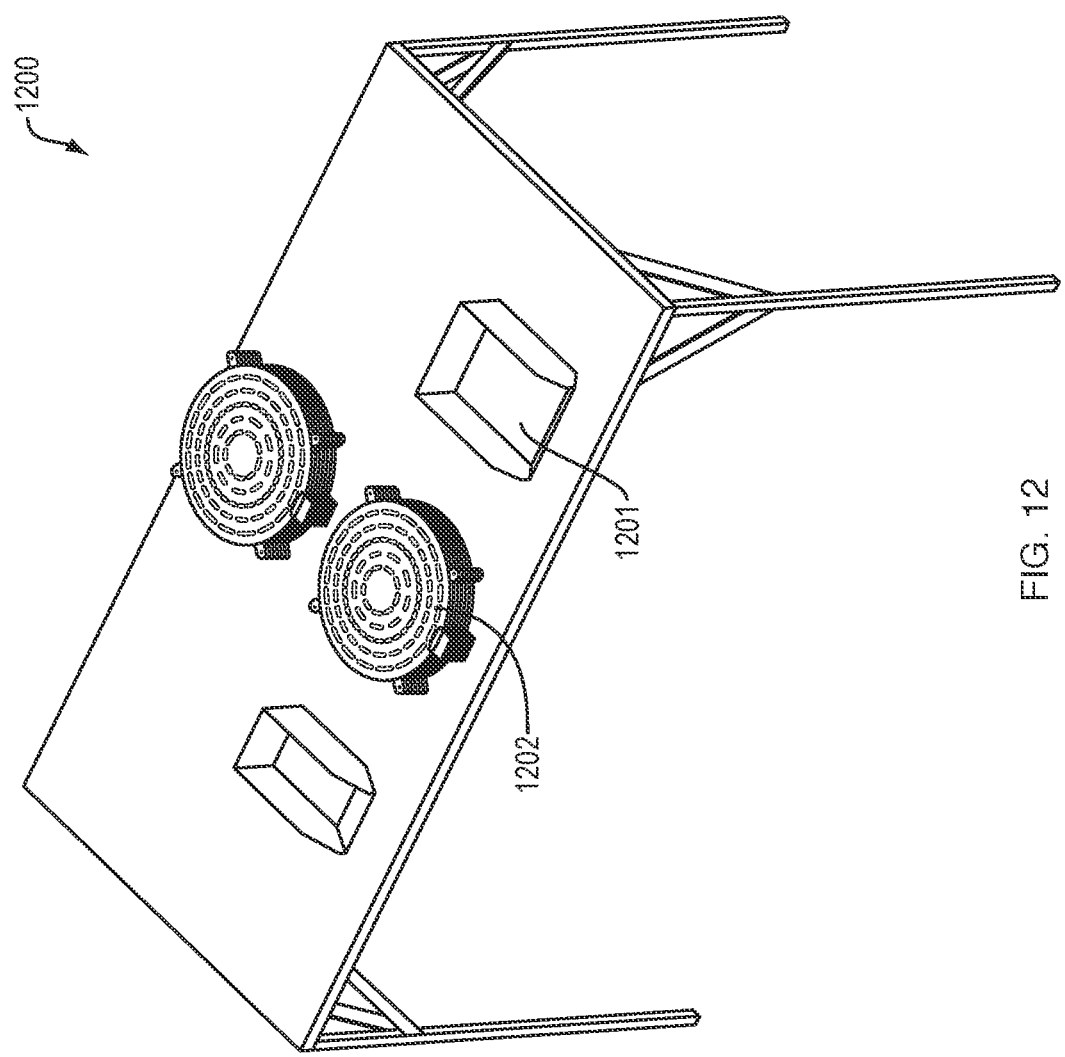
Figure 13:
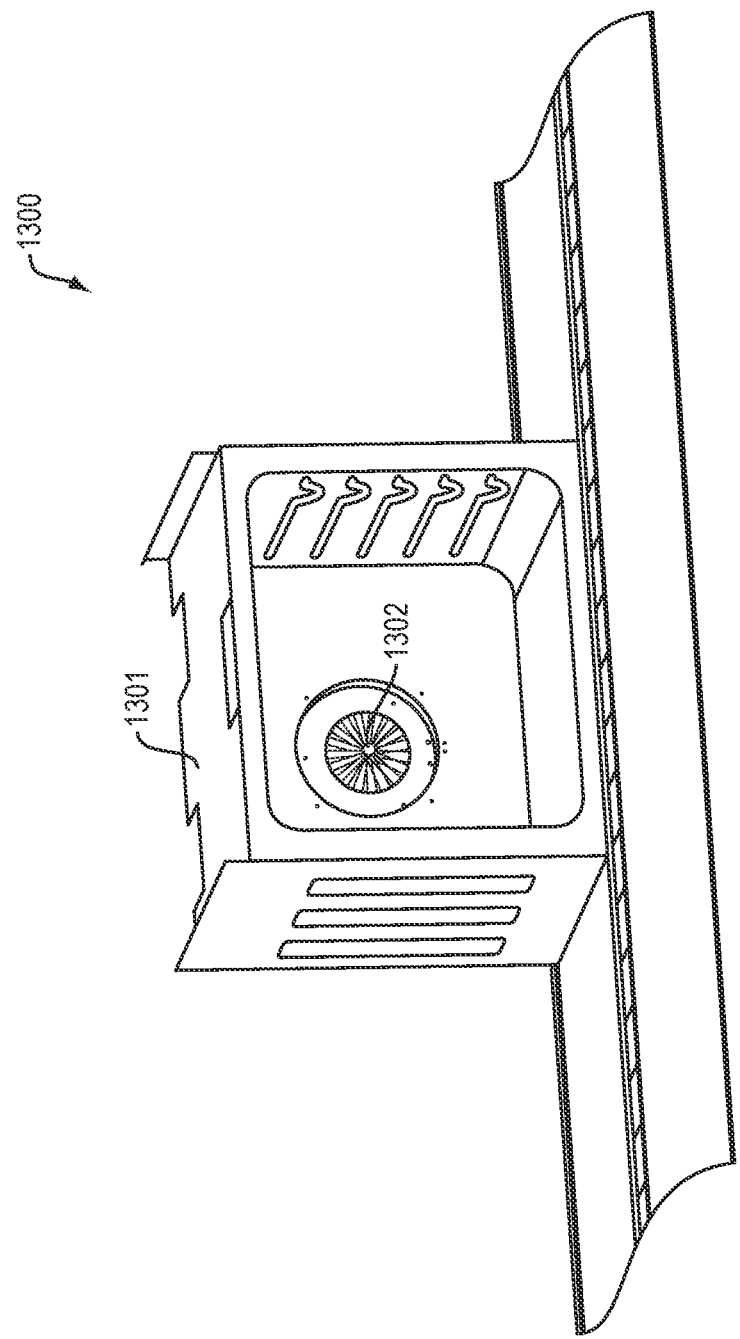
Figure 14:
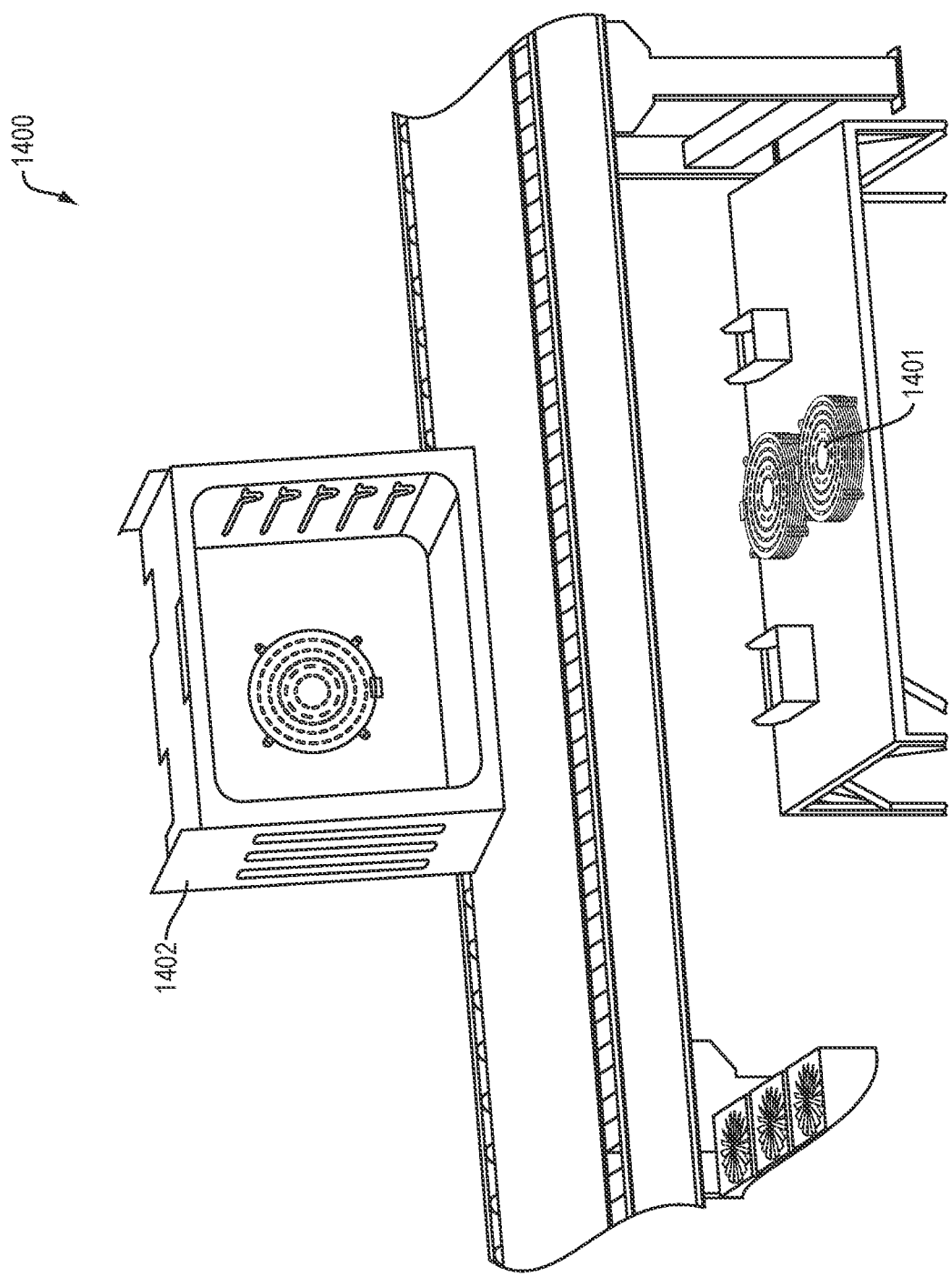
Figure 15:
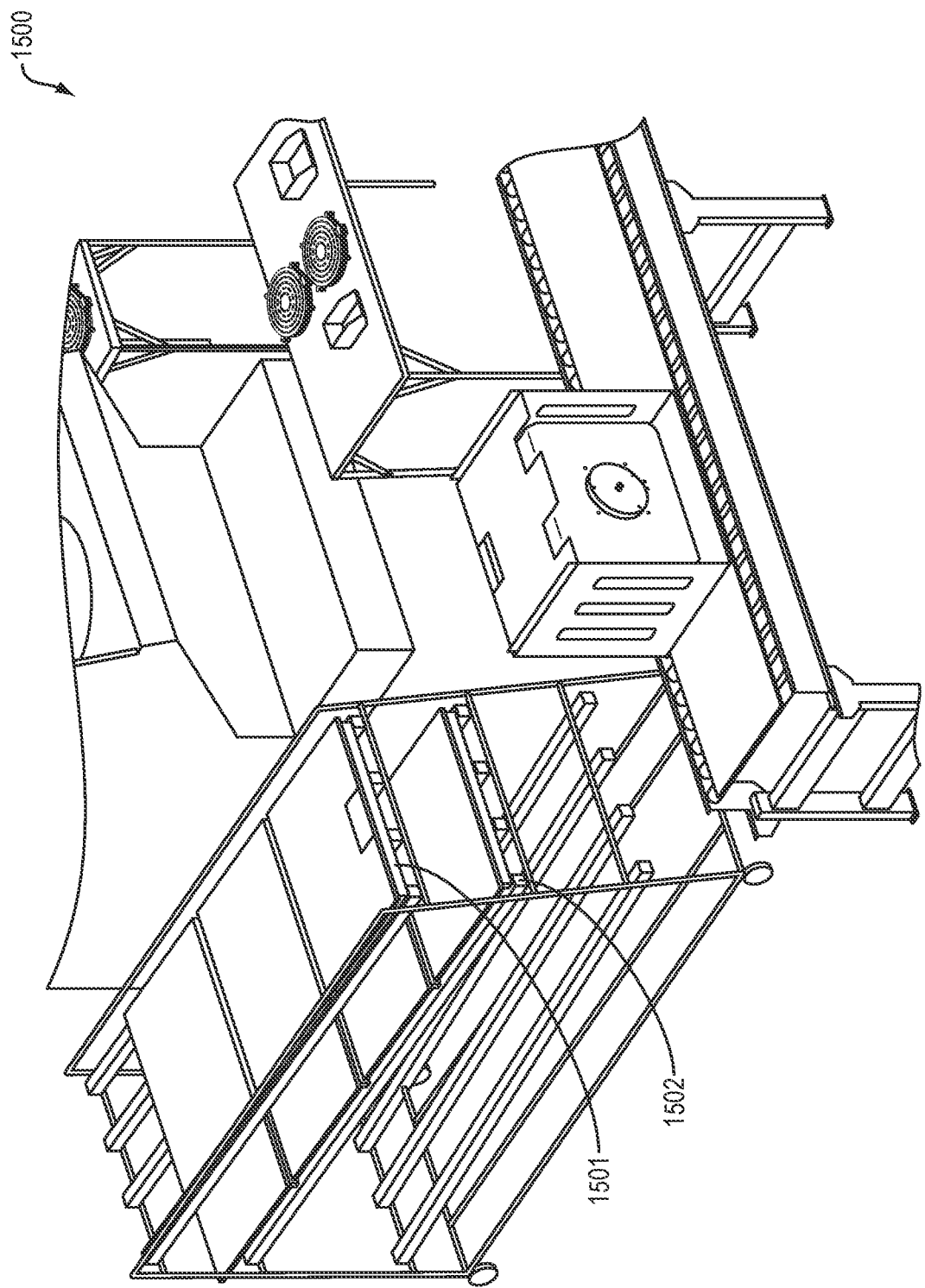
Figure 16:
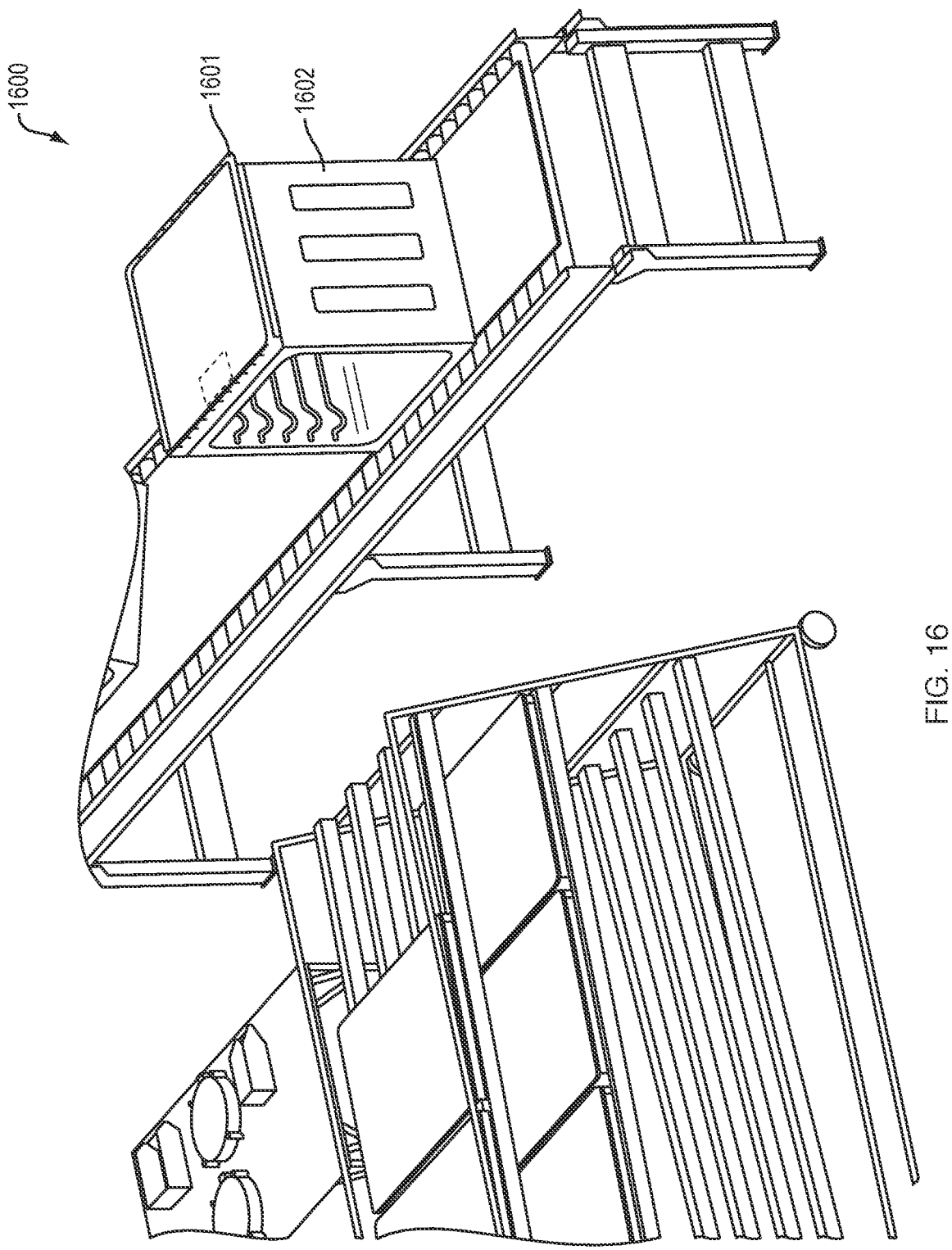
Figure 17:
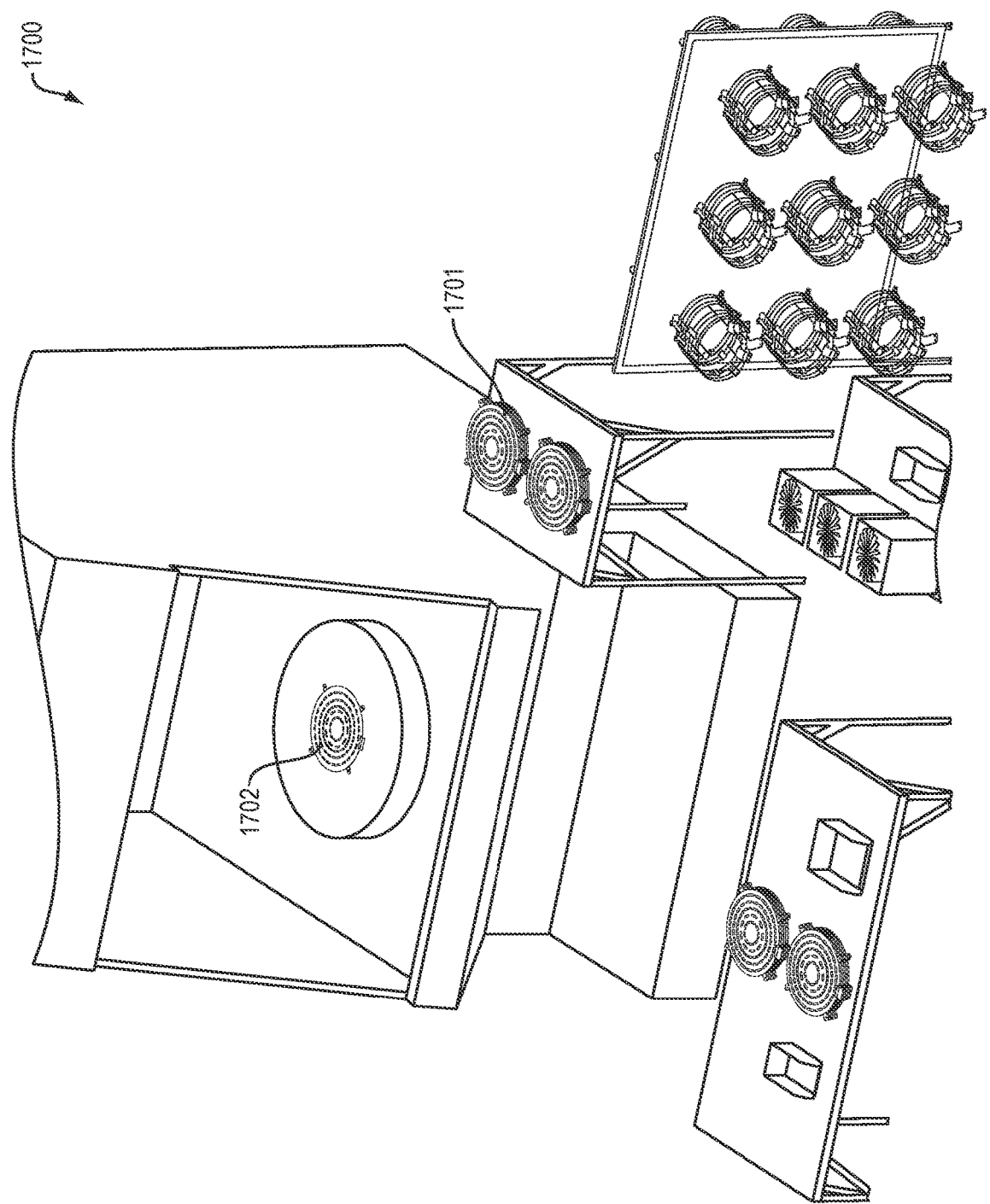

FIG. 9 is a close-up view of the environment 990 where task 1 (high accessibility), taking the convection element 991 from the rack 992, occurs. FIG. 10 is a close up view of the environment 1000 where task 2 (taking a virtual screw from the bin 1001 with the left hand) and task 4 (low accessibility—taking a convection blade 1002 from the box 1003 with the right hand) occur. FIG. 11 is a close up view of the environment 1100 in which task 3 (inserting the element 1101 at the back of the oven 1102 with the right hand) and task 5 (inserting the fan blade 1103 at the back of the oven 1102 with the right hand). FIG. 12 is a close up view of the environment 1200 in which task 6 (taking a virtual bolt from the bin 1201 with the right hand) and task 8 (taking the fan cover 1202 from the stack with both hands) occur. FIG. 13 is a close-up view of the environment 1300 where task 7, positioning a screw 1302 with the right hand at the bottom of the tilted oven 1301, occurs. FIG. 14 is a close-up view of the environment 1400 where task 9, positioning the fan cover 1401 at the bottom of the oven 1402 with both hands, occurs. FIG. 15 illustrates the environment 1500 in which task 10 (medium accessibility), taking the cooktop 1501 from the rack 1502 with both hands occurs. FIG. 16 illustrates the environment 1600 where task 11, installing the cook top 1601 on top of the oven 1602 occurs. FIG. 17 illustrates the environment 1700 in which task 12 (taking the fan cover 1701 from the stack) and task 13 (positioning the fan cover 1701 on the milling machine 1702) occurs.

Figure 18:
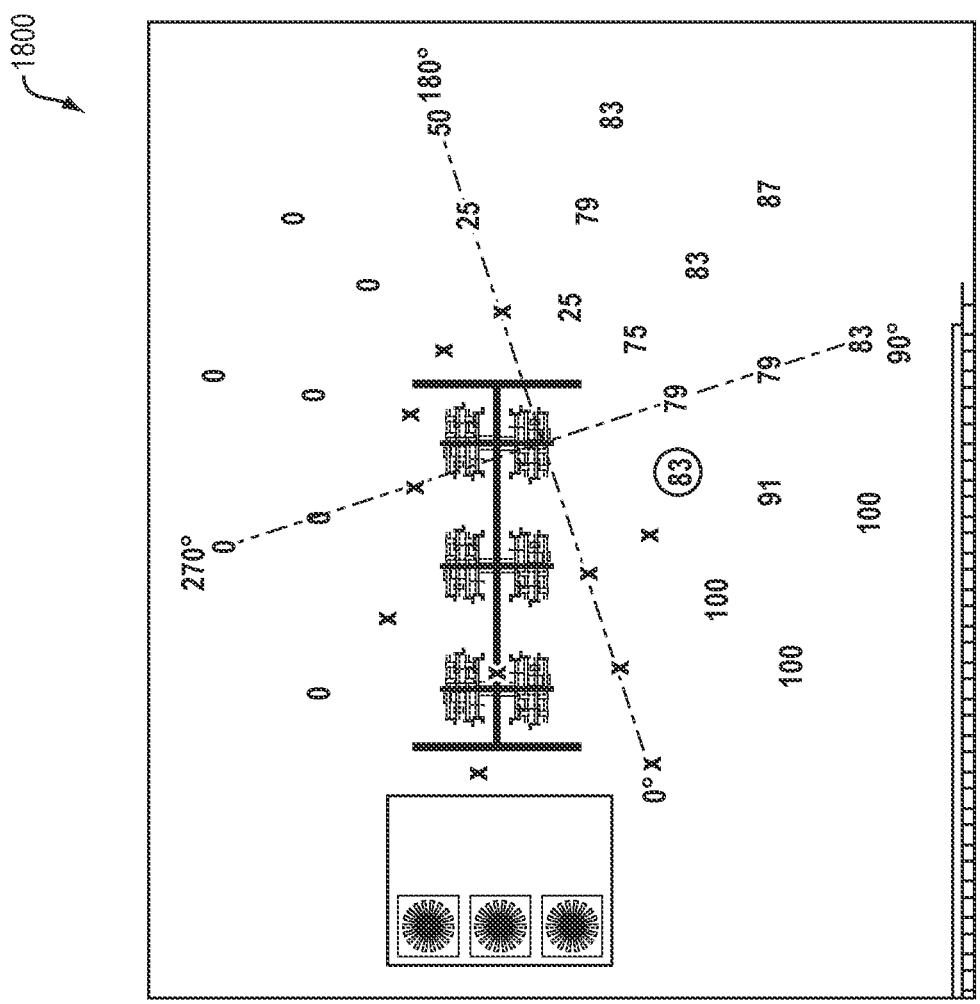
FIGS. 18-30 show are plots illustrating accessibility scores, candidate pre-positions, and pre-positions determined in the environments (tasks 1-13) of FIGS. 9-17 using embodiments.
Figure 19:
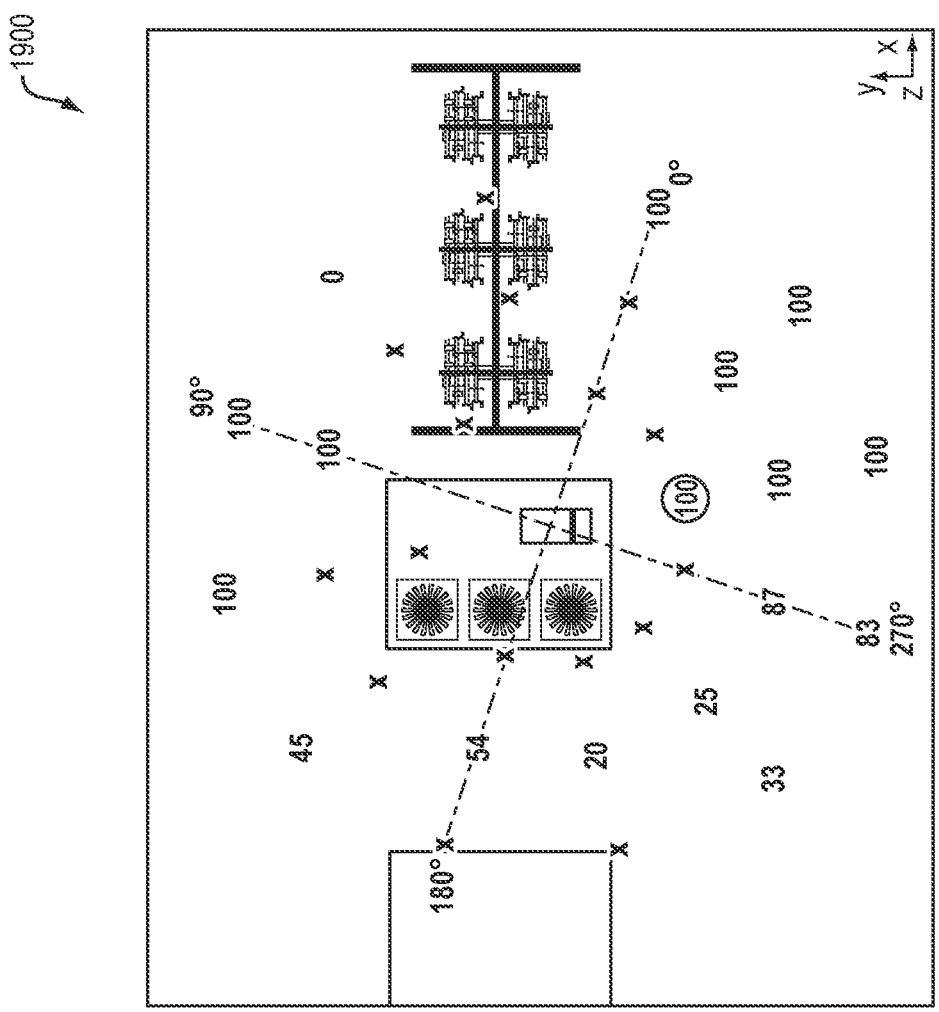
Figure 20:
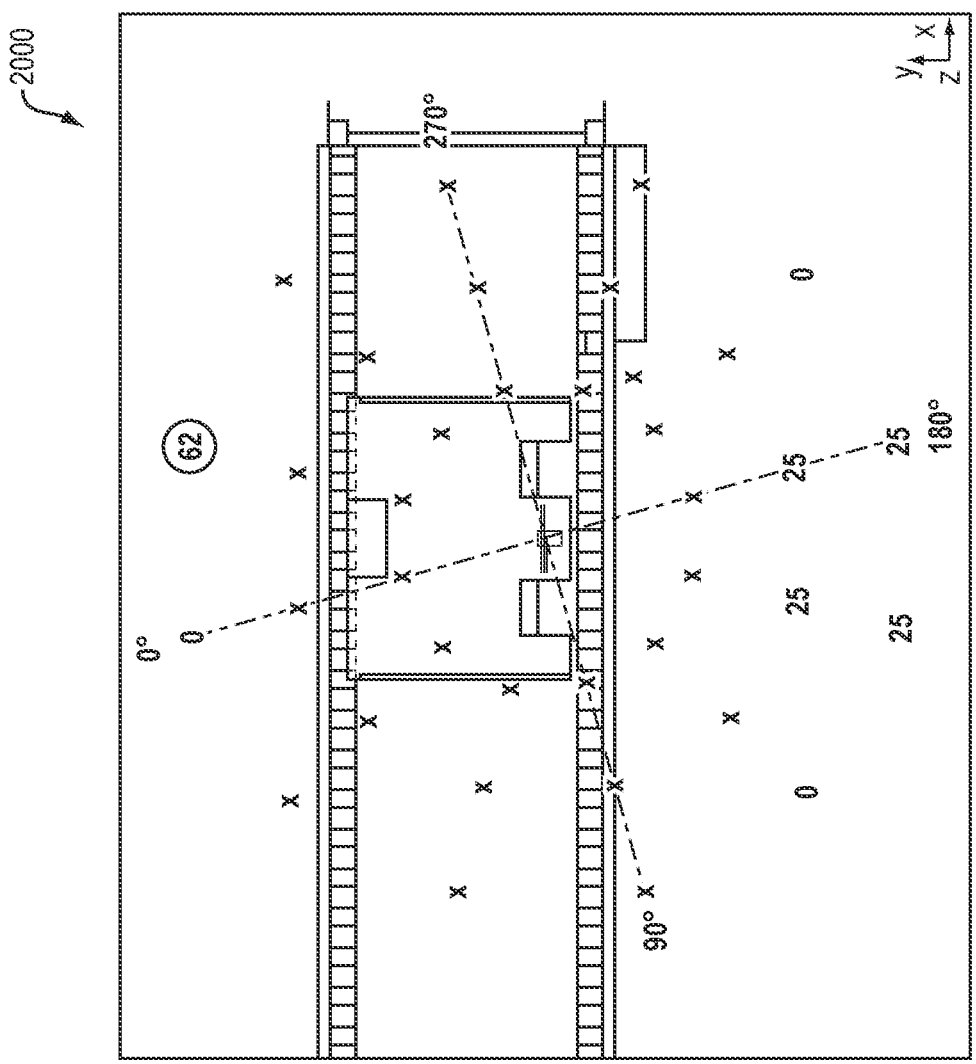
Figure 21:
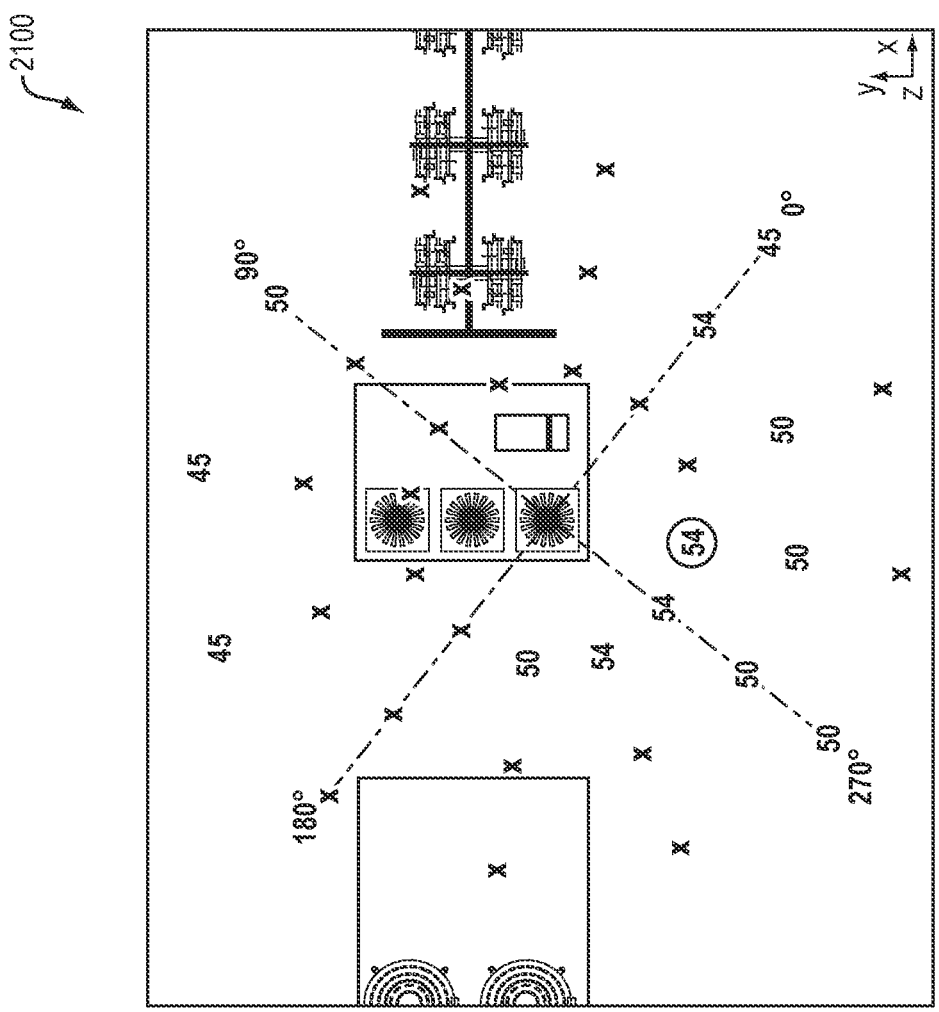
Figure 22:
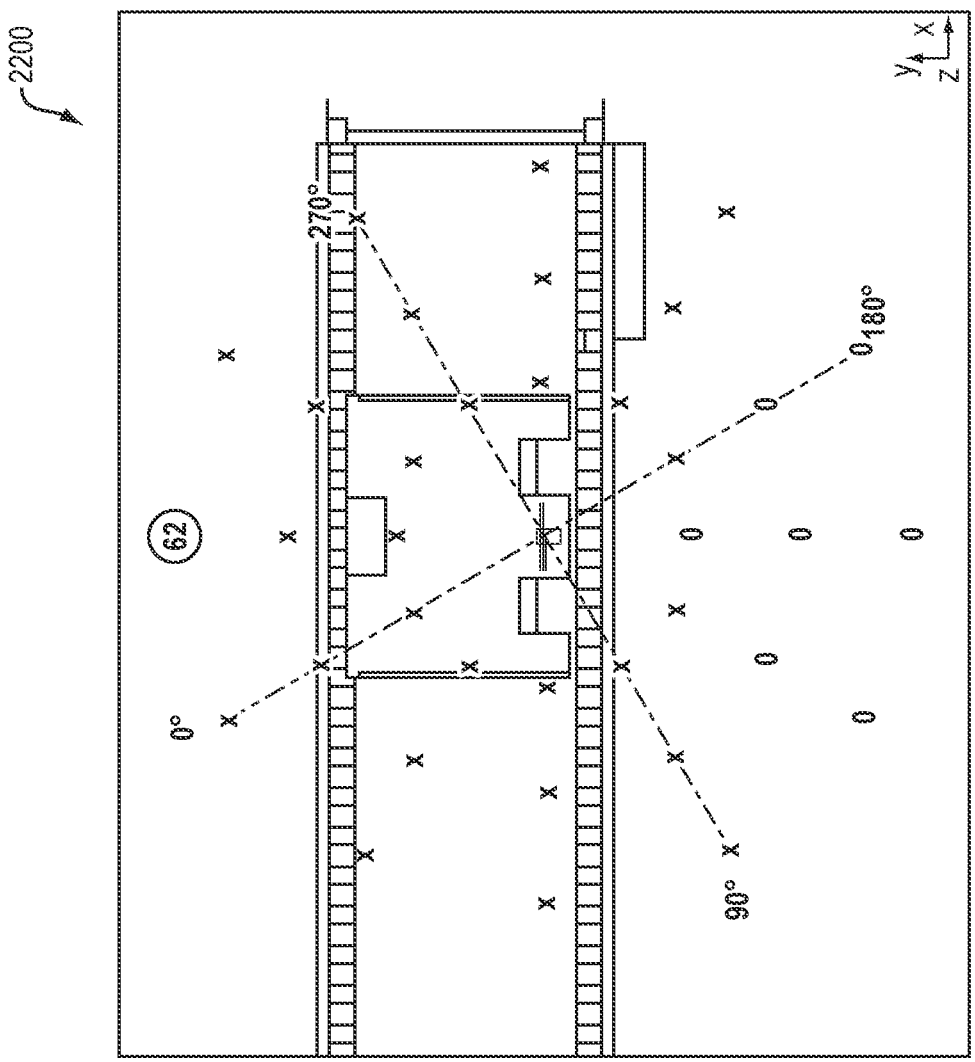
Figure 23:
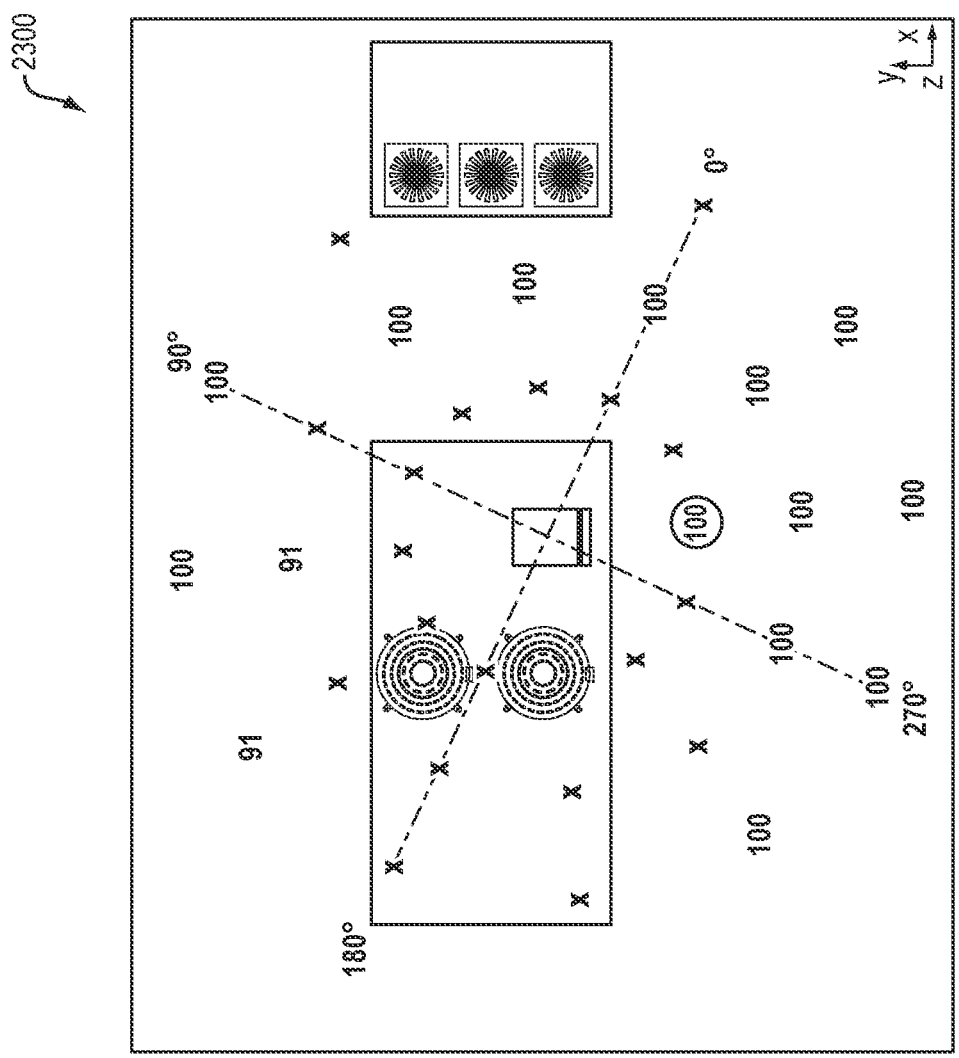
Figure 24:
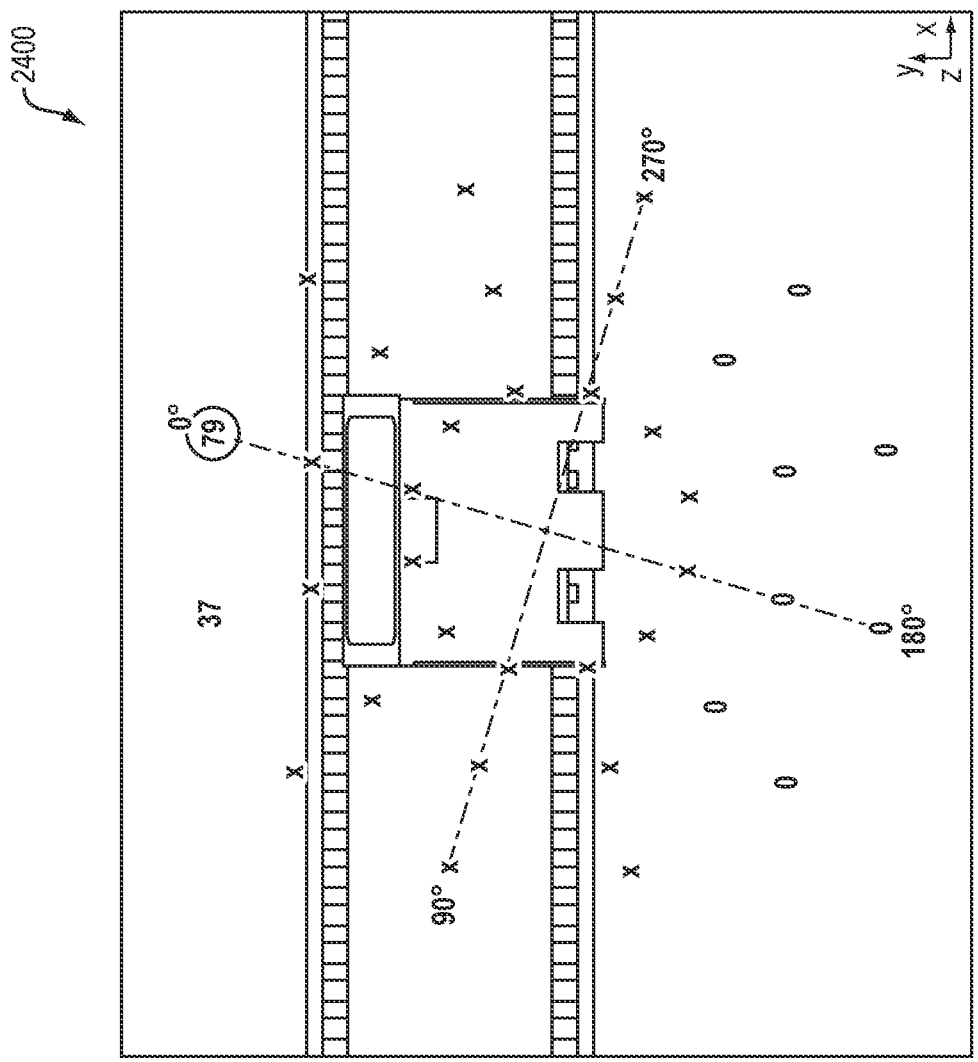
Figure 25:
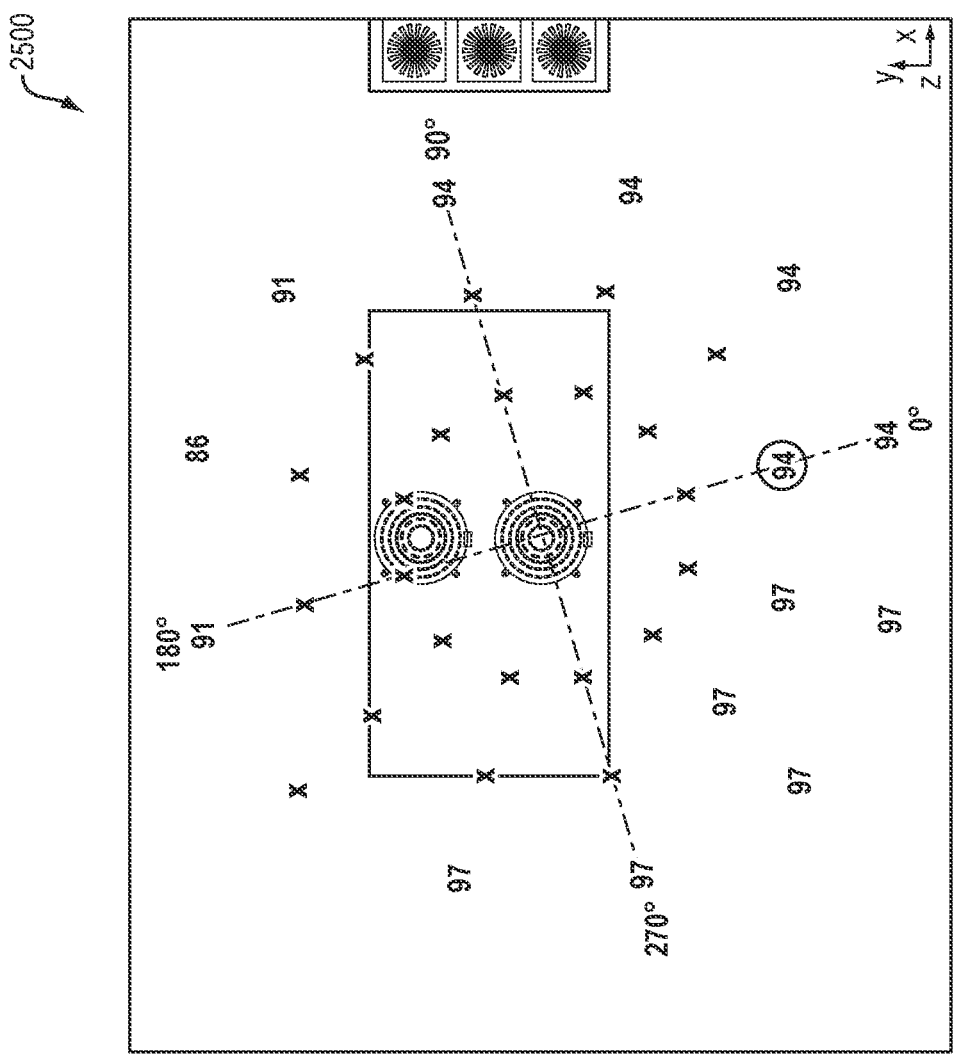
Figure 26:
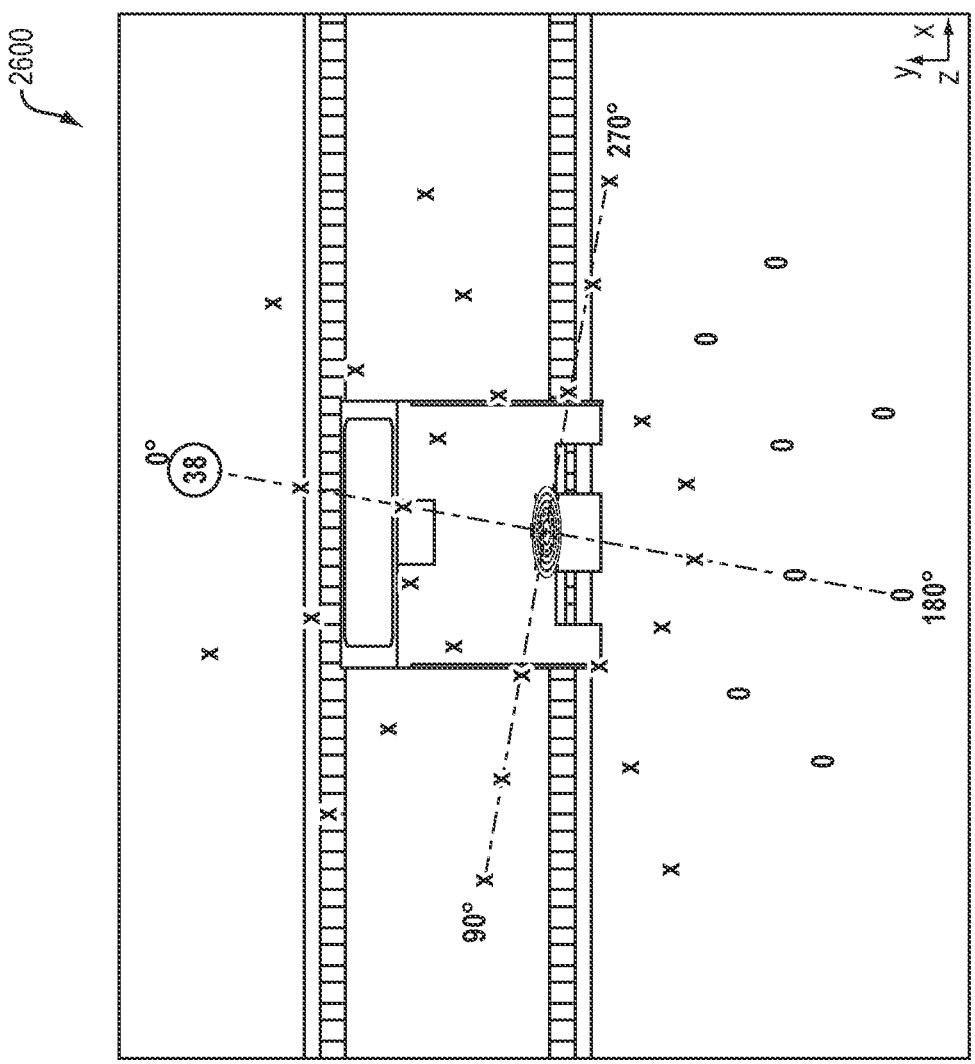

FIGS. 18-30 show the accessibility scores (referenced using the numerals 1800, 1900, 2000, 2100, 2200, 2300, 2400, 2500, 2600, 2700, 2800, 2900, and 3000, respectively), determined for tasks 1-13, respectively. In FIGS. 18-30, the candidate/trial positions with an "x" label are positions where there was a collision between the manikin and an object in the environment, and the chosen candidate positions in FIGS. 18-30 are indicated with a circle. In each of FIGS. 18-30, the 0° cardinal point indicates the reference line along the guiding vector. In FIG. 18 (task 1), the guiding vector is calculated from the workplace center to the object center of gravity. In each of FIGS. 19-30 (tasks 2-13) the guiding vector is calculated from the previous manikin position.

Returning to FIG. 8B, the initial positions 881a-m were determined in different proximity zones. The initial positions 881a, 881b, 881d, 881f, 881l, for tasks 1, 2, 4, 6, and 12, respectively, were found in the first proximity zone. The position 881h for task 8 was found in the second proximity zone. The positions 881c, 881e, 881g, 881i, 881j, 881k, 881m, for tasks 3, 5, 7, 9, 10, 11, and 13, respectively, were found in a third proximity zone. FIG. 8B also shows the manikin bounding volume as a dotted line rectangle about each task 1-13. The orientation of each bounding volume shows the manikin pelvis anterior (X) axis pointing towards the target object centers of geometry 882a-k. There are some discrepancies with the pre-positions (initial positions) 881a-m compared to expected results 891a-m shown in FIG. 8A. For example, the pre-position 881h of task 8 is chosen in the second proximity zone (e.g., 333b) although it is expected to be found in zone number first proximity zone (e.g., 333a). Also, the chosen pre-positions 881j and 881k for tasks 10 and 11, respectively are found at 30° from the expected pre-positions 891j and 891k.

Example Results—Tool Grasp

Figure 31B:
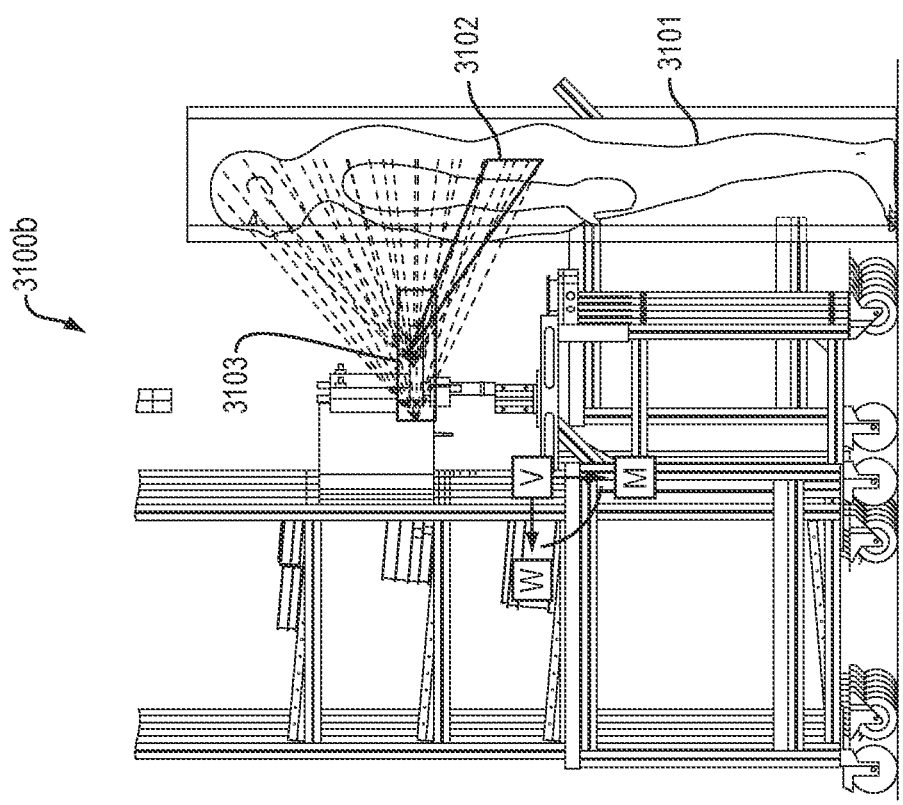
FIGS. 31A and 31B are a top view and side view, respectively, of a manikin using a tool at a pre-position (initial or starting position for simulation purposes) determined using an embodiment.
Figure 31A:
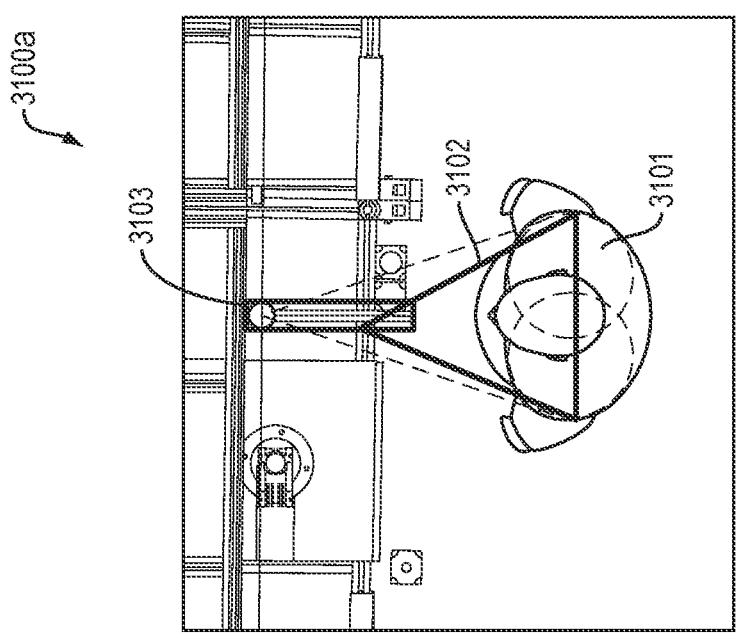

FIGS. 31A and 31B are a top view 3100a and side view 3100b showing a manikin 3101 in a pre-position (for a subject simulation) determined using an embodiment. In the example of FIGS. 31A-B, the manikin 3101 uses a mallet in the subject simulation. A guiding vector for the simple uni-directional tool (mallet) which is along the projection of the handle axis of the mallet on the horizontal plane was used to determine the pre-position of the manikin 3101. The zigzagging technique/method (searching for a suitable pre-position detailed in FIG. 3 above) started along the guiding vector which is the horizontal projection of the tool handle vector. In the example of FIGS. 31A and 31B, thirty-six pyramids from the tool to the manikin 3101 oriented bounding volume were created to check the level of obstruction to reach the target object (mallet). The outline of one sample pyramid 3102 from the left side of the tool bounding box 3103 to the manikin 3101 is shown in FIGS. 31A-B. For the position of the manikin 3101, the accessibility of the tool calculated from the free space analysis is 1.0, meaning that there is no obstruction in the given task as none of the pyramids are in collision with the environment objects.

Discussion

The initial/simulation starting positions (or pre-positions) determined by embodiments through sampling the environment around the target object are an initial guess for manikin root position before a whole body posture prediction is done. Embodiments determine a position for the manikin that is collision-free and in proximity to one or more target objects while ensuring adequate accessibility. Embodiments are suitable for automatic static posture prediction tools which otherwise depend on user inputs to place the manikin root segment before starting the whole-body posture prediction.

Embodiments systematically scan the environment to find free spaces at a reachable distance from the target object starting from the closest zones. Embodiments then discretize the space between the manikin and the target object to check for possible obstructions. In an embodiment, the start point of the spatial sampling is along a reference line to prioritize the positions along orientations required to accomplish specific tasks (tool grasps and two-handed tasks) or to minimize the manikin displacement from the previous task. An accessibility threshold is set to improve the performance of embodiments while avoiding the fully obstructed positions at the closest acceptable position to the reference line.

The example discussed in relation to FIGS. 31A-B represented a situation where the manikin pre-positioning calculates a position using the inherent tool grasping cues. A typical grasp on a simple uni-directional tool involves the right or left hand wrapping around the tool handle with the thumb pointing towards the tool head. The calculated pre-position provides equally plausible grasps for the right and left hands while the wrist and elbow joints can maintain a near neutral posture.

The assembly line examples discussed in relation to FIGS. 8-30 focus on the application of the accessibility threshold. For task 1, many of the pre-positions between 30° and 150° had an accessibility score higher than the threshold. Thus, any of these pre-positions would be adequate as an initial DHM position, but the method 100 selected the first pre-position that was (1) closest to the reference line and (2) higher than the threshold of 70% (83% in zone 1). These results are shown in FIG. 18. In contrast, the pre-positions between 180° and 360° were associated with very low or null accessibility. This is because the method 100 could not find enough collision-free pyramids from these pre-positions to the target object, due to the presence of other elements in the rack 992 of FIG. 9 or by the rack 992 itself.

Figure 27:
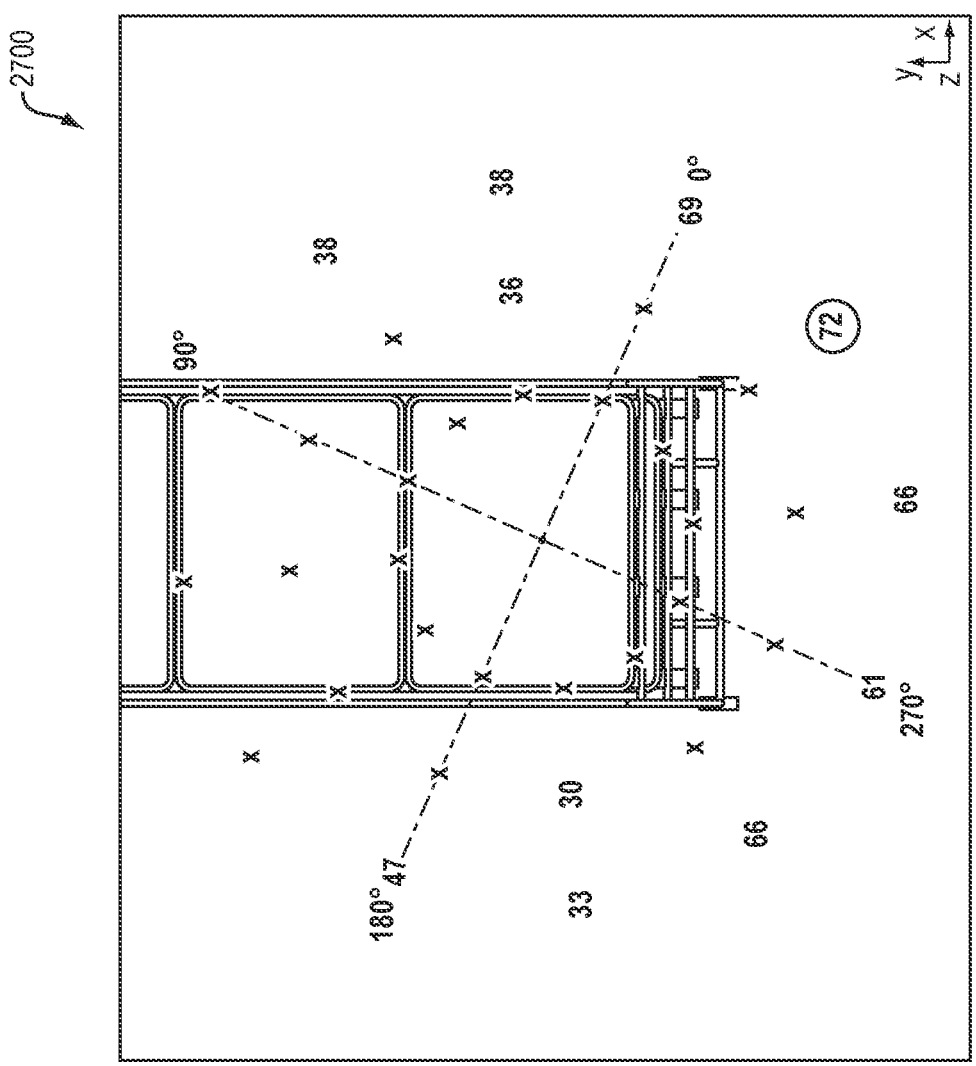
Figure 28:
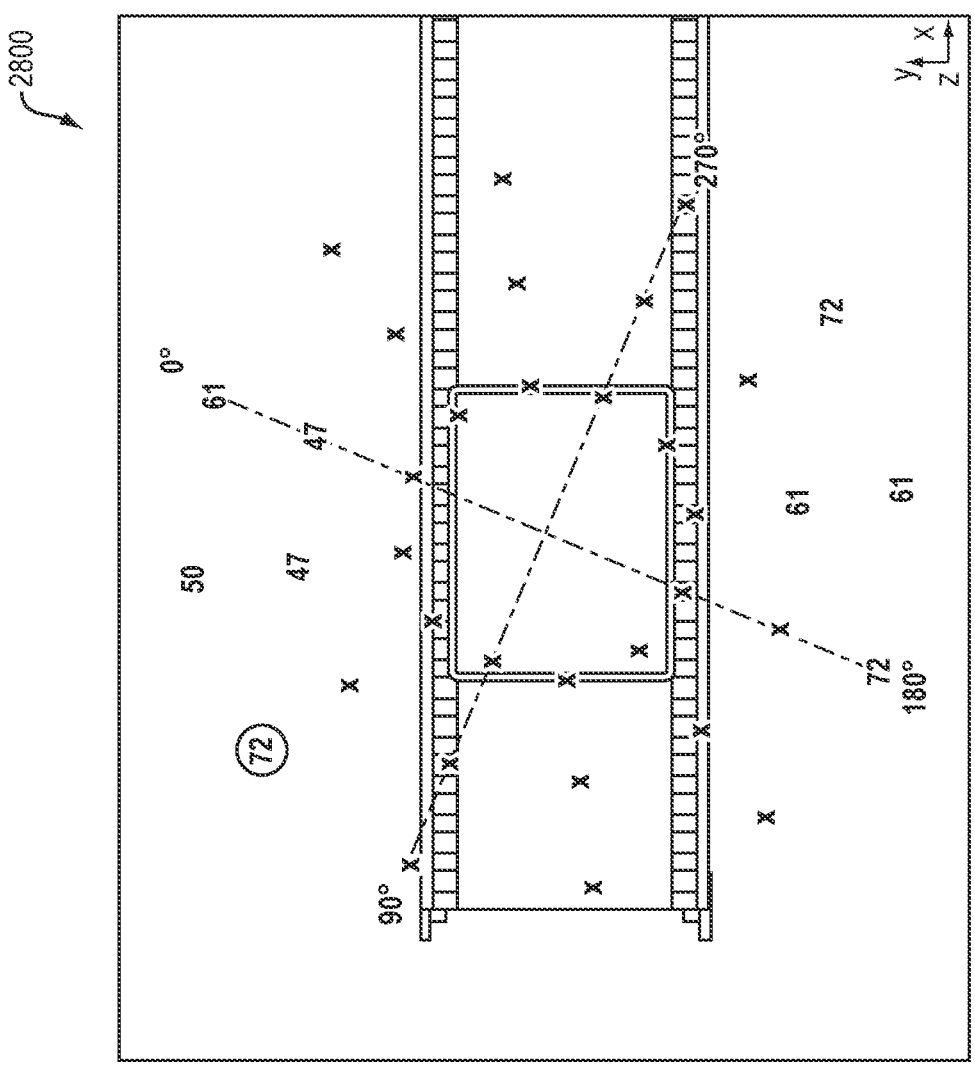
Figure 29:
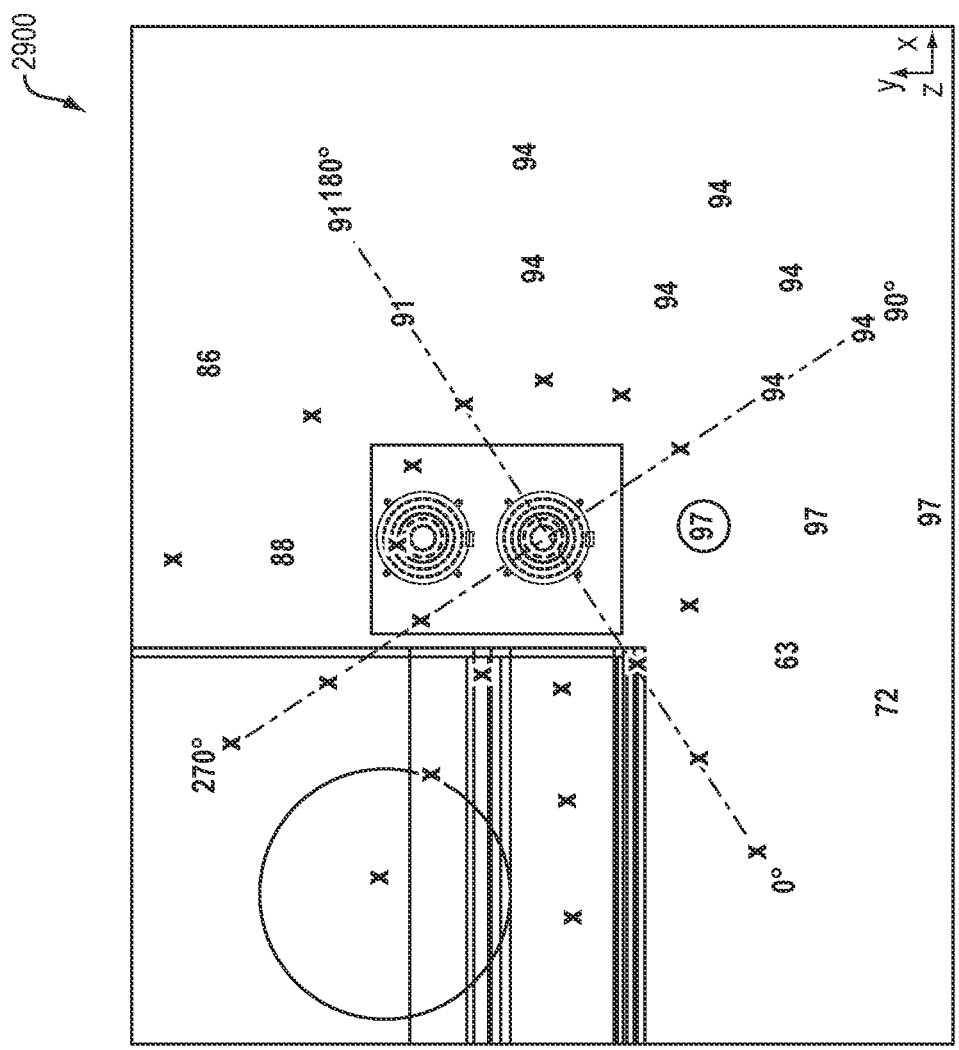
Figure 30:
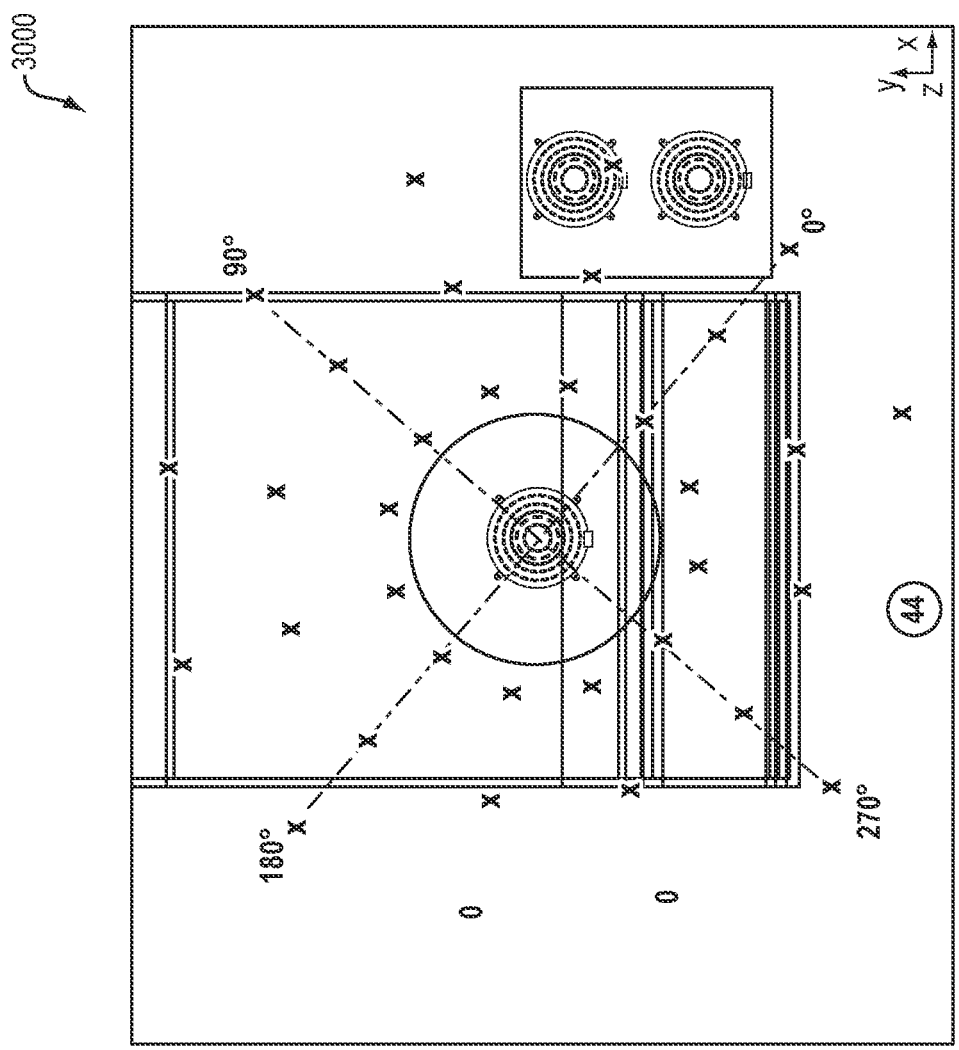

For task 10, none of the pre-positions in zone 1 and only a few pre-positions in zone 2 were collision-free. This can be explained by the fact that the grasped object (i.e., cooktop 1501 shown in FIG. 15) was located at shoulder height, which created many collisions between the lower pyramids (i.e., P1 to P3) and the rack 1502. The scores for task 10 are shown in FIG. 27. Higher scores were found in zone 3 for pre-positions that are close to the expected one (i.e., preposition at 300° from reference line in zone 3). This is due to the special geometry of the rack 1502, which had sidebars to secure the cooktop 1501 from falling on the side. The method 100 was able to detect that these bars were in the way to reach the cooktop 1501 by the sides. The overall accessibility of task 3 was low. The presence of a conveyor 1104 shown in the FIG. 11, limited the access to the object 1101 from the front and back of that conveyor 1104. Moreover, the object (element 1101) was located at the very back of the oven 1102, with limited access from the oven opening, where the highest accessibility (i.e. 62%) was found. It is worth mentioning that an accessibility of 25% was found from the rear of the oven 1102. This is because the grasped object 1101 had connecting rods that passed through small holes in the oven 1102 backing. Thus, the element rods could be accessed by the pyramid without any collision from these prepositions behind the oven opening. However, when standing from these prepositions, all the other sides of the grasped object 1101 (i.e., top, bottom, right and left) were not accessible, which reduced the accessibility score to 25%. This highlights the importance of testing different locations on the object to obtain a score of "overall" accessibility, instead of only one specific locations, such as (e.g. the expected grasp location).

Using the accessibility threshold considerably improved the performance of the example applications of method 100 in FIGS. 8-30. The performance improvement was more profitable for tasks with many obstacles and/or geometries around the target object, such as in task 1, which involved 72 heating elements on the rack, including the grasped object. Each object represented an additional pair of collisions to check with the bounding box and with the reach pyramid.

The statistics related to the accessibility score of the 13 tasks is presented in Table 1 below:

TABLE 1

| Task #Dd | Accessibility score (%) | | | | | Computation time (min) | |
|---|---|---|---|---|---|---|---|
| | n | Mean | Std | Min | Max | No threshold | With threshold |
| 1 | 16 | 77 | 23 | 25 | 100 | 2.6 | 0.1 |
| 2 | 16 | 78 | 31 | 21 | 100 | 1.5 | 0.1 |
| 3 | 5 | 33 | 17 | 25 | 63 | 0.6 | 0.6 |
| 4 | 13 | 50 | 3 | 46 | 54 | 0.9 | 0.9 |
| 5 | 1 | 63 | | | | 0.6 | 0.6 |
| 6 | 15 | 99 | 3 | 92 | 100 | 1.1 | 0.1 |
| 7 | 2 | 60 | 32 | 38 | 83 | 0.8 | 0.4 |
| 8 | 14 | 95 | 3 | 86 | 97 | 1.4 | 0.2 |
| 9 | 1 | 39 | | | | 1 | 1 |
| 10 | 11 | 52 | 16 | 31 | 72 | 0.9 | 0.4 |
| 11 | 9 | 60 | 10 | 47 | 72 | 0.9 | 0.6 |
| 12 | 15 | 90 | 10 | 64 | 97 | 1.4 | 0.1 |
| 13 | 1 | 44 | | | | 0.3 | 0.3 |
| Mean | 9 | 65 | | | | 1.1 | 0.4 |
| Std | 6 | 21 | | | | 0.5 | 0.3 |
| TOTAL | | | | | | 14.1 | 5.6 |

In Table 1 the number of pre-positions (n) excludes those with a null accessibility score and the results are presented in the following format: mean±std [min-max].

Among all tested pre-positions, only 119 were not in collision with the environment. For a single task, the average number of collision-free pre-positions was 9 out of 36. The average accessibility score (%) was 65±21[21–100]. Computing the accessibility scores for the 13 tasks (468 pre-positions) took 14.1 min. The mean computation time was 1.1±0.5[0.4–2.6] min. The shortest task was #13 and the longest task was #1. Three tasks had only one collision-free pre-position (i.e. #5, 9, and 13), showing a limited space to pre-position the manikin, i.e., digital human model.

The results of Table 1 were generated using an accessibility threshold of 0.7 which provided a good compromise between the rate of success and the overall efficiency of the implementations. With that threshold, the total computation time was reduced by 60% (i.e. 5.6 min for the 13 tasks). The average computation time was 0.4±0.3[0.1–1.0] min. The shortest tasks were #1 and #6, while the longest task was #9.

When using the threshold, the longest computation time was for tasks 9 and 4, both of which provided low accessibility to the target object. Task 4 (FIG. 10) included taking a convection fan blade 1002 from a small box 1003 with the right hand, with only limited accessibility from the top. The accessibility was evaluated on many sides (e.g., bottom, right, back, etc.), which explains why the final score was below the threshold. This highlights the ability of embodiments to choose a pre-position based on the "overall" accessibility to the object. This also shows that the information obtained from the free space analysis and accessibility score can also be useful in determining where to grasp the object.

Meanwhile, task 9 involved positioning a fan cover 1401 in the bottom of the oven 1402 with both hands. The oven 1402 strongly limited access to the fan cover. All the tasks which involved interaction with an object inside the oven (tasks 3, 5, 7, and 9) required at least half a minute to find a good pre-position.

Moreover, about 75% of the tested pre-positions were in collision with the environment. This suggests that the level of obstruction around the objects was considerable for the tested virtual workplace. This level of obstruction is common in many industrial workplaces, like in the automotive and aerospace industries. For such an environment, it may thus be difficult to go directly from one task to another while avoiding all the obstacles in the way. Embodiments have the advantage of looking for a pre-position with sufficient accessibility while starting close to the target object and in line with the previous DHM position, instead of starting precisely from the previous position and colliding with the obstacles in the way. Thus, embodiments are less sensitive to the distance between the current and the previous posture.

In digital human model tools aimed at static posture prediction, the problem involves finding a collision-free path towards the target points. Some previous works do so by planning a collision-free reach for the whole posture or a part (e.g., arms) of the virtual manikin (Liu and Badler 2003). However, the root position is usually specified by the user or extracted from motion capture data. Real industrial environments (e.g., an assembly line) involve large and cluttered virtual workspaces with numerous tasks to analyze. A fully autonomous posture prediction method should deal with a manikin initially at a random point (e.g., the global reference point of the environment). The initial distance to the target object could be orders of magnitudes larger than the manikin reach zone. A warm start to the collision-free reach problem involves pre-positioning the manikin near the target by performing a spatial search at the proximity of the target object while taking into account some high-level checks to maximize the chances of collision avoidance methods of an inverse kinematics solver to find a collision-free reach. Pre-positioning is especially of high interest in collision avoidance methods which are based on monitoring a set of local collision observers attached to different parts of the manikin. An example of such methods is presented in (Peinado, Maupu et al. 2009). A preventive or corrective constraint is imposed on the inverse kinematic solver to damp the displacement towards the obstacle and avoid or remove the inter-penetrations (Peinado, Maupu et al. 2009). These methods referred to as the "rubber-band," are able to mimic human-like dodging maneuvers in simple interactions like reaching an accessible object. Nevertheless, they are not capable of handling more complex scenarios such as a concave obstacle or walking the manikin around the obstacles to reach the target proximity (Burns, Razzaque et al. 2006, Peinado, Maupu et al. 2009). Therefore, these methods require a high-level controller to put the manikin in an initial collision-free posture with general accessibility to the target for best performance and to maximize the chances to solve the posture. Embodiments can be used to help determine an initial position of the manikin for such applications.

It should be noted that the pre-position, i.e., the position determined using embodiments, is a first approximation of the position of the manikin, i.e., digital human model (DHM), that helps an inverse kinematic solver to find a better DHM posture. The final position of the DHM can be decided through use of a whole body posture prediction algorithm that accounts for posture comfort objective functions, grasp and vision targets, collision avoidance, and external forces.

In addition, in embodiments, the resolution of the accessibility analysis is directly related to the accessibility threshold and the number and size of the pyramids used to discretize the space between the manikin and the object and detect collisions. Using more and smaller pyramids provides a finer discretization of the space, but increases computation time. The proposed number of pyramids, e.g., 36, was found from trial and error within the tested virtual workplace. These values may be increased to deal with more cluttered environments.

Computer Support

Figure 32:
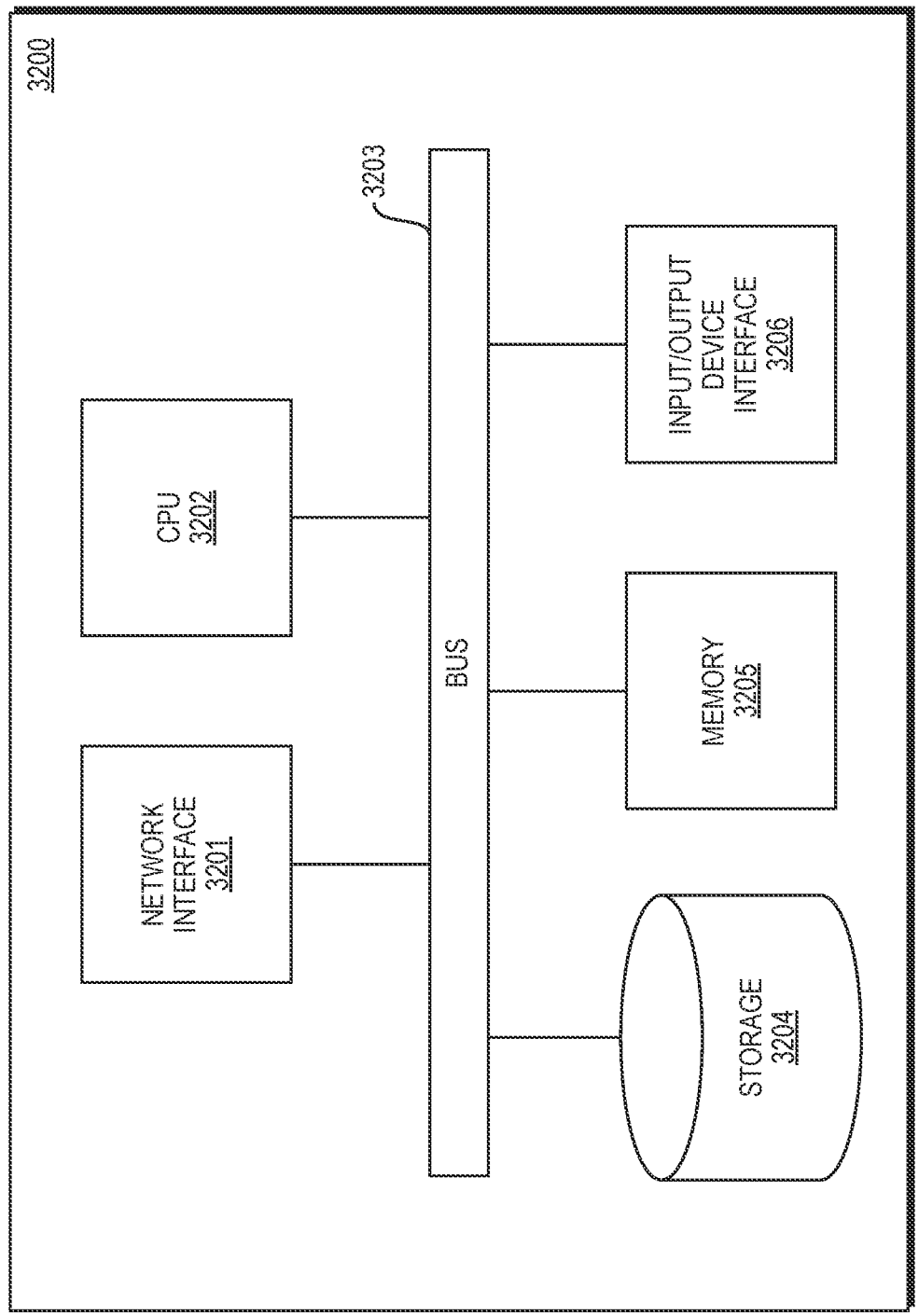
FIG. 32 is a simplified diagram of a computer system for determining manikin positioning according to an embodiment.

FIG. 32 is a simplified block diagram of a computer-based system 3200 that may be used to determine position of a manikin according to any variety of the embodiments of the present invention described herein. The system 3200 comprises a bus 3203. The bus 3203 serves as an interconnect between the various components of the system 3200. Connected to the bus 3203 is an input/output device interface 3206 for connecting various input and output devices such as a keyboard, mouse, display, speakers, etc. to the system 3200. A central processing unit (CPU) 3202 is connected to the bus 3203 and provides for the execution of computer instructions. Memory 3205 provides volatile storage for data used for carrying out computer instructions. Storage 3204 provides non-volatile storage for software instructions, such as an operating system (not shown). The system 3200 also comprises a network interface 3201 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 3200, or a computer network environment such as the computer environment 3300, described herein below in relation to FIG. 33. The computer system 3200 may be transformed into the machines that execute the methods 100, 440, 550 and techniques described herein, for example, by loading software instructions into either memory 3205 or non-volatile storage 3204 for execution by the CPU 3202. One of ordinary skill in the art should further understand that the system 3200 and its various components may be configured to carry out any embodiments or combination of embodiments of the present invention described herein. Further, the system 3200 may implement the various embodiments described herein utilizing any combination of hardware, software, and firmware modules operatively coupled, internally, or externally, to the system 3200.

Figure 33:
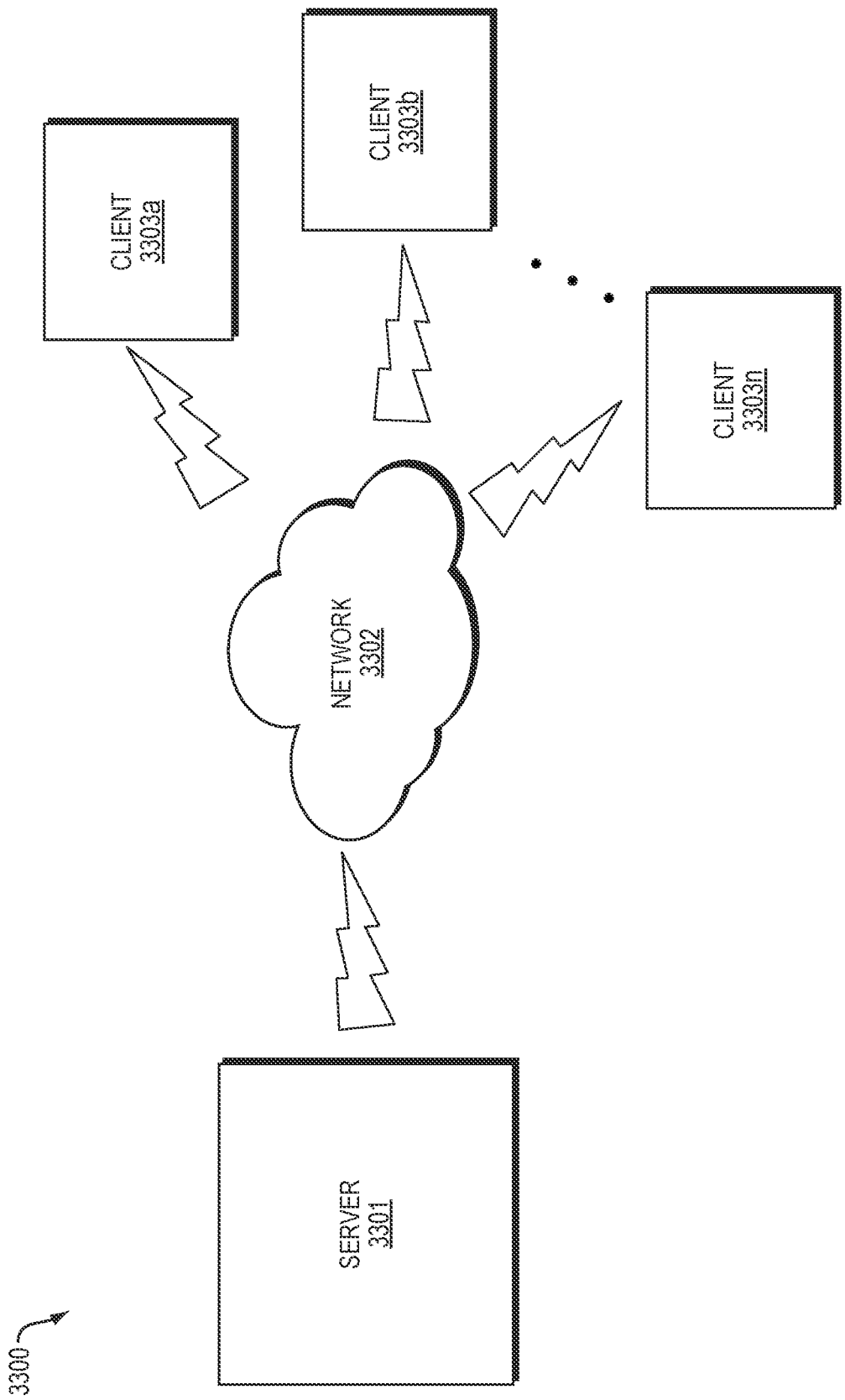
FIG. 33 is a simplified diagram of a computer network environment in which an embodiment of the present invention may be implemented.

FIG. 33 illustrates a computer network environment 3300 in which an embodiment of the present invention may be implemented. In the computer network environment 3300, the server 3301 is linked through the communications network 3302 to the clients 3303a-n. The environment 3300 may be used to allow the clients 3303a-n, alone or in combination with the server 3301, to execute any of the embodiments described herein. For non-limiting example, computer network environment 3300 provides cloud computing embodiments, software as a service (SAAS) embodiments, and the like.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

REFERENCES

Abdel-Malek, K., J. Arora, R. Bhatt, K. Farrell, C. Murphy and K. Kregel (2019). Santos: An integrated human modeling and simulation platform. *DHM and Posturography*, Elsevier: 63-77.

Abdel-Malek, K., J. Yang, T. Marler, S. Beck, A. Mathai, X. Zhou, A. Patrick and J. Arora (2006). "Towards a new generation of virtual humans." *International Journal of Human Factors Modelling and Simulation* 1(1): 2-39.

Baerlocher, P. (2001). Inverse kinematics techniques of the interactive posture control of articulated figures, EPFL.

Baerlocher, P. and R. Boulic (2004). "An inverse kinematics architecture enforcing an arbitrary number of strict priority levels." *The visual computer* 20(6): 402-417.

Björkenstam, S., N. Delfs, J. S. Carlson, R. Bohlin and B. Lennartson (2016). "Enhancing digital human motion planning of assembly tasks through dynamics and optimal control." *Procedia CIRP* 44: 20-25.

Burns, E., S. Razzaque, A. T. Panter, M. C. Whitton, M. R. McCallus and F. P. Brooks Jr (2006). "The hand is more easily fooled than the eye: Users are more sensitive to visual interpenetration than to visual-proprioceptive discrepancy." *Presence: teleoperators & virtual environments* 15(1): 1-15.

Chaffin, D. B. (2007). "Human motion simulation for vehicle and workplace design." *Human Factors and Ergonomics in Manufacturing & Service Industries* 17(5): 475-484.

Diffrient N. Tilley A. R., B. J. (1982). Humanscale 7/8/9, The MIT Press. 7/8/9.

Faraway, J. J. (1997). "Regression analysis for a functional response." *Technometrics* 39(3): 254-261.

Feyen, R., Y. Liu, D. Chaffin, G. Jimmerson and B. Joseph (2000). "Computer-aided ergonomics: a case study of incorporating ergonomics analyses into workplace design." *Applied ergonomics* 31(3): 291-300.

Jung, E. S. and J. Choe (1996). "Human reach posture prediction based on psychophysical discomfort." *International Journal of Industrial Ergonomics* 18(2-3): 173-179.

Jung, E. S., D. Kee and M. K. Chung (1995). "Upper body reach posture prediction for ergonomic evaluation models." *International Journal of Industrial Ergonomics* 16(2): 95-107.

Li, Y., N. Delfs, P. Mårdberg, R. Bohlin and J. S. Carlson (2018). "On motion planning for narrow-clearance assemblies using virtual manikins." *Procedia CIRP* 72: 790-795.

Liu, Y. and N. I. Badler (2003). *Real-time reach planning for animated characters using hardware acceleration*. Proceedings 11th IEEE international workshop on program comprehension, IEEE.

Macloud, A., L. Rivest, A. Zeighami, P.-O. Lemieux and R. Aissaoui (2019). "Extracting Grasping Cues From One-Handed Tools Geometry For Digital Human Models."

Namgung, I. (2004). "Path space approach for planning 2d shortest path based on elliptic workspace geometry mapping." *KSME international Journal* 18(1): 92-105.

Park, W., D. B. Chaffin and B. J. Martin (2004). "Toward memory-based human motion simulation: development and validation of a motion modification algorithm." *IEEE transactions on systems, man, and cybernetics-Part A: Systems and Humans* 34(3): 376-386.

Peinado, M., D. Maupu, D. Raunhardt, D. Meziat, D. Thalmann and R. Boulic (2009). "Full-body avatar control with environment awareness." *IEEE Computer Graphics and Applications* 29(3): 62-75.

Perez, M. A. (2005). *Prediction of whole-body lifting kinematics using artificial neural networks*, Virginia Tech.

Pettré, J., T. Simeon and J.-P. Laumond (2002). *Planning human walk in virtual environments*. IEEE/RSJ International Conference on Intelligent Robots and Systems, IEEE.

Reed, M. P. and D. W. Wagner (2007). "An integrated model of gait and transition stepping for simulation of industrial workcell tasks." *SAE Transactions*: 2062-2072.

Ryan, P. W. (1969). COCKPIT GEOMETRY EVALUATION. VOLUME V. VALIDATION, BOEING CO SEATTLE WA MILITARY AIRCRAFT SYSTEMS DIV.

Wagner, D. W., M. P. Reed and D. B. Chaffin (2005). "Predicting foot positions for manual materials handling tasks." *SAE transactions*: 2872-2876.

Zhou, W. and M. P. Reed (2009). Validation of the human motion simulation framework: posture prediction for standing object transfer tasks, SAE Technical Paper.

What is claimed is:

1. A computer implemented method of determining a position for a manikin in a simulation of a real-world environment, the method comprising:
   automatically analyzing environment data to determine, based on a data hierarchy, a highest ranking type of data from among one or more types of data in the environment data;
   responsively determining (i) a guiding vector with an orientation and (ii) a sweep mode, wherein the guiding vector with the orientation and the sweep mode are determined based upon the determined highest ranking type of data and the sweep mode indicates a range of position sampling around a target object; and
   using the determined guiding vector and sweep mode, automatically analyzing free space between a manikin and the target object in a simulated real-world environment to determine a position for the manikin in a simulation of the real-world environment, wherein the simulated real-world environment includes the manikin and the target object, and is represented by a computer-aided design (CAD) model.

2. The method of claim 1 further comprising:
   determining orientation of the manikin in the simulation of the real-world environment based upon the determined position for the manikin, wherein the determined position is a starting position for the manikin in the simulation.

3. The method of claim 1 wherein analyzing the free space between the manikin and the target object comprises:
   determining a first position for the manikin using the determined guiding vector and sweep mode;
   analyzing free space in the simulated real-world environment between (i) the manikin at the determined first position and (ii) the target object, wherein analyzing the free space in the simulated real-world environment comprises:
      checking for collisions between the manikin at the first position and one or more objects in the simulated real-world environment; and
      calculating an accessibility score indicating ease of access for the manikin at the first position to the target object; and
   if the checking identifies no collisions between the manikin at the first position and the one or more objects in the simulated real-world environment, and the calculated accessibility score is above an accessibility threshold, setting the first position as the position for the manikin in the simulation of the real-world environment.

4. The method of claim 3 wherein the analyzing of the free space in the simulated real-world environment identifies a collision between the manikin at the first position and the one or more objects in the simulated real-world environment or the calculated accessibility score is below the accessibility threshold, the method further comprises:
   iteratively: (i) determining a next position for the manikin using the determined guiding vector and sweep mode and (ii) analyzing free space in the simulated real-world environment between the manikin at the determined next position and the target object until:
      (a) the iteratively analyzing identifies a next position with no collisions between the manikin at the next position and the one or more objects in the simulated real-world environment and a calculated accessibility score indicating ease of access for the manikin at the next position to the target object is above the accessibility threshold; or
      (b) based on the determined guiding vector and sweep mode, a next position does not exist; and
   if the iteratively analyzing identifies a next position with no collisions between the manikin at the next position and the one or more objects in the simulated real-world environment and a calculated accessibility score indicating ease of access for the manikin at the next position to the target object is above the accessibility threshold, setting the identified next position as the position for the manikin in the simulation of the real-world environment; and
   if based on the determined guiding vector and sweep mode a next position does not exist, setting a given next position as the position for the manikin in the simulation of the real-world environment based on results of analyzing the free space in the simulated real-world environment between the manikin at the given next position and the target object.

5. The method of claim 4 wherein the next position is further determined based upon ranked proximity zones proximal to the target object.

6. The method of claim 5 further comprising:
   determining the ranked proximity zones based upon dimensions of the manikin.

7. The method of claim 1 wherein the environment data comprises at least one of:
   a number of hands involved;
   an indication of tool use; and
   a manikin position from a previous task.

8. The method of claim 7 wherein:
   the indication of tool use indicates a tool family and a tool orientation; and
   the guiding vector is determined as a function of the indicated tool family and the tool orientation.

9. The method of claim 1 wherein analyzing the free space comprises:
   identifying any collision between a bounding volume of the manikin at a given position and one or more objects in the simulated real-world environment.

10. The method of claim 9 wherein there are no identified collisions between the bounding volume of the manikin at the given position and the one or more objects and the method further comprises:
    discretizing the free space between the manikin at the given position and the target object;
    for each discretization of the free space, determining an individual accessibility score, wherein each individual accessibility score indicates ease of access for the manikin to the target object within each discretization of the free space;
    determining an overall accessibility score for the manikin at the given position based upon each individual accessibility score; and
    if the overall accessibility score is above an accessibility threshold, setting the given position as the position for the manikin in the simulation of the real-world environment.

11. The method of claim 10 wherein each discretization is a three-dimensional polygon.

12. The method of claim 1 wherein the manikin represents at least one of: a human, an animal, and a robot.

13. The method of claim 1 further comprising:
simulating interaction between the manikin at the position and the target object in the simulated real-world environment.

14. A system for determining a position for a manikin in a simulation of a real-world environment, the system comprising:
a processor; and
a memory with computer code instructions stored thereon, the processor and the memory, with the computer code instructions being configured to cause the system to:
automatically analyze environment data to determine, based on a data hierarchy, a highest ranking type of data from among one or more types of data in the environment data;
responsively determine (i) a guiding vector with an orientation and (ii) a sweep mode, wherein the guiding vector with the orientation and the sweep mode are determined based upon the determined highest ranking type of data and the sweep mode indicates a range of position sampling around a target object; and
using the determined guiding vector and sweep mode, automatically analyze free space between a manikin and the target object in a simulated real-world environment to determine a position for the manikin in a simulation of the real-world environment, wherein the simulated real-world environment includes the manikin and the target object, and is represented by a computer-aided design (CAD) model.

15. The system of claim 14 wherein the processor and the memory, with the computer code instructions, are further configured to cause the system to:
determine orientation of the manikin in the simulation of the real-world environment based upon the determined position for the manikin.

16. The system of claim 14 wherein, in analyzing the free space between the manikin and the target object, the processor and the memory, with the computer code instructions, are further configured to cause the system to:
determine a first position for the manikin using the determined guiding vector and sweep mode;
analyze free space in the simulated real-world environment between (i) the manikin at the determined first position and (ii) the target object, wherein analyzing the free space in the simulated real-world environment comprises:
checking for collisions between the manikin at the first position and one or more objects in the simulated real-world environment; and
calculating an accessibility score indicating ease of access for the manikin at the first position to the target object; and
if the checking identifies no collisions between the manikin at the first position and the one or more objects in the simulated real-world environment, and the calculated accessibility score is above an accessibility threshold, set the first position as the position for the manikin in the simulation of the real-world environment.

17. The system of claim 16 wherein the analyzing of the free space in the simulated real-world environment identifies a collision between the manikin at the first position and the one or more objects in the simulated real-world environment or the calculated accessibility score is below the accessibility threshold and the processor and the memory, with the computer code instructions, are further configured to cause the system to:
iteratively: (i) determine a next position for the manikin using the determined guiding vector and sweep mode and (ii) analyze free space in the simulated real-world environment between the manikin at the determined next position and the target object until:
(a) the iteratively analyzing identifies a next position with no collisions between the manikin at the next position and the one or more objects in the simulated real-world environment and a calculated accessibility score indicating ease of access for the manikin at the next position to the target object is above the accessibility threshold; or
(b) based on the determined guiding vector and sweep mode, a next position does not exist; and
if the iteratively analyzing identifies a next position with no collisions between the manikin at the next position and the one or more objects in the simulated real-world environment and a calculated accessibility score indicating ease of access for the manikin at the next position to the target object is above the accessibility threshold, set the identified next position as the position for the manikin in the simulation of the real-world environment; and
if based on the determined guiding vector and sweep mode a next position does not exist, set a given next position as the position for the manikin in the simulation of the real-world environment based on results of analyzing the free space in the simulated real-world environment between the manikin at the given next position and the target object.

18. The system of claim 17 wherein, in determining the next position, the processor and the memory, with the computer code instructions, are further configured to cause the system to:
determine the next position based upon ranked proximity zones proximal to the target object.

19. The system of claim 14 wherein, in analyzing the free space, the processor and the memory, with the computer code instructions, are further configured to cause the system to:
identify any collision between a bounding volume of the manikin at a given position and one or more objects in the simulated real-world environment; and
if there are no identified collisions between the bounding volume of the manikin at the given position and the one or more objects:
discretize the free space between the manikin at the given position and the target object;
for each discretization of the free space, determine an individual accessibility score, wherein each individual accessibility score indicates ease of access for the manikin to the target object within each discretization of the free space;
determine an overall accessibility score for the manikin at the given position based upon each individual accessibility score; and
if the overall accessibility score is above an accessibility threshold, set the given position as the position for the manikin in the simulation of the real-world environment.

20. A non-transitory computer program product for determining a position for a manikin in a simulation of a real-world environment, the computer program product executed by a server in communication across a network with one or more clients and comprising:
  a computer readable medium, the computer readable medium comprising program instructions which, when executed by a processor, causes the processor to:
    automatically analyze environment data to determine, based on a data hierarchy, a highest ranking type of data from among one or more types of data in the environment data;
    responsively determine (i) a guiding vector with an orientation and (ii) a sweep mode, wherein the guiding vector with the orientation and the sweep mode are determined based upon the determined highest ranking type of data and the sweep mode indicates a range of position sampling around a target object; and
    using the determined guiding vector and sweep mode, automatically analyze free space between a manikin and the target object in a simulated real-world environment to determine a position for the manikin in a simulation of the real-world environment, wherein the simulated real-world environment includes the manikin and the target object, and is represented by a computer-aided design (CAD) model.

* * * * *